(12) United States Patent
Jeon

(10) Patent No.: US 10,205,060 B2
(45) Date of Patent: Feb. 12, 2019

(54) SEMICONDUCTOR LIGHT EMITTING DEVICE

(71) Applicant: SEMICON LIGHT CO., LTD., Gyeonggi-do (KR)

(72) Inventor: Soo Kun Jeon, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 0 days.

(21) Appl. No.: 15/118,235

(22) PCT Filed: Feb. 11, 2015

(86) PCT No.: PCT/KR2015/001394
§ 371 (c)(1),
(2) Date: Aug. 11, 2016

(87) PCT Pub. No.: WO2015/122694
PCT Pub. Date: Aug. 20, 2015

(65) Prior Publication Data
US 2017/0170364 A1 Jun. 15, 2017

(30) Foreign Application Priority Data

Feb. 11, 2014 (KR) .................. 10-2014-0015456
Feb. 11, 2014 (KR) .................. 10-2014-0015459
Apr. 24, 2014 (KR) .................. 10-2014-0049304

(51) Int. Cl.
*H01L 33/40* (2010.01)
*H01L 33/38* (2010.01)
*H01L 33/46* (2010.01)
*H01L 33/14* (2010.01)
*H01L 33/32* (2010.01)

(52) U.S. Cl.
CPC ............ *H01L 33/405* (2013.01); *H01L 33/38* (2013.01); *H01L 33/46* (2013.01); *H01L 33/14* (2013.01);
(Continued)

(58) Field of Classification Search
CPC . H01L 33/38; H01L 33/0075; H01L 33/0062; H01L 33/0025; H01L 33/40;
(Continued)

(56) References Cited

U.S. PATENT DOCUMENTS

| 7,262,436 B2 | 8/2007 | Kondoh et al. ................. 257/94 |
| 2008/0164488 A1 | 7/2008 | Ikeda et al. ..................... 257/99 |
| 2013/0193464 A1* | 8/2013 | Bae ........................ H01L 33/405 257/94 |

(Continued)

FOREIGN PATENT DOCUMENTS

| JP | 2006-020913 | 1/2006 | ............ D06F 57/00 |
| JP | 2013-214426 | 10/2013 | ............... F21S 2/00 |

(Continued)

OTHER PUBLICATIONS

U.S. Appl. No. 15/036,134, filed May 12, 2016, Jeon et al.
(Continued)

*Primary Examiner* — Thanh T Nguyen
(74) *Attorney, Agent, or Firm* — Harness, Dickey & Pierce, P.L.C.

(57) ABSTRACT

Disclosed is a semiconductor light emitting device, including: a plurality of semiconductor layers; a non-conductive reflective film coupled to the plurality of the semiconductor layers; and one or more electrodes formed on the non-conductive reflective film and electrically connected to the plurality of semiconductor layers, in which the one or more electrodes respectively include a lower electrode layer for reflecting light generated in the active layer and then passed the non-conductive reflective film, and an upper electrode layer arranged on the lower electrode layer for preventing a foreign material from penetrating into the lower electrode layer.

15 Claims, 25 Drawing Sheets

(52) U.S. Cl.
CPC ...... *H01L 33/32* (2013.01); *H01L 2933/0016* (2013.01); *H01L 2933/0025* (2013.01)

(58) Field of Classification Search
CPC ....... H01L 33/145; H01L 33/46; H01L 33/42; H01L 33/06; H01L 33/30; H01L 33/62; H01L 33/387; H01L 33/32; H01L 33/382
See application file for complete search history.

(56) References Cited

U.S. PATENT DOCUMENTS

| | | | |
|---|---|---|---|
| 2014/0217439 A1* | 8/2014 | Jeon | H01L 33/46 257/98 |
| 2014/0231839 A1 | 8/2014 | Jeon et al. | 257/96 |
| 2014/0291714 A1 | 10/2014 | Jeon et al. | 257/98 |

FOREIGN PATENT DOCUMENTS

| | | | | |
|---|---|---|---|---|
| KR | 10-2000-0027505 | 5/2000 | ............ | H01L 23/48 |
| KR | 10-2007-0104402 | 10/2007 | ............ | H01L 33/40 |
| KR | 10-2013-00718354 | 7/2013 | ............ | H01L 33/36 |
| KR | 10-2014-0012002 | 1/2014 | ............ | H01L 33/36 |

OTHER PUBLICATIONS

ISR dated Apr. 29, 2015 in PCT/KR2015/001394 published as WO 2015/122694.
Chang, C.W. et al., (2006). "Kinetics of AuSn4 migration in lead-free solders". *Journal of Electronic Materials* 35(11) see introduction, figure 2.

\* cited by examiner

SEMICONDUCTOR LIGHT EMITTING DEVICE

CROSS-REFERENCE TO RELATED APPLICATIONS

This application is a national phase application of PCT Application No. PCT/KR2015/001394, filed on 11 Feb. 2015, which claims benefit of Korean Patent Application No. 10-2014-0049304, filed 24 Apr. 2014 and Korean Patent Nos. 10-2014-0015459 and 10-2014-0015456, filed on 11 Feb 2014 .The entire disclosure of the applications identified in this paragraph are incorporated herein by reference.

FIELD

The present disclosure relates generally to a semiconductor light emitting device, and more particularly to a semiconductor light emitting device having an electrode structure with an improved soldering strength towards an external electrode.

In the context herein, the term "semiconductor light emitting device" is intended to indicate a semiconductor optoelectronic device which generates light by electron-hole recombination. One example thereof is Group III-nitride semiconductor light emitting devices, in which the Group III-nitride semiconductor is made of a compound containing $Al(x)Ga(y)In(1-x-y)N$ ($0 \leq x \leq 1$, $0 \leq y \leq 1$, $0 \leq x+y \leq 1$). Another example thereof is GaAs-based semiconductor light emitting devices used for emitting red light.

BACKGROUND

This section provides background information related to the present disclosure which is not necessarily prior art.

FIG. 1 is a schematic view illustrating one exemplary embodiment of the semiconductor light emitting device disclosed in U.S. Pat. No. 7,262,436.

The semiconductor light emitting device includes a substrate 100, an n-type semiconductor layer 300 grown on the substrate 100, an active layer 400 grown on the n-type semiconductor layer 300, a p-type semiconductor layer 500 grown on the active layer 400, electrodes 901, 902 and 903 formed on the p-type semiconductor layer 500, with the electrodes serving as reflective films, and an n-side bonding pad 800 formed on the n-type semiconductor layer 300 which had been etched and exposed.

A chip having the above structure, i.e. a chip where all of the electrodes 901, 902 and 903, and the electrode 800 are formed on one side of the substrate 100, with the electrodes 901, 902 and 903 serving as reflective films, is called a flip chip. The electrodes 901, 902 and 903 are made up of an electrode 901 (e.g. Ag) having a high reflectance, an electrode 903 (e.g. Au) for bonding, and an electrode 902 (e.g. Ni) for preventing diffusion between materials of the electrode 901 and materials of the electrode 903. While this metal reflective film structure has a high reflectance and is advantageous for current spreading, it has the drawback that the metal absorbs light.

FIG. 2 is a schematic view illustrating an exemplary embodiment of the semiconductor light emitting device disclosed in JP Laid-Open Pub. No. 2006-20913.

The semiconductor light emitting device includes a substrate 100, a buffer layer grown on the substrate 100, an n-type semiconductor layer 300 grown on the buffer layer 200, an active layer 400 grown on the n-type semiconductor layer 300, a p-type semiconductor layer 500 grown on the active layer 400, a light transmitting conductive film 600 with a current spreading function, which is formed on the p-type semiconductor layer 500, a p-side bonding pad 700 formed on the light transmitting conductive film 600, and an n-side bonding pad 800 formed on the n-type semiconductor layer 300 which had been etched and exposed. Further, a DBR (Distributed Bragg Reflector) 900 and a metal reflective film 904 are provided on the light transmitting conductive film 600. While this structure shows reduced light absorption by the metal reflective film 904, it has the drawback that current spreading is not facilitated, as compared with the structure using the electrodes 901, 902 and 903.

DISCLOSURE

Technical Problem

The problems to be solved by the present disclosure will be described in the latter part of the best mode for carrying out the invention.

Technical Solution

This section provides a general summary of the present disclosure and is not a comprehensive disclosure of its full scope or all of its features.

A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a non-conductive reflective film arranged on the opposite side of the growth substrate and coupled to the plurality of the semiconductor layers; one or more electrodes formed on the non-conductive reflective film and electrically connected to the plurality of semiconductor layers, in which the one or more electrodes respectively include a lower electrode layer having a first thermal expansion coefficient for preventing cracks in the semiconductor light emitting device during bonding, and an upper electrode layer having a second thermal expansion coefficient larger than the first thermal expansion coefficient for preventing fracture of the lower electrode layer; and an electrical connecting part for electrically connecting the plurality of semiconductor layers to at least one electrode.

A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a non-conductive reflective film arranged on the opposite side of the growth substrate and coupled to the plurality of the semiconductor layers; one or more electrodes formed on the non-conductive reflective film and electrically connected to the plurality of semiconductor layers, in which the one or more electrodes respectively include a lower electrode layer for reflecting light generated in the active layer and then passed the non-conductive reflective film, and an upper electrode layer arranged on the lower electrode layer for preventing a foreign material from penetrating into the lower electrode layer; and an electrical connecting part for electrically connecting the plurality of semiconductor layers to at least one electrode.

Advantageous Effects

The advantageous effects of the present disclosure will be described in the latter part of the best mode for carrying out the invention.

MODE FOR CARRYING OUT INVENTION

Hereinafter, the present disclosure will now be described in detail with reference to the accompanying drawings. The following description is presented for purposes of illustration only and not of limitation as the scope of the invention is defined by the appended claims. For example, the steps mentioned in any of the method or process may be executed in any order and are not necessarily limited to the order provided. Also, any reference to singular includes plural embodiments, and vice versa.

Figure 3:
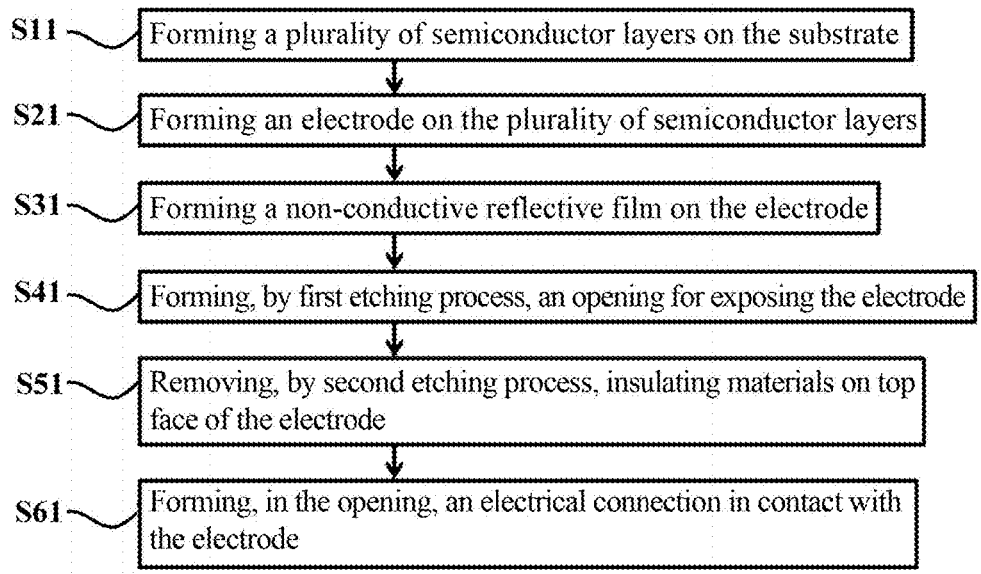
FIG. 3 is a schematic view illustrating an exemplary embodiment of a semiconductor light emitting device according to the present disclosure and a manufacturing method of the same.

FIG. 3 is a schematic view illustrating an exemplary embodiment of a semiconductor light emitting device according to the present disclosure and a manufacturing method of the same.

In a manufacturing method of a semiconductor light emitting device, in step 11, a plurality of semiconductor layers is formed on a substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination. Then, in step 21, an electrode electrically connected to the first semiconductor layer or the second semiconductor layer is formed. Next, in step 31, a non-conductive film for reflecting light from the active layer is formed in a manner that the non-conductive film covers the electrode and faces the plurality of semiconductor layers. The subsequent step 41 involves a process of forming an opening on the non-conductive film for an electrical connecting pass with the electrode. That is, a first etching process is carried out to form an opening through which the electrode is exposed. Afterwards, in step 51, a second etching process is carried out to remove materials formed on top of the electrode having been exposed to the opening. Then, in step 61, an electrical connecting part in contact with the electrode is formed in the opening.

Figure 4:
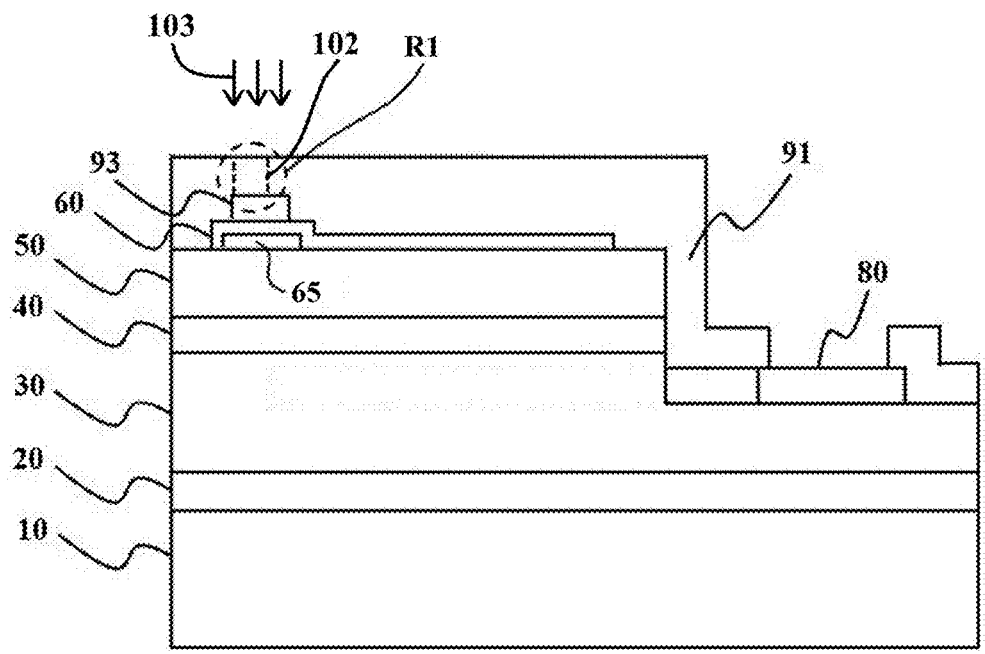
FIG. 4 is a schematic view illustrating an exemplary embodiment of a manufacturing method of the semiconductor light emitting device shown in FIG. 3.

FIG. 4 is a schematic view illustrating an exemplary embodiment of a manufacturing method of the semiconductor light emitting device shown in FIG. 3.

In this manufacturing method of the semiconductor light emitting device, firstly, a buffer layer 20 is grown on a substrate 10, followed by an n-type semiconductor layer 30 (a first semiconductor layer), an active layer 40, and a p-type semiconductor layer 50 (a second semiconductor layer) in sequence (refer to S11 in FIG. 3).

The substrate 10, which may eventually be removed, is typically made of sapphire, SiC, Si, GaN or the like, and the buffer layer 20 may be omitted.

The p-type semiconductor layer 50 and the active layer 40 are mesa-etched, thereby exposing a part of the n-type semiconductor layer. The mesa etching may be carried out in different orders.

A light absorption barrier 65 is formed on the p-type semiconductor layer, in correspondence with an electrode 93 to be formed in a subsequent step. The light absorption barrier 65 may be omitted. The light absorption barrier 65 may be composed of a single layer (e.g. $SiO_2$) that is made of a light transmitting material having a refractive index lower than the refractive index of the p-type semiconductor layer 50, or a multilayered structure (e.g. $SiO_2/TiO_2/SiO_2$), or a DBR, or a combination of the single layer and the DBR. In addition, the light absorption barrier 65 may be made of a non-conductive material (e.g. a dielectric film such as $SiO_x$, $TiO_x$ or the like).

A light transmitting conductive film 60 covering the light absorption barrier 65 is preferentially formed on the p-type semiconductor layer 50, for current spreading into the p-type semiconductor layer 50. For example, the light transmitting conductive film 60 may be made of a material such as ITO, Ni/Au or the like.

Next, the electrode 93 is formed on the light transmitting conductive film 60 (refer to S21 in FIG. 3). The electrode 93 is electrically connected with the p-type semiconductor layer 50 by means of the light transmitting conductive film 60. When the electrode 93 is formed, an n-side bonding pad 80 adapted to supply electrons to the n-type semiconductor layer 30 may also be formed on the exposed n-type semiconductor layer 30. Optionally, the n-side bonding pad 80 may be formed when a reflective electrode 92 (to be described later) is formed.

If an electrical connecting part 94 (see FIG. 7) (to be described later) is directly connected to the light transmitting conductive film 60, it may not be easy to form a satisfactory electrical contact between the reflective electrode 92 (see FIG. 7) and the light transmitting conductive film 60. In this embodiment, the electrode 93 which is interpositioned between the light transmitting conductive film 60 and the electrical connecting part 94 makes a stable electrical contact with them and prevents an increase in the contact resistance.

Subsequently, as a non-conductive film, a non-conductive reflective film 91 covering the electrode 93 is formed (see S31 in FIG. 3). The non-conductive reflective film 91 may also be formed on top of the etch-exposed n-type semiconductor layer 30 and on top of a part of the n-side bonding pad 80. It is not absolutely necessary for the non-conductive reflective film 91 to cover the entire area on the n-type and p-type semiconductor layers 30, 50. It is desirable that the non-conductive reflective film 91 functions as a reflective film, yet it is made of light transmitting materials for avoiding light absorption. The non-conductive reflective film 91 may be formed of light transmitting dielectric materials such as $SiO_x$, $TiO_x$, $Ta_2O_5$, or $MgF_2$. When the non-conductive reflective layer 91 is made of $SiO_x$, it has a lower refractive index than the refractive index of the p-type semiconductor layer 50 (e.g. GaN) such that the light incident at a greater angle than the critical angle will partly be reflected towards the plurality of semiconductor layers 30, 40, 50.

Meanwhile, when the non-conductive reflective film 91 is made of a DBR (e.g. DBR using the combination of $SiO_2$ and TiO$_2$), a greater amount of incident light will be reflected towards the plurality of semiconductor layers 30, 40, 50.

Figure 5:
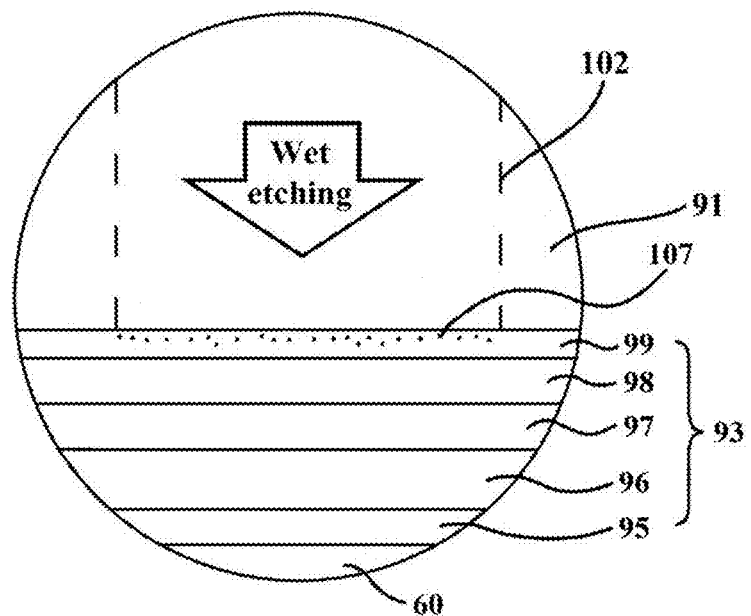
FIG. 5 is an enlarged view of a portion R1 of an opening formed by dry etching.
Figure 6:
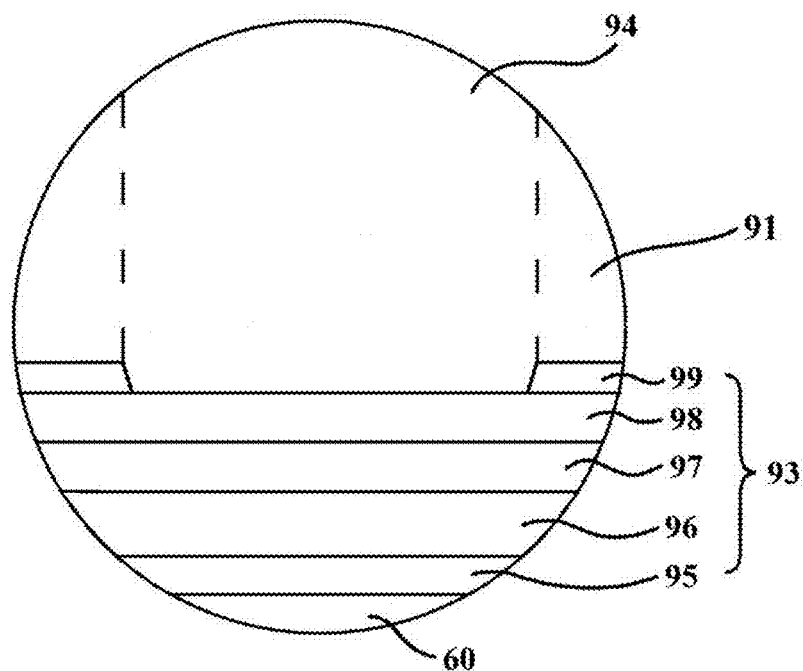
FIG. 6 is a schematic view illustrating the upper face of a wet-etched electrode.

FIG. 5 is an enlarged view of a portion R2 of an opening formed by dry etching, and FIG. 6 is a schematic view illustrating the upper face of a wet-etched electrode.

Further, an opening 102 is formed by dry etching (a first etching process) in the non-conductive reflective film 91 such that a part of the electrode 93 is exposed (see S41 in FIG. 3). During dry etching, halogen gases containing an F group (e.g. CF$_4$, C$_2$F$_6$, C$_3$F$_8$, SF$_6$ or the like) may be used as an etching gas. The electrode 93 may include multiple layers. For example, the electrode 93 includes a contact layer 95 electrically connected with the p-type semiconductor layer 50, an anti-oxidation layer 98 formed on the contact layer 95, and an anti-etching layer 99 formed on the anti-oxidation layer 98. In this embodiment, the electrode 93 includes a contact layer 95, a reflective layer 96, a diffusion barrier 97, an anti-oxidation layer 98 and an anti-etching layer 99, which are arranged sequentially on the light transmitting conductive film 60.

The contact layer 95 is preferentially made of a material that can establish a satisfactory electrical contact with the light transmitting conductive film 60. To this end, a material such as Cr or Ti is typically used, but other materials such as Ni, Ti or TiW and highly reflective materials such as Al or Ag can also be used for the contact layer 95.

The reflective layer 96 may be made of a highly reflective metal (e.g. Ag, Al or a combination thereof). The reflective layer 96 reflects light generated in the active layer 40 towards the plurality of semiconductor layers 30, 40, 50. The reflective layer 96 may be omitted.

The diffusion barrier 97 prevents the material of the reflective layer 96 or the material of the anti-oxidation layer 98 from diffusing to other layers. The diffusion barrier 97 may be made of at least one of Ti, Ni, Cr, W or TiW. If high reflectance is required, Al or Ag may be used.

The anti-oxidation layer 98 may be made of Au, Pt or the like. Any material that is not easily oxidized when exposed to the outside and brought into contact with oxygen is also acceptable. Au with high electrical conductivity is preferentially used for the anti-oxidation layer 98.

The anti-etching layer 99 is exposed during dry etching for forming the opening 102. In this embodiment, the anti-etching layer 99 corresponds to a top layer of the electrode 93. When the anti-etching layer 99 is made of Au, it shows weak bonding strength towards the non-conductive reflective film 91, and part of Au may be damaged or ruined during etching. Hence, the anti-etching layer 99 is preferentially made of a material such as Ni, W, TiW, Cr, Pd, Mo or the like, instead of Au, in order to retain the bonding strength towards the non-conductive reflective layer 91, thus improving reliability.

During dry etching, the anti-etching layer 99 protects the electrode 93, and in particular it prevents damages on the anti-oxidation layer 98. During dry etching, halogen gases containing an F group (e.g. CF$_4$, C$_2$F$_6$, C$_3$F$_8$, SF$_6$ or the like) may be used as an etching gas. To avoid any damage on the anti-oxidation layer 98 during dry etching, the anti-etching layer 99 is preferentially made of a material having high etching selectivity. If the anti-etching layer 99 has poor etching selectivity, the anti-oxidation layer 98 may be damaged or ruined during dry etching. Therefore, from the perspective of etching selectivity, Cr or Ni is a suitable choice of materials for the anti-etching layer 99. Ni or Cr does not or only slightly reacts with the etching gas during dry etching, thereby remaining in a non-etched condition, which enables the anti-etching layer to protect the electrode.

Meanwhile, the etching gas used in dry etching for forming the opening 102 may produce a material 107 such as an insulation material or impurities on the top layer of the electrode 93. For example, the material 107 may be produced by a reaction between the halogen etching gas containing an F group and the top layer metal of the electrode. For instance, Ni, W, TiW, Cr, Pd, Mo and the like, which are the materials of the anti-etching layer 99, may at least partly react with the etching gas used in dry etching, and produce the material 107 (e.g. NiF), as shown in FIG. 5. However, the material 107 thus produced can cause deterioration of the electrical properties (e.g. an increased operating voltage) of the semiconductor light emitting device. Another part of Ni, W, TiW, Cr, Pd, Mo and the like, which are the materials of the anti-etching layer 99, may react with the etching gas but will not produce the material at all or produce a very small amount of the material. It is desirable to suppress the production of the material, or allow only a very small amount to be produced. From this perspective, Cr is preferred to Ni as a material for the anti-etching layer 99.

In this embodiment, due to the material being produced, the top layer of the electrode 93, i.e. a part of the anti-etching layer 99 in correspondence to the opening 102 is subjected to wet etching (a second etching process) and removed such that, as shown in FIG. 6, a part of the anti-oxidation layer 98 in correspondence to the opening 102 is exposed. As such, the material 107 as well as the anti-etching layer 99 are etched and removed together. With the material 107 having been removed, the electrode 93 and the electrical connecting part 94 (see FIG. 7) may have a better electrical contact between them, and deterioration of the electrical properties of the semiconductor light emitting device is avoided.

Alternatively, the first etching process for forming the opening 102 may be carried out by wet etching. In this case, the wet etchant for the non-conductive reflective film 91 may be HF, BOE, NHO$_3$, or HCl, which is used singly or in combination, at a suitable concentration. Similar to dry etching mentioned above, when the opening 102 is formed in the non-conductive reflective film 91 by wet etching, the anti-etching layer 99 should preferentially have high etching selectivity for protecting the anti-oxidation layer 98. From this perspective, Cr is a suitable material for the anti-etching layer 99. Then a part of the anti-etching layer 99 in correspondence to the opening 102 can be removed by another subsequent wet etching (a second etching process).

As a result of the processes of forming the opening 102 and removing a part of the anti-etching layer 99 in correspondence to the opening 102, the non-conductive reflective film 91 and the anti-etching layer 99 having excellent bonding strength in other parts except for the opening 102 are brought into contact with each other; and, for example, the electrode 93 will have a stack of Cr (contact layer)/Al (reflective layer)/Ni (diffusion barrier)/Au (anti-oxidation layer)/Cr (anti-etching layer) arranged sequentially. Also, having removed a part of the anti-etching layer 99 in correspondence to the opening 102 to avoid deterioration of the electrical properties, the electrode 93 will have a stack including Cr (contact layer)/Al (reflective layer)/Ni (diffusion barrier)/Au (anti-oxidation layer) arranged sequentially, in which the anti-oxidation layer 98 may come into contact with an electrical connecting part 94 (to be described).

Unlike the embodiment shown in FIG. 6, a part of the anti-etching layer 99 in correspondence to the opening 102 may be partly wet etched down to a certain thickness, leaving the other part of the anti-etching layer 99 non-etched; and the material centered on the top face of the anti-etching layer can be removed.

Figure 7:
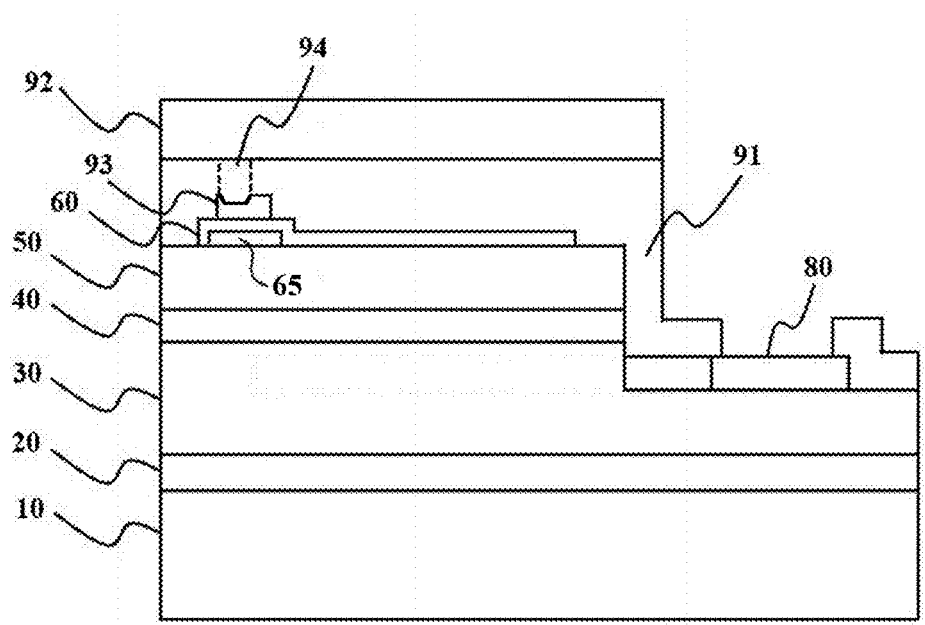
FIG. 7 is a schematic view illustrating an electrical connecting part formed in the opening.

FIG. 7 is a schematic view illustrating an electrical connecting part formed in the opening.

As can be seen in FIG. 7, an electrical connecting part 94 in contact with the electrode 93 is formed in the opening 102 (see S61 in FIG. 3). The electrical connecting part 94 may be formed such that it is brought into contact with the anti-oxidation layer 98 exposed to the opening 102.

A reflective electrode 92 being in contact with the electrical connecting part 94 may then be formed on the non-conductive reflective film 91, with the reflective electrode being made of a highly reflective metal such as Al or Ag. The reflective electrode 92 may be formed by deposition or plating, for instance. Alternatively, the reflective electrode 92 and the electrical connecting part 94 may be formed together instead of forming them separately. For example, the electrical connecting part 94 is formed by filling the opening 102 during the formation of the reflective electrode 92. For a stable electrical contact, the reflective electrode 92 may be made of Cr, Ti, Ni or an alloy thereof. The reflective electrode 92 may be electrically connected to the outside to supply holes to the p-type semiconductor layer 50, and it may reflect light that is not reflected by the non-conductive reflective film 91.

When the substrate 10 has been removed or the substrate 10 is conductive, the n-side bonding pad 80 may be formed either on the n-type semiconductor layer 30 side after the substrate 10 had been removed, or on the conductive substrate side. The positions of the n-type semiconductor layer 30 and p-type semiconductor layer 50 may be exchanged, and these semiconductor layers are typically made of GaN in case of Group III-nitride semiconductor light emitting devices. Each of the semiconductor layers 20, 30, 40, 50 may have a multilayered structure, and an additional layer may optionally be added thereto.

Figure 1:
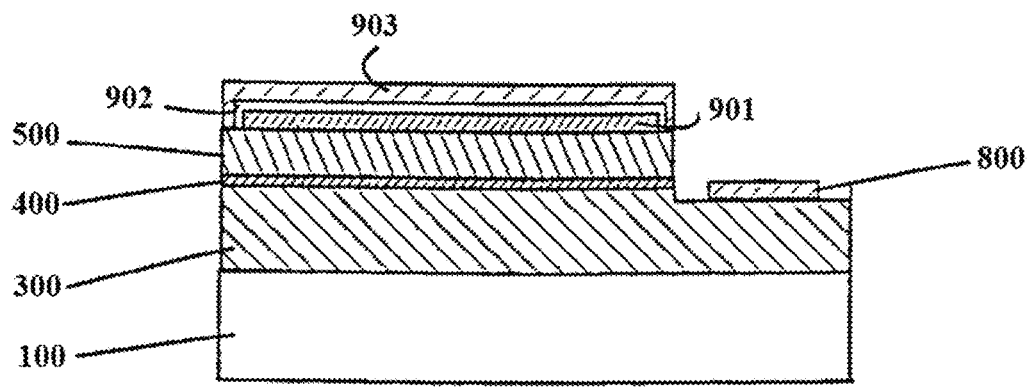
FIG. 1 is a schematic view illustrating an exemplary embodiment of the semiconductor light emitting device disclosed in U.S. Pat. No. 7,262,436.
Figure 2:
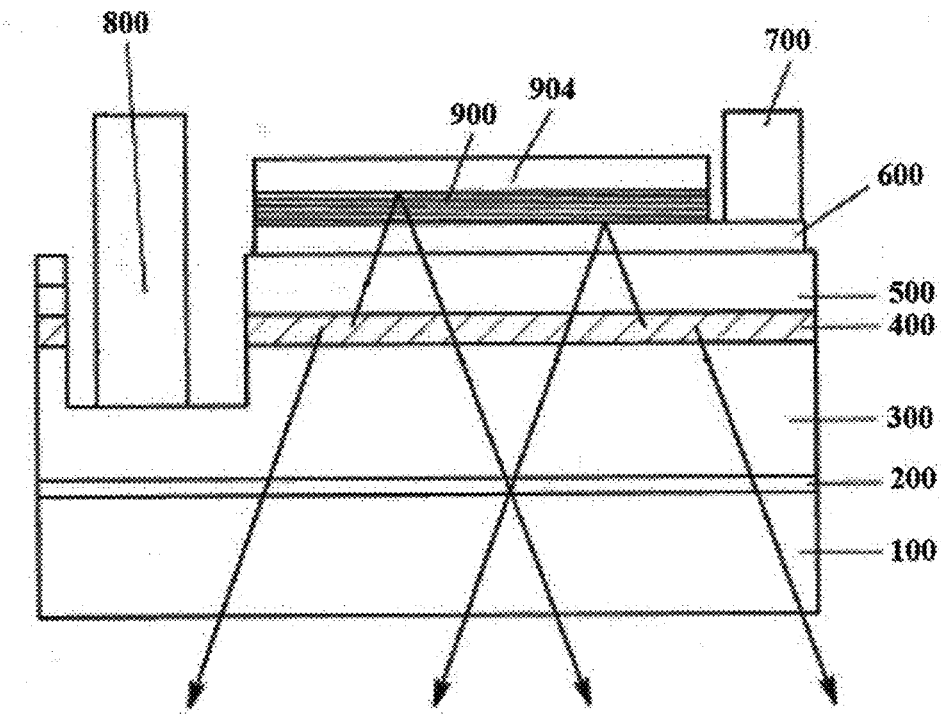
FIG. 2 is a schematic view illustrating an exemplary embodiment of the semiconductor light emitting device proposed in JP Laid-Open Pub. No. 2006-20913.

The electrode 93, the n-side bonding pad 80 and the reflective electrode 92 may be formed to have a branch portion to spread current. The n-side bonding pad 80 may have a height that is high enough to be combined with a package with the help of a separate bump, or the n-side bonding pad itself may be deposited up to a certain height that is high enough to be combined with a package as in FIG. 2.

According to the manufacturing method of a semiconductor light emitting device described above, deterioration of the electrical properties of the semiconductor light emitting device is avoided by removing the material produced between the electrode 93 and the electrical connecting part 94.

Moreover, the method makes it possible to manufacture a semiconductor light emitting device including an electrode 93 that demonstrates excellent bonding strength towards the non-conductive reflective film 91 as well as a satisfactory electrical contact with the electrical connecting part 94.

In this embodiment, the electrode 93, the electrical connecting part 94 and the reflective electrode 92 form an electrode part adapted to supply holes to the second semiconductor layer 50. In this electrode part, the electrode 93 is provided as a lower electrode, the reflective electrode 92 is provided as an upper electrode, and the electrical connecting part formed in the opening serves to electrically connect the lower electrode and the upper electrode.

Figure 8:
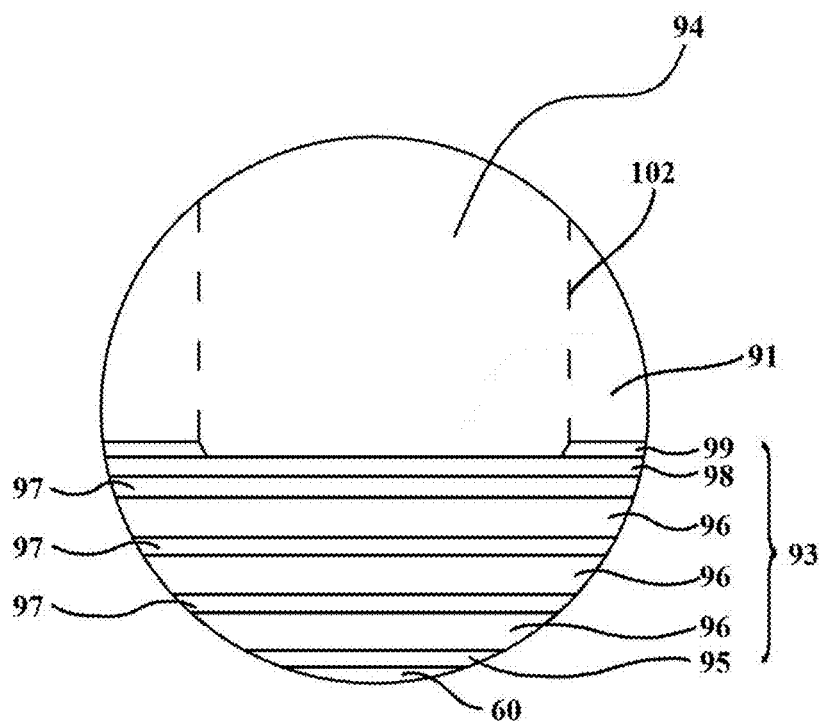
FIG. 8 is a schematic view illustrating a further exemplary embodiment of a semiconductor light emitting device according to the present disclosure and a manufacturing method of the same.

FIG. 8 is a schematic view illustrating a further exemplary embodiment of a semiconductor light emitting device according to the present disclosure and a manufacturing method of the same.

This manufacturing method of a semiconductor light emitting device is substantially identical with the manufacturing method of the semiconductor light emitting device illustrated in FIG. 3 through FIG. 7, except that an electrode 93 is formed to have alternating layers of a reflective layer 96 and a diffusion barrier 97. Hence, common features will not be described to avoid redundancy.

The electrode 93 includes a contact layer 95 formed on a light transmitting conductive film 60; alternating layers of a reflective layer 96 and a diffusion barrier 97 deposited on the contact layer 95; an anti-oxidation layer 98 formed on the diffusion barrier 97; and an anti-etching layer 99 in contact with a non-conductive reflective film 91. A part of the anti-etching layer 99 in correspondence to an opening is removed to expose the anti-oxidation layer 98 such that the anti-oxidation layer 98 may be brought into contact with an electrical connecting part 94.

For example, the reflective layer 96/the diffusion barrier 97 may form an Al/Ni/Al/Ni/Al/Ni layered structure. If multiple electrical connecting parts 94 are formed between the electrode 93 and a p-side bonding pad, the electrode 94 may have an increased area. Because of this, the prevention of light absorption by the electrode 93 can become more important, and the reflective layer 96 becomes important as well. If the reflective layer 96 such as Al is made very high, several problems may occur, e.g. the Al layer may burst. However, the alternating layers of the reflective layer 96/the diffusion barrier 97 as in this embodiment make it possible to remove things like insulating materials or impurities, which in turn provides a satisfactory electrical contact and improves reflectivity, while eliminating the aforementioned problems.

Figure 9:
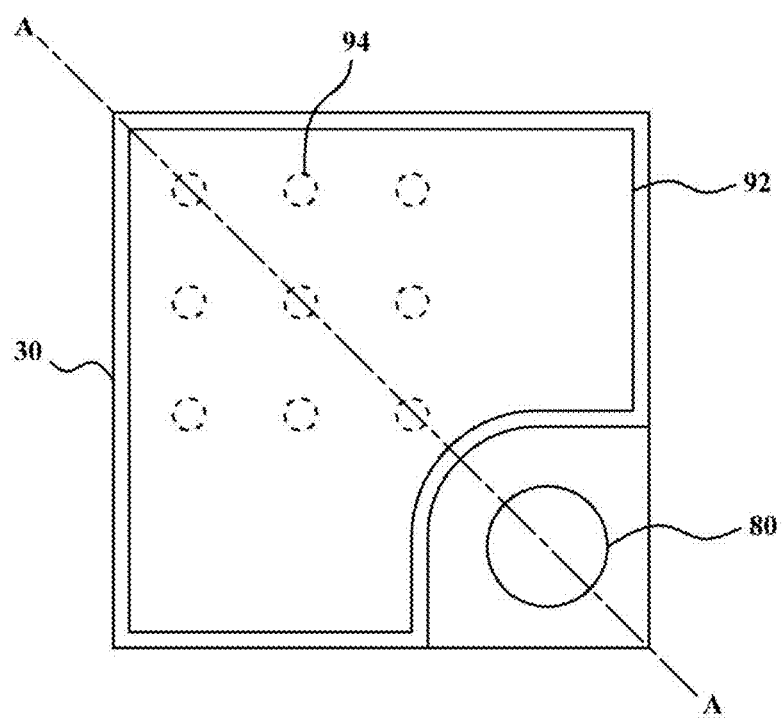
FIG. 9 is a schematic view illustrating a still further exemplary embodiment of a semiconductor light emitting device according to the present disclosure and a manufacturing method of the same.
Figure 10:
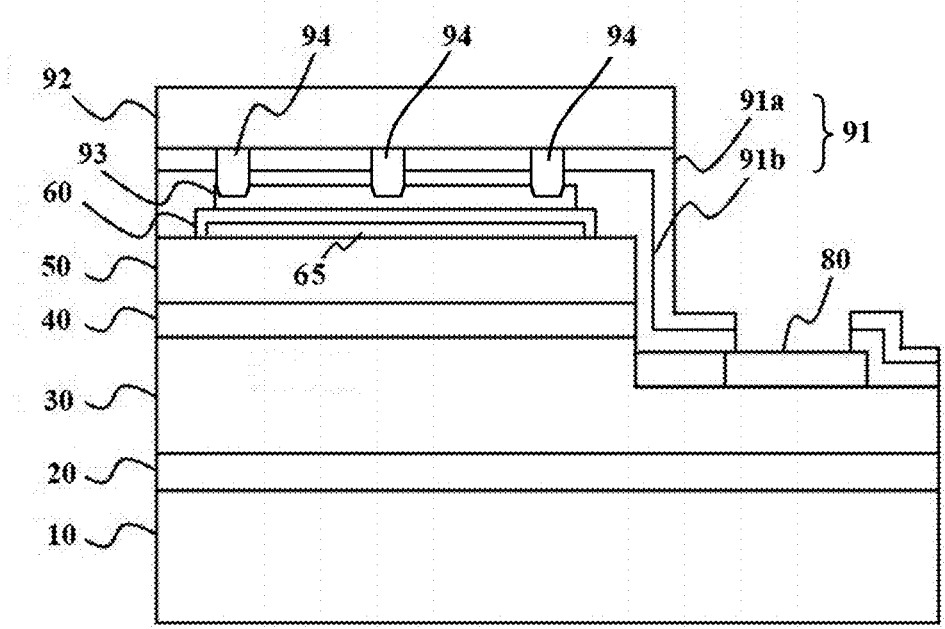
FIG. 10 is a schematic view illustrating a cutaway portion, taken along line A-A in FIG. 9.

FIG. 9 is a schematic view illustrating a still further exemplary embodiment of a semiconductor light emitting device according to the present disclosure and a manufacturing method of the same, and FIG. 10 is a schematic view illustrating a cutaway portion, taken along line A-A in FIG. 9.

This manufacturing method of a semiconductor light emitting device is applicable to a large area semiconductor light emitting device. This manufacturing method of a semiconductor light emitting device is substantially identical with the manufacturing method of the semiconductor light emitting device illustrated in FIG. 3 through FIG. 7, except that the electrode 93 has an increased area or stretched in a finger electrode form, a plurality of openings and a plurality of electrical connecting parts 94 are formed, and the non-conductive reflective film 91 has a dielectric film 91b and a DBR 91a (e.g. DBR using the combination of $SiO_2$ and $TiO_2$). Hence, common features will not be described to avoid redundancy.

Since the non-conductive reflective film 91 includes a DBR, a greater amount of light can be reflected towards the plurality of semiconductor layers 30, 40, 50.

The dielectric film 91b is suitably made of $SiO_2$, and it preferentially has a thickness ranging from 0.2 μm and 1.0 μm. The dielectric film 91b made of $SiO_2$ is preferentially formed by CVD (Chemical Vapor Deposition) and in particular by PECVD (Plasma Enhanced CVD).

If the DBR 91a is made of the combination of $TiO_2/SiO_2$, each layer is designed to have an optical thickness of ¼ of a given wavelength, and the number of the combinations thereof is suitably in a range of from 4 to 20 pairs. The DBR 91a is preferentially formed by PVD (physical vapor deposition), and in particular by E-beam evaporation, sputtering or thermal evaporation.

An additional dielectric film may be formed on the DBR 91a before the reflective electrode 92 is formed. The dielectric film 91b, the DBR 91a and the additional dielectric form a light guide structure.

To spread current, a plurality of electrical connecting parts 94 is formed between the electrode and the p-side reflective electrode 92. As such, during dry etching for forming a plurality of openings in the non-conductive reflective film 91, a material may be produced on top of the exposed electrode 93 through the plurality of openings.

The material as well as the top layer of the electrode 93, for instance, a part of the anti-etching layer in correspondence to the openings are removed by wet etching. Afterwards, those electrical connecting parts 94 are formed in the plurality of openings. Accordingly, deterioration of the electrical properties of a large area semiconductor light emitting device is avoided.

Figure 11:
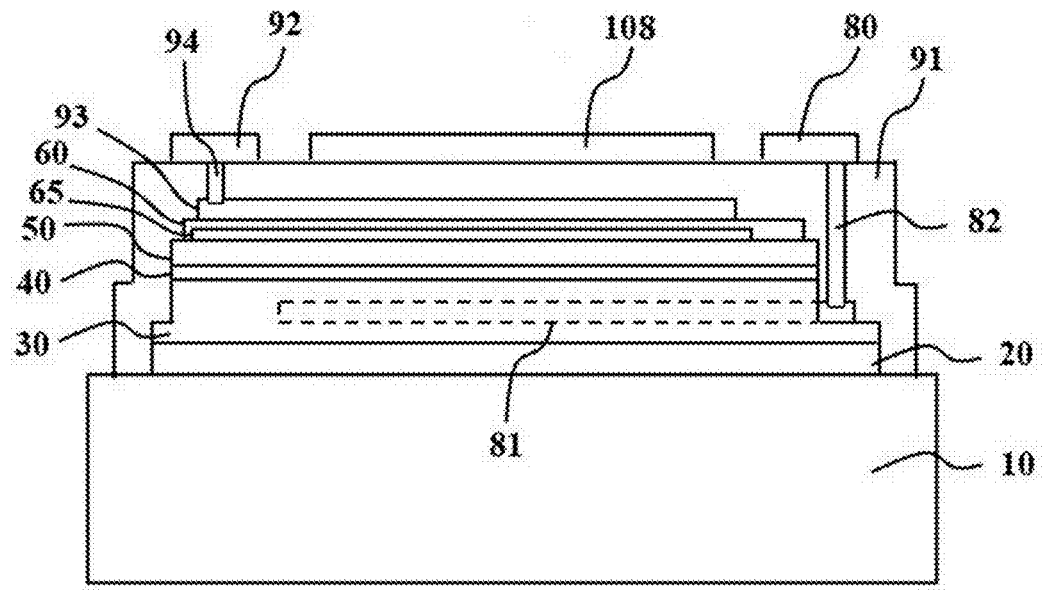
FIG. 11 is a schematic view illustrating a still further exemplary embodiment of a semiconductor light emitting device according to the present disclosure and a manufacturing method of the same.

FIG. 11 is a schematic view illustrating a still further exemplary embodiment of a semiconductor light emitting device according to the present disclosure and a manufacturing method of the same.

This manufacturing method of a semiconductor light emitting device is substantially identical with the manufacturing method of the semiconductor light emitting device illustrated in FIG. 3 through FIG. 7, except that an n-side bonding pad 80 is formed on a non-conductive reflective film 91, an opening is formed to generate an electrical connecting part 82 between the n-side bonding pad 81 and an n-side finger electrode 81, and heat-emission and reflective electrode 108 is provided. Hence, common features and thus their description will be omitted to avoid redundancy.

Dry etching is carried out to form openings which respectively expose a part of the electrode 93 and the n-side finger electrode 81. As such, a material such as an insulating material or impurities are produced not only on top of the electrode 93, but also on top of the n-side finger electrode 81.

The materials on top of the electrode 93 and of the n-side finger electrode 81, each being exposed to the respective opening by subsequent wet etching, may be removed together. Electrical connecting parts 94, 82 are then formed. The electrical connecting parts 94, 82 may be formed in a manner that they are brought into contact with the electrode 93 and with the anti-oxidation layer of the n-side finger electrode 81, which are exposed after the anti-etching layer had been removed. These electrical connecting parts 94, 82 electrically connect the p-side bonding pad 92 and the n-side bonding pad 80 to the p-type semiconductor layer 50 and the n-type semiconductor layer 30, respectively.

Figure 12:
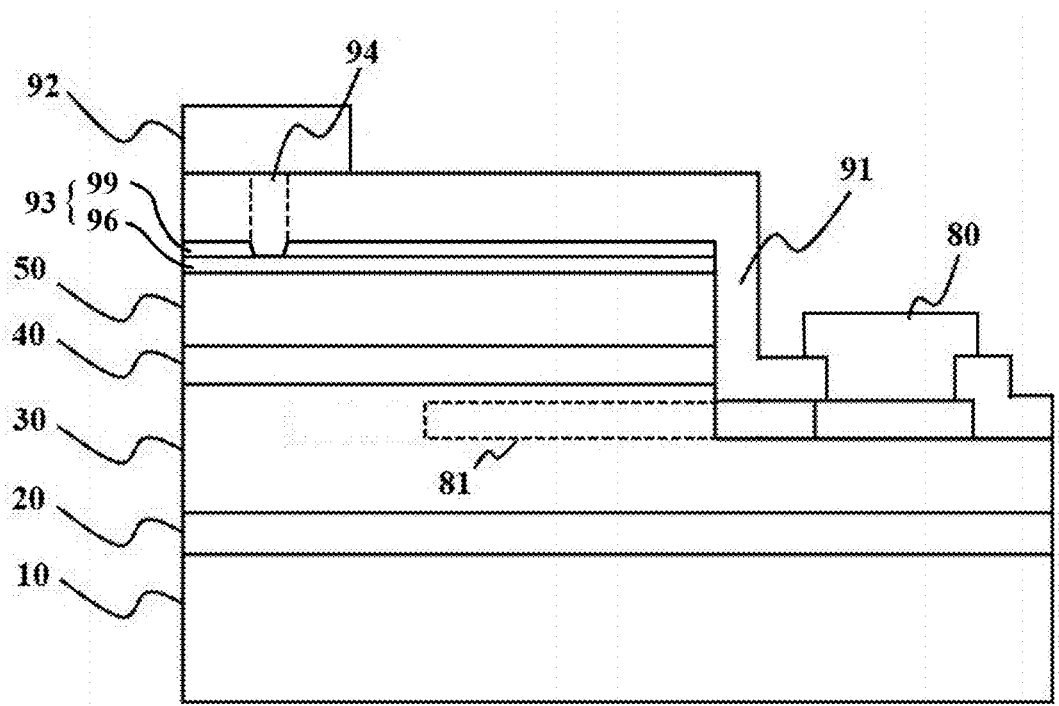
FIG. 12 is a schematic view illustrating a still further exemplary embodiment of a semiconductor light emitting device according to the present disclosure and a manufacturing method of the same.

FIG. 12 is a schematic view illustrating a still further exemplary embodiment of a semiconductor light emitting device according to the present disclosure and a manufacturing method of the same.

This manufacturing method of a semiconductor light emitting device is substantially identical with the manufacturing method of the semiconductor light emitting device illustrated in FIG. 3 through FIG. 7, except that a light transmitting conductive film and a light absorption barrier are omitted, an electrode 93 having a 2-layered structure is formed all over a p-type semiconductor layer 50 to serve as a reflective film and a current-spreading conductive film, and an n-side finger electrode 81 is additionally provided. Hence, common features will not be described to avoid redundancy.

The electrode 93 includes a reflective layer 96 made of a highly reflective material such as Ag or Al, and the reflective layer 96, together with the p-type semiconductor layer 50, serves as an ohmic contact layer. The electrode 93 includes an anti-etching layer 99 on the reflective layer 96, in which the anti-etching layer 99 is made of a material having high bonding strength towards the non-conductive film 91. For example, the electrode 93 may include an anti-etching layer on the reflective layer, e.g. an Ag layer or an Al layer, in which the anti-etching layer is made of a material such as Ni, W, TiW, Cr, Pd or Mo. The anti-etching layer 99 may be formed all over the Ag or the Al layer, or only on a part in correspondence to the opening. The anti-etching layer 99 is preferentially selected from materials which have high etching selectivity during dry etching for forming an opening, and which do not react with an etching gas or produce a smaller amount of a material such as an insulating material or impurities. From these perspectives, Cr or Ni is a suitable choice.

In this embodiment, a dielectric film 91 is provided as a non-conductive film. The dielectric film 91 may be made of a light transmitting dielectric material such as $SiO_x$, $TiO_x$, $Ta_2O_5$ or $MgF_2$.

An opening is formed in the dielectric film 91 by dry etching. During dry etching for forming an opening, a material such as an insulating material or impurities may be produced on top of the electrode 93. This material is later removed by wet etching. During wet etching for removing the material, a part of the electrode 93, e.g. at least part of the anti-etching layer 99 in correspondence to the opening may be removed. An electrical connecting part 94 is formed in the opening. Therefore, an increase in an operating voltage of the semiconductor light emitting device due to the material is prevented.

Each of the semiconductor light emitting devices described above include a first electrode part (an n-side electrode part) and a second electrode part (a p-side electrode part). At least one of the first and second electrode parts includes a lower electrode (e.g. 93, 81) at least partly exposed via the opening, an upper electrode (e.g. 92, 80) provided on the non-conductive film, and an electrical connecting part (e.g. 94, 82) formed in the opening to electrically connect the lower electrode and the upper electrode. These electrode parts are also provided to those semiconductor light emitting devices described below.

Figure 13:
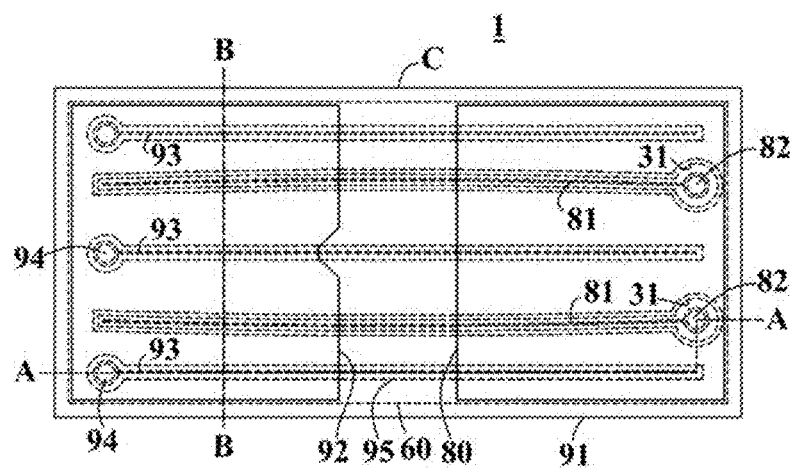
FIG. 13 is a schematic view illustrating a still further exemplary embodiment of a semiconductor light emitting device according to the present disclosure.
Figure 14:
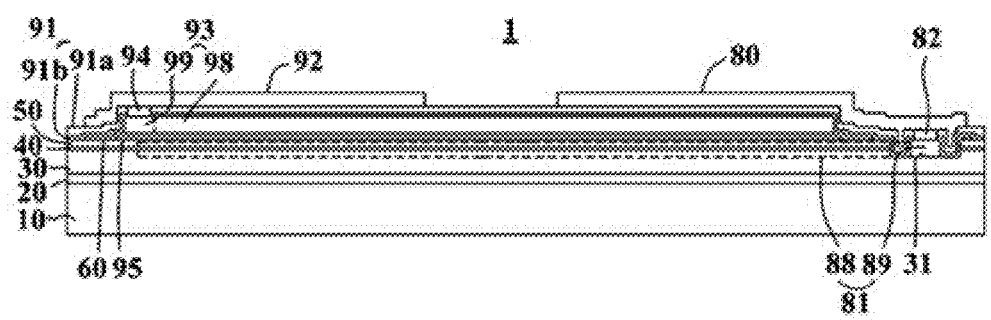
FIG. 14 is a cross-sectional view taken along line A-A in FIG. 13.
Figure 15:
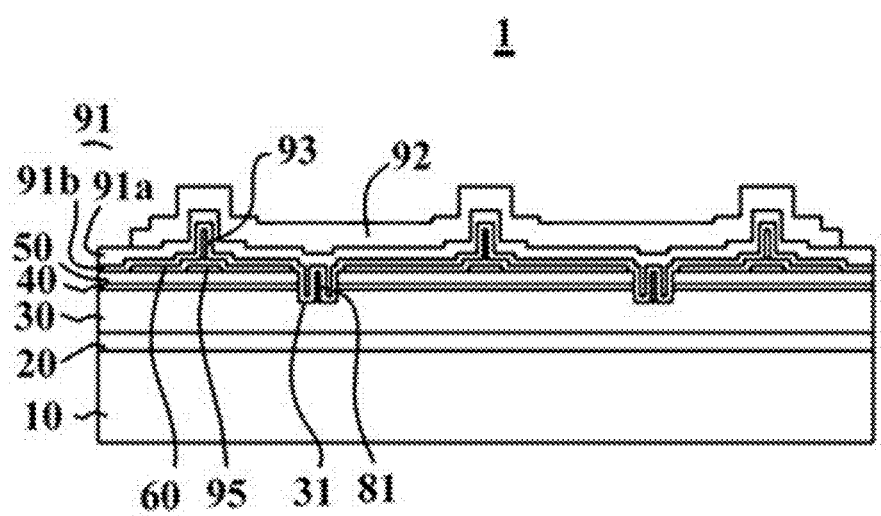
FIG. 15 is a cross-sectional view taken along line B-B in FIG. 13.
Figure 16:
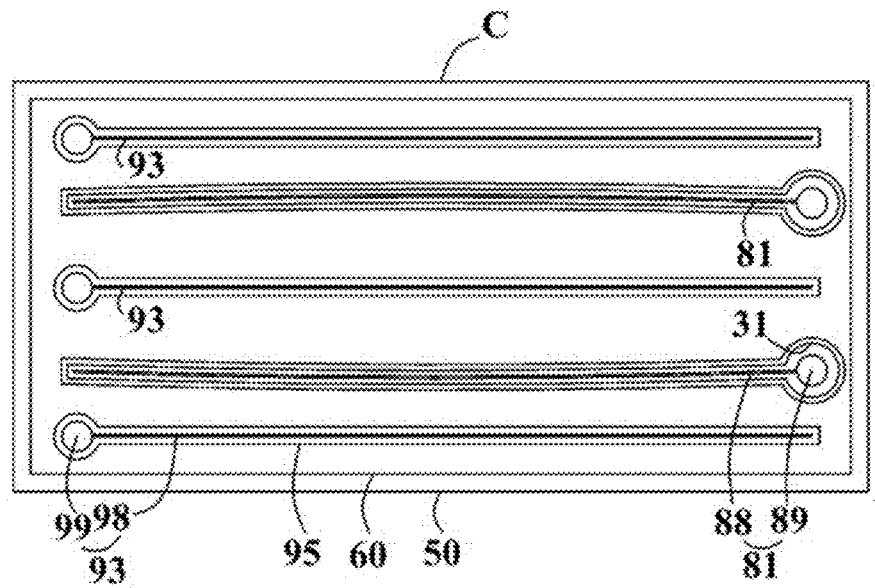
FIG. 16 is a schematic view illustrating the semiconductor light emitting device of FIG. 13, after the p-side electrode, the n-side electrode and the non-conductive reflective film have been removed therefrom.

FIG. 13 is a schematic view illustrating a still further exemplary embodiment of a semiconductor light emitting device according to the present disclosure, FIG. 14 is a cross-sectional view taken along line A-A in FIG. 13, FIG. 15 is a cross-sectional view taken along line B-B in FIG. 13, and FIG. 16 is a schematic view illustrating the semiconductor light emitting device of FIG. 13, after the p-side electrode, the n-side electrode and the non-conductive reflective film have been removed therefrom.

The semiconductor light emitting device 1 includes a substrate 10, a buffer layer 20 grown on the substrate 10, an n-type semiconductor layer 30 grown on the buffer layer 20, an active layer 40 grown on the n-type semiconductor layer 30 for generating light by electron-hole recombination, and a p-type semiconductor layer 50 grown on the active layer 40.

The substrate 10, which may eventually be removed, is typically made of sapphire, SiC, Si, GaN or the like, and the buffer layer 20 can be omitted. When the substrate 10 has been removed or the substrate 10 is conductive, an n-side bonding pad 80 may be formed either on the n-type semiconductor layer 30 side after the substrate 10 had been removed, or on the conductive substrate 10 side. The positions of the n-type semiconductor layer 30 and p-type semiconductor layer 50 may be exchanged, and these semiconductor layers are typically made of GaN in case of Group III-nitride semiconductor light emitting devices. Each of the semiconductor layers 20, 30, 40, 50 may have a multilayered structure, and an additional layer may optionally be added thereto.

The p-type semiconductor layer 50 and the active layer 40 are partly removed by mesa etching and form two n-side contact areas 31 with the n-type semiconductor layer 30 being exposed. An n-side finger electrode 81 is then formed on the n-type semiconductor layer 30 in each of the n-side contact areas 31. The n-side contact areas 31 are expanded in parallel with one lateral face C of the semiconductor light emitting device. While the n-side contact areas 31 may be open to the lateral direction of the semiconductor light emitting device, their rims are preferentially enclosed and blocked by the active layer 40 and the p-type semiconductor layer 50 without being open to any of the lateral faces. The number of the n-side contact areas 31 may be higher or lower, and the array or configuration thereof may vary. The n-side finger electrode 81 preferentially includes a branch portion 88 being stretched, and a connecting part 89 to allow a greater width at one side end of the branch portion 88. Corresponding to this, the n-side contact area 31 has a smaller width at the part where the branch portion 88 of the n-side finger electrode 81 is disposed, and a greater width at the part where the connection portion 89 of the n-side finger electrode 81 is disposed.

Three p-side finger electrodes 93 are formed on the p-type semiconductor layer 50. The p-side finger electrodes 93 are formed in parallel with the n-side finger electrodes 81, in which one of the p-side finger electrodes is arranged between two n-side finger electrodes 81 and the other two p-side finger electrodes are arranged on both sides of the n-side finger electrodes, respectively. Therefore, the n-side finger electrodes 81 are placed in-between three p-side finger electrodes 93, respectively, in an alternate manner. Also, the p-side finger electrode 93 preferentially includes a branch portion 98 being stretched, and a connecting part 99 to allow a greater width at one side end of the branch portion 98. Meanwhile, as shown in FIG. 13, when the semiconductor light emitting device is seen in a top plan view, the connecting part 99 of the p-side finger electrode 93 is positioned on the opposite side of the connecting part 89 of the n-side finger electrode 81. That is to say, the connecting part 99 of the p-side finger electrode 93 is positioned on the left side, while the connecting part 89 of the n-side finger electrode 81 is positioned on the right side. The p-side finger electrode 93 is long stretched along one lateral C direction of the semiconductor light emitting device. For instance, in FIG. 13 and FIG. 16, it is long stretched from the left side to the right side. With these long stretched, plural p-side finger electrodes 93, the device can be placed on a mount (e.g., a sub-mount, a package, or a COB (Chip on Board)) in an upside-down position without leaning. In this regard, it is preferential to form the p-side finger electrodes 93 as long as possible.

A suitable height for the p-side finger electrodes 83 and the n-side finger electrodes 81 ranges from 2 μm to 3 μm. If the finger electrodes are thinner than the range, it can lead to an increased operating voltage; and if the finger electrodes are thicker than the range, it can affect the stability of the process and increase the material cost.

Preferentially, a light absorption barrier film 95 is first formed on the p-type semiconductor layer 50 and then the p-side finger electrode 93 is formed above them. The light absorption barrier film 95 is formed in a manner that it is slightly wider than the p-side finger electrode 93. The light absorption preventing layer 95 serves to prevent the p-side finger electrode 93 from absorbing light that is generated in the active layer 40. The light absorption barrier film 95 may only serve to reflect part or all of the light generated in the active layer 40, or may only serve to stop the current flow from the p-side finger electrode 93 to the bottom thereof, or may serve both functions. To perform these functions, the light absorption barrier film 95 can be composed of a single layer that is made of a light transmitting material having a lower refractive index than the refractive index of the p-type semiconductor layer 50 (e.g., $SiO_2$), or multilayers (e.g., $SiO_2/TiO_2/SiO_2$), or a DBR, or a combination of the single layer and the DBR. In addition, the light absorption barrier film 95 can be made of a non-conductive material (e.g., a dielectric material such as $SiO_x$, $TiO_x$ or the like). Depending on the structure, a suitable thickness for the light absorption barrier film 95 would range from 0.2 μm to 3.0 μm. If the light absorption barrier film 95 is thinner than the range, it cannot function properly; and if the light absorption barrier film 95 is thicker than the range, it may be difficult to deposit the light transmitting conductive film 60 on the light absorption barrier film 95. Although the light absorption prevention film 95 does not always have to be made of a light transmitting material, or of a non-conductive material, the effects thereof may be enforced by incorporating a light transmitting dielectric material.

Preferentially, the light transmitting conductive film 60 is formed on the p-type semiconductor layer 50, prior to the formation of the light absorption barrier film 95 followed by the p-side finger electrode 93. The light transmitting conductive film 60 is formed on the p-type semiconductor layer 50 in such a way that it covers nearly the entire p-type semiconductor layer, but it does not cover the n-side contact area 31 that is formed by mesa etching. In this way, the light absorption barrier film 95 is disposed between the light transmitting conductive film 60 and the p-type semiconductor layer 50. Especially p-type GaN demonstrates poor current spreading capability. Also, when the p-type semiconductor layer 50 is made of GaN, the light transmitting conductive film 60 should be incorporated most of the time. For instance, a material such as ITO, Ni/Au or the like may be used for the light transmitting conductive film 60. Once the light transmitting conductive film 60 is formed, the light absorption barrier film 95 and then the p-side finger electrode 93 are formed above the light transmitting conductive film 60.

Following the formation of the n-side finger electrode 81 and the p-side finger electrode 93, a non-conductive reflective film 91 is formed in a manner that the both n-side contact area 31 including the n-side finger electrode 81 and the p-type semiconductor layer 50 including the p-side finger electrode 93 are covered all over with the non-conductive reflective film 91. The non-conductive reflective film 91 serves to reflect light from the active layer 40 towards the substrate 10 used for growing or towards the n-type semiconductor layer 30 if the substrate 10 has been removed. The non-conductive reflective film 91 preferentially covers the p-type semiconductor layer 50 that connects the upper face of the p-type semiconductor layer 50 and the upper face of the n-side contact area 31, as well as the exposed lateral face of the active layer 40. A person skilled in the art would understand that it is not absolutely necessary for the non-conductive reflective film 91 to cover the entire area of the etch-exposed n-type semiconductor layer 30 and p-type semiconductor layer 50 on the opposite side of the substrate 10.

The non-conductive reflective film 91 serves as a reflective film, yet it may preferentially be made of a light transmitting material, for example, a light transmitting dielectric material such as $SiO_x$, $TiO_x$, $Ta_2O_5$ or $MgF_2$, so as to prevent light absorption. The non-conductive reflective film 91 may be formed in various structures, including a single dielectric layer made of a light transmitting dielectric material such as $SiO_x$ (e.g., a single DBR including the combination of $SiO_2$ and $TiO_2$), heterogeneous plural dielectric films, or any combination of a dielectric film and a DBR, at a thickness ranging from 3 to 8 µm, for example. The dielectric film has a lower refractive index than the refractive index of the p-type semiconductor layer 50 (e.g., GaN) such that it can reflect part of the light incident at a greater angle than the critical angle towards the substrate 10. Meanwhile, the DBR can reflect a greater amount of light towards the substrate 10, and may be designed for a specific wavelength such that it can effectively reflect light according to the wavelength of the light generated.

Preferentially, as can be seen in FIG. 14 and FIG. 15, the non-conductive reflective film 91 has a dual structure of a DBR 91a and a dielectric film 91b. As the deposition of the DBR 91a needs to be done with high precision, the dielectric film 91b having a uniform thickness is formed prior to the deposition such that the DBR 91b may be prepared in a stable manner, and light reflection may also benefit therefrom.

During the manufacture of a semiconductor light emitting device according to the present disclosure, a step (or bump) may be created by mesa etching for forming the n-side contact area 31, and thus a component such as the p-side finger electrode 93 or the n-side finger electrode 81 is required to accommodate the step. Even after the non-conductive reflective film 91 is formed, a perforation process as described in detail below is still required to make an opening in the non-conductive reflective film 91. Thus, extra caution should be paid especially during the formation of the dielectric film 91b.

The dielectric film 91b is suitably made of $SiO_2$, and it preferentially has a thickness ranging from 0.2 µm to 1.0 µm. If the dielectric film 91b is thinner than the range, it is not sufficiently thick enough to sufficiently cover the n-side finger electrode 81 and p-side finger electrode 93 having a height ranging from 2 µm to 3 µm; and if the dielectric film 91b is thicker than the range, it would make the subsequent perforation process more difficult. The dielectric film 91b may be thicker than the DBD 91b that comes next. Moreover, it is necessary to form the dielectric film 91b by a more suitable method to ensure the reliability of the device. For example, it is preferential to form the dielectric film 91b made of $SiO_2$ by CVD (Chemical Vapor Deposition), or inter alia, by PECVD (Plasma Enhanced CVD). This is because steps are created during the formation of the n-side contact area 31, the p-side finger electrode 93 and the n-side finger electrode 81 by mesa etching, and because a CVD such as E-beam evaporation is more advantageous than PVD (Physical Vapor Deposition) to cover the steps. More specifically, if the dielectric film 91b is formed by E-beam evaporation, the dielectric film 91b may be formed into a thin film on the lateral faces of the p-side finger electrode 93 and n-side finger electrode 81 having steps, or on the tilted step faces generated by mesa etching. Meanwhile, if a thinner dielectric film 91b is formed on the step face, and especially if the p-side finger electrode 93 and the n-side finger electrode 81 are placed below the p-side electrode 92 and the n-side electrode 80 as described below, a short might occur between the electrodes. Therefore, in order to ensure insulation, the dielectric film 91b is preferentially formed by CVD. Accordingly, it is possible to secure the reliability of the semiconductor light emitting device, while ensuring those functions of the dielectric film as the non-conductive reflective film 91.

The DBR 91a is formed on the dielectric film 91b, and the DBR 91a and the dielectric film 91b together form the non-conductive reflective film 91. For example, the DBR 91a having alternating layers of the combination of $TiO_2/SiO_2$ is preferentially formed by PVD, and inter alia, by E-beam evaporation, sputtering or thermal evaporation. When the DBR 91a is made of the combination of $TiO_2/SiO_2$, each layer is designed to have an optical thickness of one fourth of a given wavelength, and the number of its combinations is suitably between 4 and 20 pairs. This range is set because if the number of pairs is smaller than the range, the reflectivity of the DBR 91a may be degraded; and if the number of pairs is larger than the range, the DBR 91a may become excessively thick.

With the non-conductive reflective film 91 thus formed, the p-side finger electrode 93 and the n-side finger electrode 81 are fully covered with the non-conductive reflective film 91. To enable the p-side finger electrode 93 and the n-side finger electrode 81 to electrically communicate with the p-side electrode 92 and the n-side electrode 80 described below, openings that pass through the non-conductive reflective film 91 are formed, and the openings are then filled with an electrode material to form electrical connecting parts 94, 82. These openings are preferentially formed by dry etching or wet etching or both. As the p-side finger electrode 93 and the n-side finger electrode 81 have narrow-width branch portions 98, 88 respectively, the electrical connecting parts 94, 82 are preferentially formed on the connection parts 99, 89 of the p-side finger electrode 93 and the n-side finger electrode 81, respectively. In absence of the p-side finger electrode 93, a number of electrical connecting parts 94 should be formed and connected directly to the light transmitting conductive film 60 that is prepared on nearly the entire face of the p-type semiconductor layer 50. Likewise, in absence of the n-side finger electrode 81, a number of electrical connecting parts 82 should be formed and connected directly to the n-side contact area 31. However, these do not necessarily make it easier to form a satisfactory electrical contact between the p-side electrode 92 and the light transmitting conductive film 60, and between the n-side electrode 80 and the n-type semiconductor layer 30, and many problems also occur during the manufacturing process. Meanwhile, according to the present disclosure, prior to the formation of the non-conductive reflective film 91, the n-side finger electrode 81 is formed on the n-side contact area 31, and the p-side finger electrode 93 is formed either on the p-type semiconductor layer 50 or preferentially on the light transmitting conductive film 60, and these electrodes are then subjected to heat treatment, thereby establishing a stable electrical contact between both sides.

Once the electrical contact portions 94, 82 are formed, it is desirable to form the p-side electrode 92 and the n-side electrode 80. Considering that the p-side electrode 92 and the n-side electrode 80 contribute to reflecting light from the active layer 40 towards the substrate 10, those electrodes are formed over a broad area to be able to cover the entire or nearly the entire upper part of the non-conductive reflective film 91, thereby serving as a conductive reflective film. However, the p-side electrode 92 and the n-side electrode 80 are preferentially formed at a distance from each other on the non-conductive reflective film 91. As such, there exists a part on the non-conductive reflective film 91, which is covered neither by the p-side electrode 92 nor by the n-side electrode 80. While the p-side electrode 92 or the n-side electrode 80 may suitably be made of a material having a good reflectance (e.g., Al, Ag or the like), it is preferential to combine the high-reflectance material (e.g., Al, Ag or the like) with Cr, Ti, Ni, Au or any alloy thereof for obtaining a stable electrical contact. The p-side electrode 92 and the n-side electrode 80 serve to supply current to the p-side finger electrode 93 and the n-side finger electrode 82; to connect the semiconductor light emitting device with external equipment; and to reflect the light from the active layer 40 and/or dissipate the heat, by occupying a broad area. Therefore, forming both the p-side electrode 92 and the n-side electrode 81 on the non-conductive reflective film 91 makes it possible to minimize the height difference between the p-side electrode 92 and the n-side electrode 80, and is advantageous when the semiconductor light emitting device according to the present disclosure is bonded to a mount (e.g., a sub-mount, a package or a COB). This advantage becomes more apparent especially when the eutectic bonding method is applied.

As the p-side electrode 92 and the n-side electrode 80 formed occupy a greater portion on the non-conductive reflective film 91, both the p-side finger electrode 93 and the n-side finger electrode 81 are placed below the non-conductive reflective film 91. Here, the p-side finger electrode 93 is long stretched down by passing through the bottom of the n-side electrode 80 placed directly on the non-conductive reflective film 91, and the n-side finger electrode 81 is long stretched down by passing through the bottom of the p-side electrode 92 placed directly on the non-conductive reflective film 91. The non-conductive reflective film 91 present between the p-side electrode 92 and the n-side electrode 80, and between the p-side finger electrode 93 and the n-side finger electrode 81 prevents a short between the electrodes 92, 80 and between the finger electrodes 93, 81. Further, by introducing the p-side finger electrode 93 and the n-side finger electrode 81 as described above into the formation of a flip-chip, it becomes possible to supply current to the semiconductor layer areas of interest, without restriction.

In general, the p-side electrode 92, the n-side electrode 80, the p-side finger electrode 93 and the n-side finger electrode 81 are made of multiple metal layers. In case of the p-side finger electrode 93, the bottom layer thereof should have a high coupling force towards the light transmitting conductive film 60. To this end, a material such as Cr or Ti is typically used, but other materials such as Ni, Ti or TiW can also be used as there are no particular limitations regarding this matter. A person skilled in the art should understand that Al or Ag having a high reflectance can also be employed for the p-side finger electrode 93 and the n-side finger electrode 81. In case of the p-side electrode 92 and the n-side electrode 80, Au is used for their top layers for wire bonding or for the connection with an external electrode. Meanwhile, in order to reduce the amount of Au used and to offset a relatively low hardness of Au, other material such as Ni, Ti, TiW or W can be employed between the bottom layer and the top layer, depending on the specifications required. Also, when a high reflectance is required, Al or Ag can be employed. In this disclosure, Au could be considered for use as the top layer since the p-side finger electrode 93 and the n-side finger electrode 81 need to be electrically connected to the electrical connecting parts 94, 82. However, the inventors found out that it is not appropriate to use Au as the top layer for the p-side finger electrode 93 and the n-side finger electrode 81, because the Au gets easily peeled off due to a weak coupling force between the Au and the non-conductive reflective film 91 at the time of deposition of the non-conductive reflective film 91 onto the Au top layer. To resolve this problem, other material such as Ni, Ti, W, TiW, Cr, Pd or Mo was adopted in place of Au to form the top layer of the finger electrodes. In this way, the bonding strength towards the top layer with the non-conductive reflective film 91 to be deposited on the top layer is retained and the reliability can thus be improved. Further, one of those metals mentioned above is fully capable of functioning as a diffusion barrier while forming an opening in the non-conductive reflective film 91, for the electrical connecting part 94, which can be helpful for ensuring the security of the subsequent processes and the electrical connects 94, 82.

Figure 17:
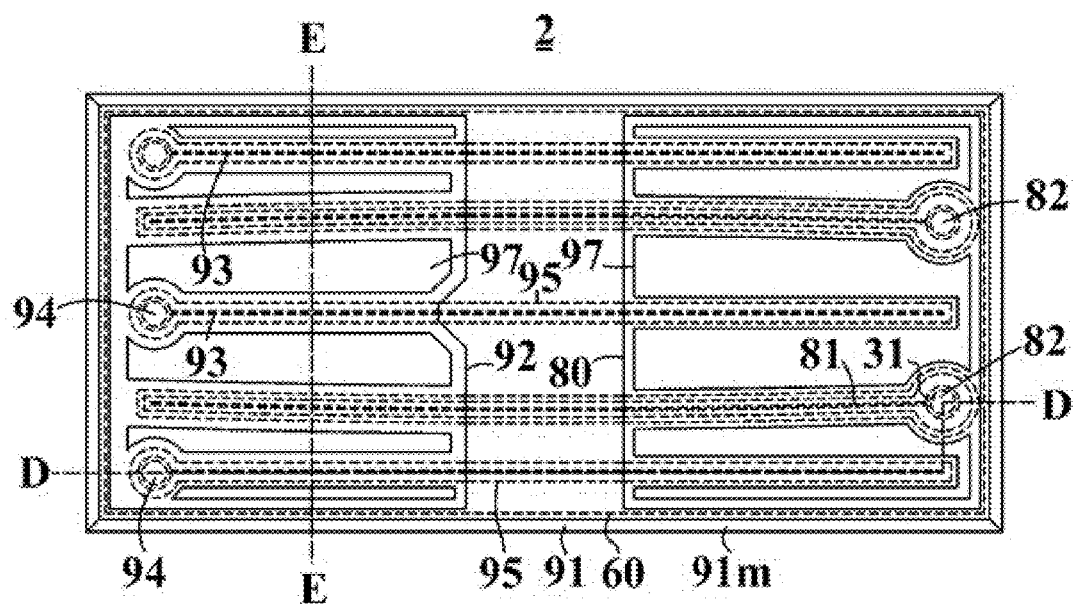
FIG. 17 is a schematic view illustrating a still further exemplary embodiment of a semiconductor light emitting device according to the present disclosure.
Figure 18:
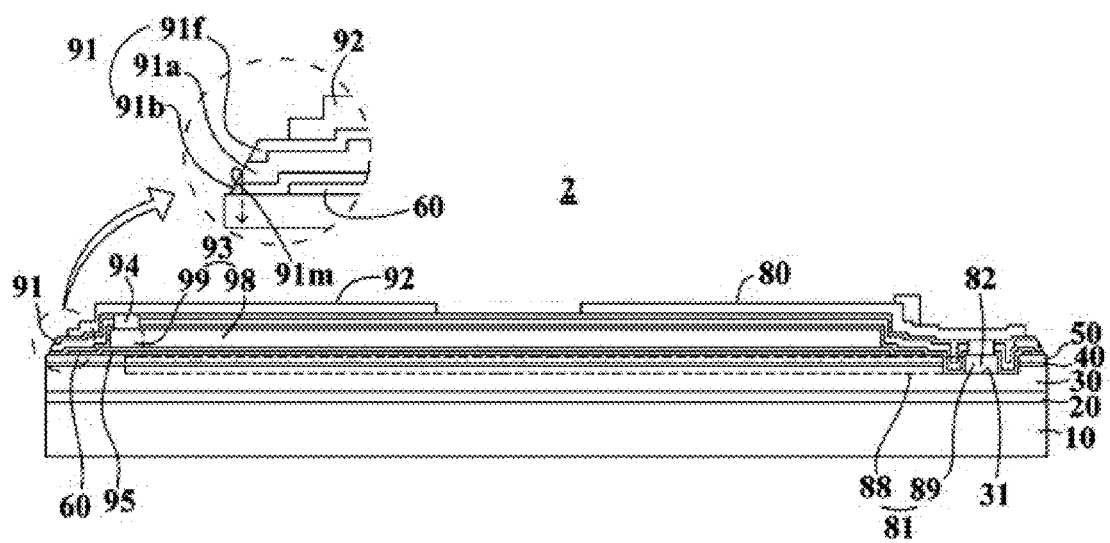
FIG. 18 is a cross-sectional view taken along line D-D in FIG. 17.
Figure 19:
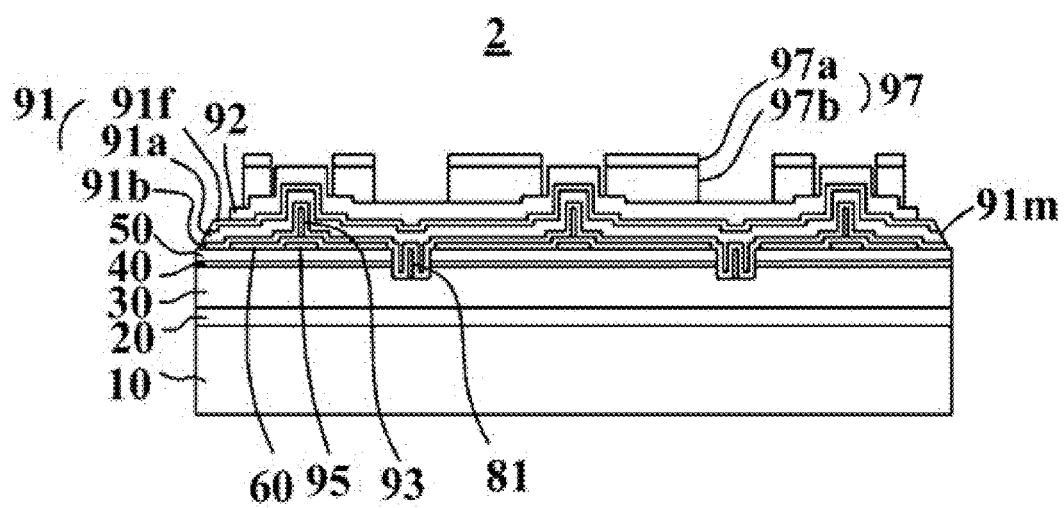
FIG. 19 is a cross-sectional view taken along line E-E in FIG. 17.

FIG. 17 is a view illustrating another exemplary embodiment of the semiconductor light emitting device according to the present disclosure, FIG. 18 is a cutaway portion taken along line D-D of FIG. 17, and FIG. 19 is a cutaway portion taken along line E-E of FIG. 17.

As can be seen in FIG. 18 and FIG. 19, in a semiconductor light emitting device 2 according to the present disclosure, a non-conductive reflective film 91 further includes, in addition to a dielectric film 91b and a DBR 91a, a clad film 91f to be formed on the DBR 91a. Although a large portion of light generated in the active layer 40 is reflected by the dielectric film 91b and the DBR 91a towards an n-side semiconductor layer 30, part of the light is trapped inside the dielectric film 91b and the DBR 91a as they also have a certain thickness, or emitted through the lateral faces of the dielectric film 91b and the DBR 91b. The inventors tried to analyze the relationships among the dielectric film 91b, the DBR 91a and the clad film 91f, from the perspective of an optical waveguide. The optical waveguide is a structure that encompasses the propagation part of light by a material having a lower refractive index than the refractive index of the light propagation part and guides the light utilizing total internal reflection. In this regard, if the DBR 91a is taken as the propagation part, the dielectric film 91b and the clad film 91f can be considered as part of the structure that encompasses the propagation part. When the DBR 91a is made of $SiO_2/TiO_2$, with $SiO_2$ having a refractive index of 1.46 and $TiO_2$ having a refractive index of 2.4, an effective refractive index (which means an equivalent refractive index of light that can travel in a waveguide that is made of materials having different refractive indices, and has a value between 1.46 and 2.4) of the DBR 91a is higher than the refractive index of the dielectric film 91b made of $SiO_2$. The clad film 91f is also made of a material having a lower effective refractive index than the refractive index of the DBR 91a. Preferentially, the clad film 91f has a thickness which desirably ranges from λ/4n to 3.0 μm, in which λ denotes a wavelength of the light generated in the active layer 40, and n denotes a refractive index of a material constituting the clad film 91f. By way of example, the clad film 91f can be formed of $SiO_2$, a dielectric having a refractive index of 1.46. When λ is 450 nm (4500 Å), the clad film 91f can be formed in a thickness of 771 Å (4500/4×1.46=771 Å) or more. Considering that the top layer of the DBR 91a made of multiple pairs of $SiO_2/TiO_2$ can be made of a $SiO_2$ layer having a thickness of λ/4n, it is desirable that the clad film 91f is thicker than λ/4n to be distinguished from the top layer of the DBR 91a that is placed below the clad film 91f. Although it is not desirable for the top layer of the DBR 91a to be too thick (e.g., 3 μm or more), imposing a burden on the subsequent perforation process and only increasing the material cost without contributing to the improvement of the efficiency, it is not impossible, depending on the case, to make the top layer as thick as 3.0 μm or more. When the DBR 91*a* comes into direct contact with the p-side electrode 92 and the n-side electrode 80, part of the light travelling through the DBR 91*a* might be affected by the p-side electrode 92 and the n-side electrode 80 and then absorbed. However, inserting the clad film 91*f* having a lower refractive index than the refractive index of the DBR 91*a* between the p- and n-side electrodes (92, 80) and the DBR 91*a* can minimize the partial absorption of the light traveling through the DBR 91*a* by the p-side electrode 92 and the n-side electrode 80, thereby increasing the efficiency of light absorption. Accordingly, the clad film 91*f* should generally have at least a thickness corresponding to the wavelength of light to achieve the effect described above, and therefore it preferentially has a thickness of at least λ/4n. Meanwhile, if there is a big difference between the refractive index of the DBR 91*a* and the refractive index of the clad film 91*f*, the DBR 91*a* may restrict light more strongly such that a thinner clad film 91*f* could be used to avoid that. However, if the difference between the refractive indices is small, the clad film 91*f* is needed to be sufficiently thick to obtain the effect described above. Thus, the thickness of the clad film 91*f* is determined with full consideration of a difference between the refractive index of a material constituting the clad film 91*f* and the effective refractive index of the DBR 91a. For instance, suppose that the clad film 91*f* is made of $SiO_2$, and the DBR 91*a* is made of $SiO_2/TiO_2$. Then a suitable thickness for the clad film 91*f* will be at least 0.3 μm to be distinguished from the top layer of the DBR 91*a* made of $SiO_2$. On the other hand, the upper limit of the thickness of the clad film 91*f* is preferentially between 1 μm and 3 μm, not to impose any burden on the subsequent perforation process.

The clad film 91*f* is not particularly limited as long as its refractive index is lower than the effective refractive index of the DBR 91*a*, and can also be made of a metal oxide such as $Al_2O_3$, a dielectric film such as $SiO_2$ or SiON, or other material such as MaF or CaF. If a difference in the refractive indices is small, the clad film should be made thicker to obtain the desired effect. Also, in case of using $SiO_2$ for the clad film, it is desirable to use $SiO_2$ having a refractive index lower than 1.46 to be able to increase the efficiency.

Optionally, the dielectric film 91*b* may be omitted. Also, although not desirable from the perspective of an optical waveguide, there is no reason to exclude the configuration composed of the DBR 91*a* and the clad film 91*f*, when the overall technical idea of this disclosure is taken into consideration. Alternatively, a $TiO_2$ dielectric film may be used in place of the DBR 91*a*. Further, as an alternative, the clad film 91*f* may be omitted if the DBR 91*a* includes a $SiO_2$ layer on the top thereof.

The non-conductive reflective film 91, which is composed of the DBR 91*a* having a high effective reflectance, and the dielectric film 91*b* and the clad film 91*f*, each having a low reflectance, disposed on the top and bottom of the DBR 91*a*, respectively, serves as an optical waveguide, and preferentially has a combined thickness of 3 to 8 μm. Also, the non-conductive reflective film 91 preferentially has a slant face 91*m* at the corner. This slant face 91*m* can be formed, for example, by a dry etching process. Among light rays incident on the non-conductive reflective film 91 that serves as an optical waveguide, the light rays that are incident on the non-conductive reflective film 91 at right angles or almost at right angles are well reflected towards the substrate 10, while some light rays including those that are incident on the non-conductive reflective film 91 at an oblique angle are not reflected towards the substrate 10, but can be trapped inside the DBR 91*a* that serves as a propagation part and then propagated to the lateral face. As such, the light rays propagated to the lateral surface of the DBR 91*a* are either emitted to the outside from the slant face 91*m* at the corner of the non-conductive reflective film 91, or reflected towards the substrate 10. That is to say, the slant face 91*m* at the corner of the non-conductive reflective film 91 serves as a corner reflector, and contributes to the improved luminance of the semiconductor light emitting device. The slant face 91*m* is suitably at an angle ranging from 50 to 70 degrees, to facilitate the light reflection towards the substrate 10. The slant face 91*m* can easily be formed by wet etching, dry etching, or both.

Figure 20:
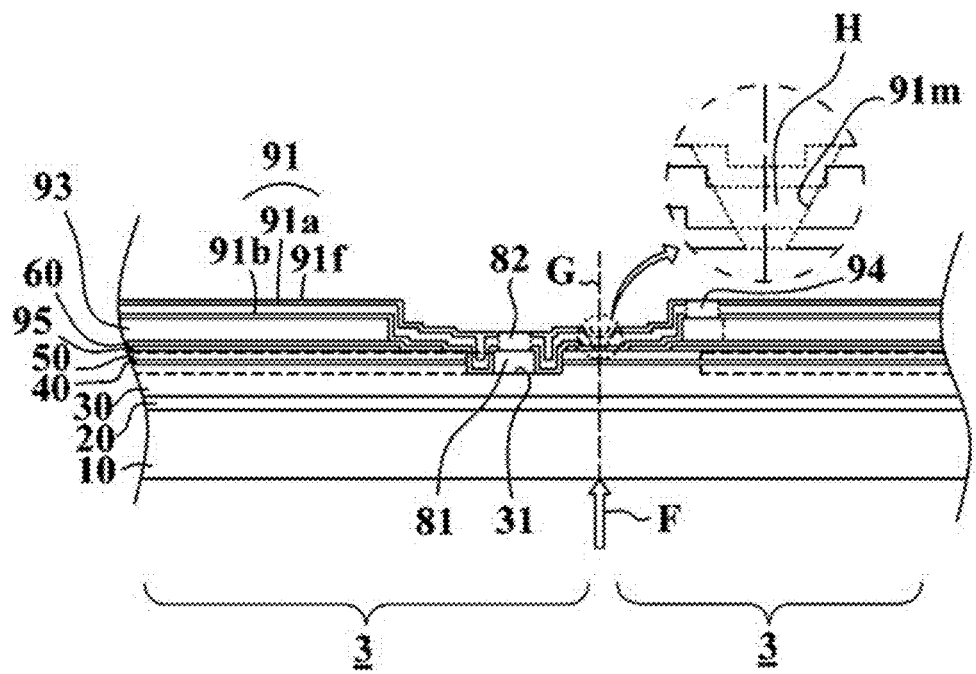
FIG. 20 is a schematic view illustrating a state of two semiconductor light emitting devices before they are split into independent semiconductor light emitting devices during the manufacture of a semiconductor light emitting device.
Figure 21:
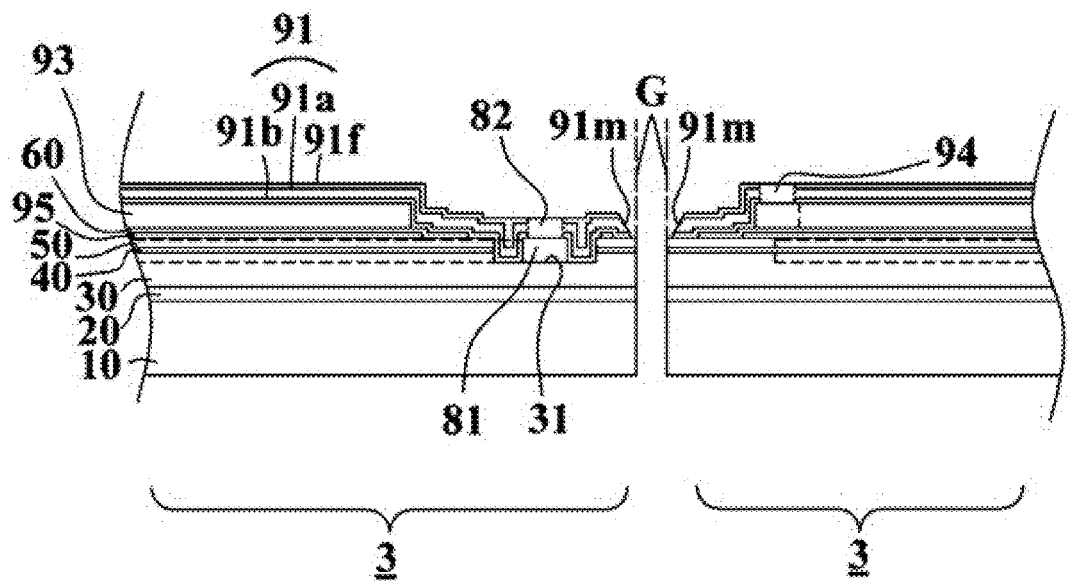
FIG. 21 is a schematic view illustrating a state of two semiconductor light emitting devices after they are split into independent semiconductor light emitting devices during the manufacture of a semiconductor light emitting device.

FIG. 20 is a view illustrating a state of two semiconductor light emitting devices before they are split into separate semiconductor light emitting devices, during the manufacture of a semiconductor light emitting device; and FIG. 21 is a view illustrating a state of two semiconductor light emitting devices after they are split into separate semiconductor light emitting devices, during the manufacture of a semiconductor light emitting device. For one's information, those semiconductor light emitting devices 3, shown in FIG. 20 and FIG. 21 for explaining the fabrication process, are in a state where none of the p-side electrode 92, n-side electrode 80 and bonding pad 97 is formed.

Usually a semiconductor light emitting device is first prepared in a wafer form including a multitude of semiconductor light emitting devices, and then split into separate semiconductor light emitting devices by cutting, such as breaking, sawing, or scribing-and-breaking. In the scribing-and-breaking operation, the scribing process employs a laser and can be performed by focusing the laser onto the substrate of the semiconductor light emitting device, in which the substrate has a surface and an interior. In this scribing process employing the laser, the semiconductor light emitting device 3 is preliminarily cut along the boundary G of the rim of the semiconductor light device 3, i.e., along the boundary G between the semiconductor light emitting device 3 and another neighboring semiconductor light emitting device 3. These preliminarily cut semiconductor light emitting device is completely split into separate semiconductor light emitting devices through the breaking process that is performed following the scribing process. The breaking process is performed by applying an external force along the boundary G between the semiconductor light emitting device 3 and another neighboring semiconductor light emitting device 3, for example, in the direction of the substrate 10 indicated by an arrow F in FIG. 20, or in the opposite direction thereof. In this breaking process, the substrate 10 and the semiconductor layers 20, 30, 40, 50, which are crystalline, can be cut precisely along the boundary G; while the non-conductive reflective film 91 on the p-type semiconductor layer 50, which is amorphous, cannot be cut precisely along the boundary G, and cracks are likely to occur in the areas around the rim of the non-conductive reflective film 91, causing a damage thereto. The damage to the areas around the rim of the non-conductive reflective film 91 leads to poor yields due to those appearance defects. Preferentially, during the manufacture of a semiconductor light emitting device, a plurality of semiconductor light emitting devices is prepared in a wafer form, and then a certain area H of the non-conductive reflective film 91 around the boundary G between a semiconductor light emitting device and another neighboring semiconductor light emitting device is eliminated, prior to the scribing and braking processes using a laser for splitting the semiconductor light emitting device of interest into separate ones. The certain area H of the non-conductive reflective film 91 to be eliminated along the boundary G of the semiconductor light emitting device 3 corresponds to a rim area of the non-conductive reflective film 91, if taken from the viewpoint of the semiconductor light emitting device. The elimination of a certain area H of the non-conductive reflective film 91 around the boundary G can also indicate that the non-conductive reflective film 91 present in one semiconductor light emitting device, and the non-conductive reflective film 91 of another neighboring semiconductor light emitting device are spaced apart from each other, before the semiconductor light emitting device is split into individual ones. With a portion of the area of the rim of the non-conductive reflective film 91 being eliminated, even if the subsequent scribing and breaking processes may be performed using a laser, the appearance defect caused by the damaged rim of the non-conductive reflective film 91 of each semiconductor light emitting device can be avoided, thereby increasing yields. The elimination of a certain area H of the non-conductive reflective film 91 can be carried out by dry etching, and it should be performed prior to the breaking process in the overall semiconductor fabrication process. However, while forming an opening that passes through the non-conductive reflective film 91 to obtain electrical connecting parts 94, 82, it is preferential to form those electrical contacts together with the openings. Although the slant face 91m serving as a corner reflector can be obtained by a separate etching process, those slant faces can be formed simultaneously in a process of eliminating the rim area of the non-conductive reflective film 91 to avoid damage, by etching the rim part of the non-conductive reflective film 91 of an individual semiconductor light emitting device into a slant face 91m.

As can be seen in FIG. 17 and FIG. 19, a bonding pad 97 can be present on the p-side electrode 92 and on the n-side electrode 80, as a part of each of the p-side electrode 92 and the n-side electrode 80. The top face of the bonding pad 97 on the p-side electrode 92 has the same height as the top face of the bonding pad 97 on the n-side electrode 80. That is to say, the top face of the bonding pad 97 on the p-side electrode 92 and the top face of the bonding pad on the n-side electrode 80 are on the same plane. When a semiconductor light emitting device is coupled with external equipment by, for example, the eutectic bonding method, those bonding pads 97 allow the p-side electrode 92 and the n-side electrode 80 to have an equal final height to thus prevent any tilting on the mount, provide a broad, flat coupling face to obtain excellent coupling force, and dissipates the heat from the inside of the semiconductor light emitting device to the outside. A plurality of bonding pads 97 can be present on the p-side electrode 92 and on the n-side electrode 80, respectively, provided that the bonding pads 97 are preferentially formed on the positions where the n-side finger electrode 81 and the p-side finger electrode 93 are not overlapped, i.e., in-between the n-side finger electrode 81 and the p-side finger electrode 93. In other words, the bonding pads 97 are formed on the areas, except on a part of the p-side finger electrode 93 corresponding to the most protruded portion and a part of the n-side finger electrode 81 corresponding to the lower most recessed portion. In addition, the bonding pad 97 can have a dual layer structure including an underlying spacer layer 97a and a bonding layer 97b overlying the spacer layer 97a, and has a combined thickness of 5 to 6 µm, for example. In one example, the spacer layer 97a may be made of a metal layer including Ni, Cu and a combination thereof, and the bonding layer 97b may be composed of a eutectic bonding layer including a Ni/Sn, Ag/Sn/Cu, Ag/Sn, Cu/Sn or Au/Sn combination such that it has a thickness of about several µm. The spacer layer 97a can serve as a diffusion barrier as well as wetting layer for a solder used in the eutectic bonding, and reduces the cost burden as compared with a case where the bonding pad 97 is entirely formed of a eutectic bonding layer 97b containing expensive Au. To match the final height of the bonding layer during bonding (e.g., eutectic bonding), the bonding pad 97 is preferentially formed to be taller than the most protruded part of the p- and n-side electrodes 92, 80, namely, the height of the upper part of the p-side finger electrode, by 1 to 3 µm. Accordingly, during the bonding operation, excellent bonding results are obtained between the semiconductor light emitting device and the mount, and heat dissipation of the semiconductor light emitting device is facilitated. Here, the spacer layer 97a and the bonding layer 97b can be formed by various methods, such as plating, E-beam evaporation, thermal evaporation or the like.

Referring back to FIG. 14 and FIG. 15, all areas of the n-type semiconductor layer 30, except the n-side contact area 31, is preferentially covered with the active layer 40 and the p-type semiconductor layer 50. That is to say, for the semiconductor light emitting device 100, the target etching area is limited to the n-side contact area 31, and there is no other area including the edges that are to be etched. Those lateral faces around the semiconductor light emitting device 100 are all cut faces obtained by the scribing-and-braking process or the like. As such, the area of the active layer 40 generating light increases and the light extraction efficiency is thus improved. Moreover, a minimal number step faces are produced from the etching process; namely, those step faces are limited to the exposed surface of the active layer 40 that connects the top face of the p-type semiconductor layer 50 with the top face of the n-side contact area 31, and the exposed surface of the p-type semiconductor layer 50. These exposed lateral faces of the active layer 40 and the p-type semiconductor layer 50 are the ones that are difficult, in particular, to deposit the DBR 91a constituting the non-conductive reflective film 91 in the formation of the non-conductive reflective film 91. Consequently, the DBR 91a on the exposed lateral faces of the active layer 40 and the p-type semiconductor layer 50 may have a relatively lower reflection efficiency. By minimizing the exposed lateral faces of the active layer 40 and the p-type semiconductor layer 50, it is possible to reduce areas having a low reflection efficiency in the DBR 91a to a minimum, thereby increasing the overall reflection efficiency.

Figure 22:
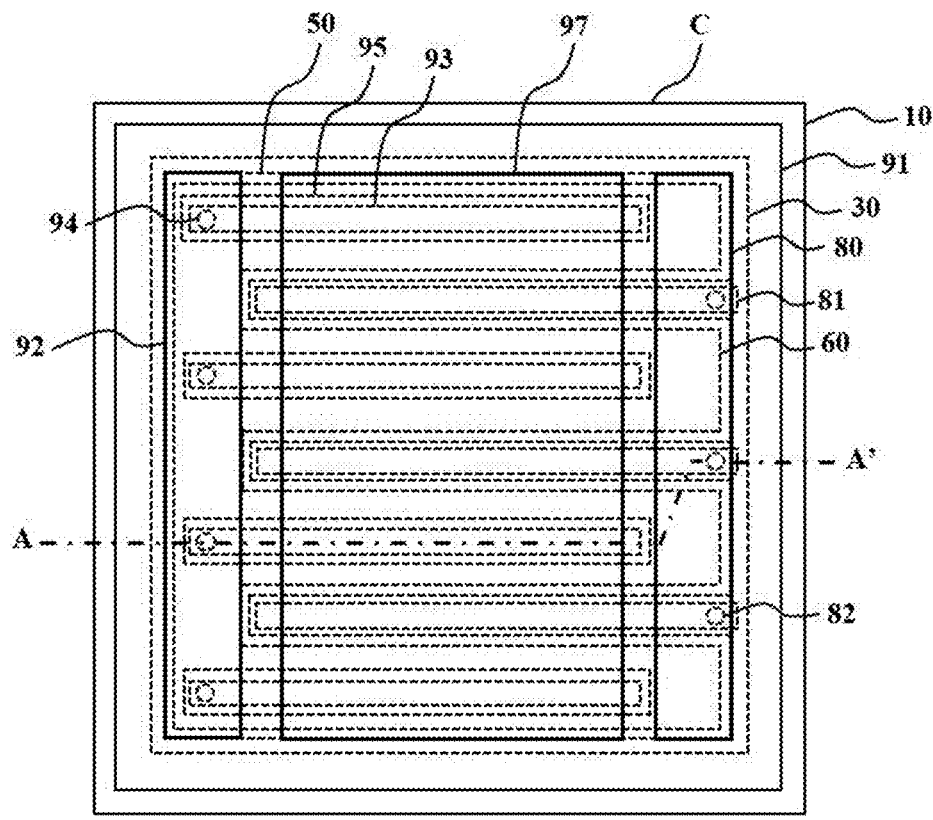
FIG. 22 is a schematic view illustrating a still further exemplary embodiment of a semiconductor light emitting device according to the present disclosure.
Figure 23:
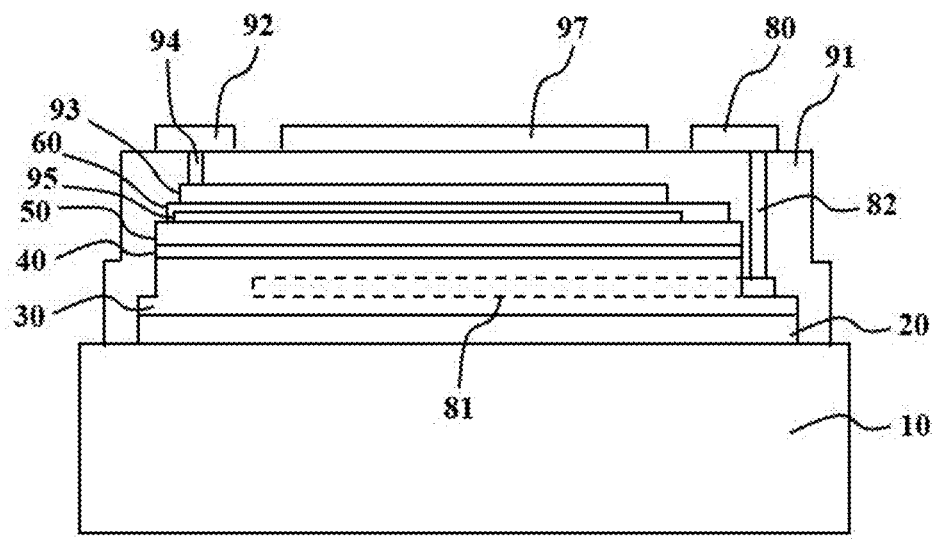
FIG. 23 is a cross-sectional view taken along line A-A' in FIG. 22.

FIG. 22 is a schematic view illustrating a still further exemplary embodiment of a semiconductor light emitting device according to the present disclosure, and FIG. 23 is a cross-sectional view taken along line A-A' in FIG. 22. The first feature of this embodiment is that the finger electrodes 93 above the p-type semiconductor layer 50 are isolated from each other, and connected to each other by an electrode 92 after going through the respective electrical connecting parts 94. Here, the electrode 92 serves to supply current to the finger electrodes 93, to reflect light, to emit heat and/or to connect the device to the outside. Although it would be most desirable if the finger electrodes 93 are all isolated from one another, two or more finger electrodes 93 could be paired up and a branch portion that interconnects the finger electrodes 93 may be removed such that the overall height on top of the device is less irregular. The second feature of this embodiment is that the finger electrodes 93 are stretched along the direction of one lateral face C of the device. For example, in FIG. 22, the finger electrode 93 is extended from the electrode 92 towards the electrode 80. With these stretched finger electrodes 93, the device can be placed on a mount (e.g., a sub-mount, a package, or a COB (Chip on Board)) in an upside-down position without leaning. In this regard, it is preferential to form the finger electrodes 93 as long as possible. According to this embodiment, the finger electrodes 93 are arrayed below a non-conductive reflective film 91, they may be stretched passing the electrode 80. The third feature of this embodiment is that the electrode 80 overlies the non-conductive reflective film 91. The electrode 80 is connected with finger electrodes 81 through an electrical connecting part 82. The electrode 80 has the same functions as the electrode 92. With this configuration, the region where the electrode 80 is located is raised up as compared with the embodiment of FIG. 3, and thus the height difference between the electrode 92 and the electrode 80 is reduced when the device was coupled with the mount, resulting in more favorable coupling. This effect is magnified when eutectic bonding is used. The fourth feature of this embodiment is that the finger electrodes 81 can be arranged in the same manner as the finger electrodes 93. The fifth feature of this embodiment is that an auxiliary heat-emission pad 97 is provided. The auxiliary heat-emission pad 97 serves to discharge heat from the inside of the device to the outside and/or to reflect light. Moreover, the auxiliary heat-emission pad 97 is electrically isolated from the electrode 92 and/or the electrode 80, and thus it prevents an electrical contact between the electrode 92 and the electrode 80. The auxiliary heat-emission pad 93 might as well be used for bonding. In particular, when the auxiliary heat-emission pad 93 is electrically isolated from both the electrode 92 and the electrode 80, even if one of the electrode 92 and the electrode 80 might accidently have an electrical contact with the auxiliary heat-emission pad 93, this would not cause any problem to the overall electrical operation of the device. A person skilled in the art should understand that it is not mandatory for this embodiment to have all five features described above.

Figure 24:
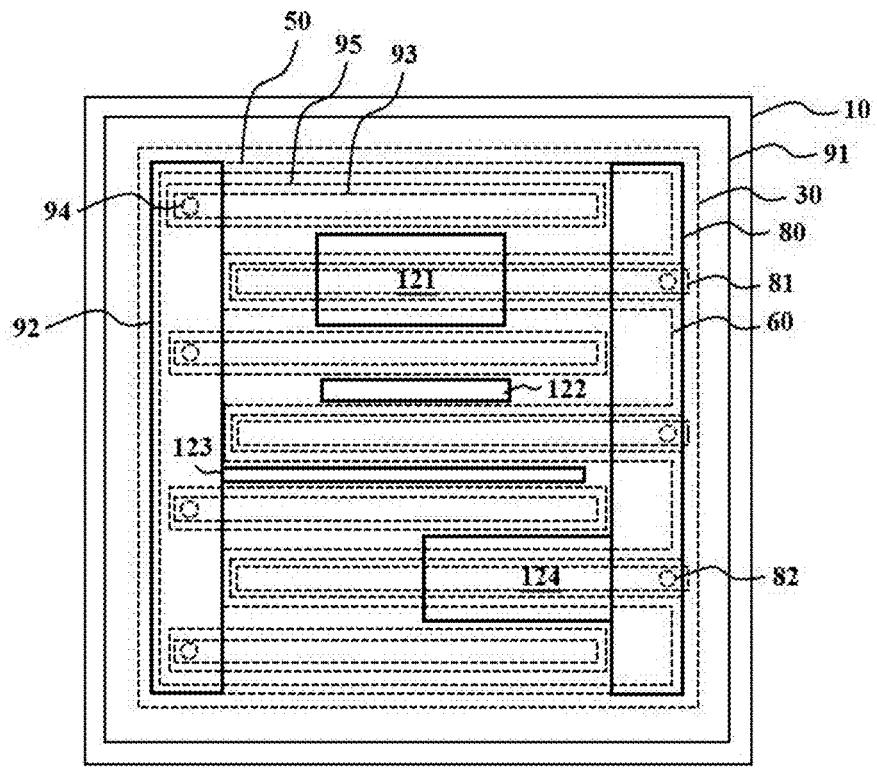
FIG. 24 is a schematic view illustrating a still further exemplary embodiment of a semiconductor light emitting device according to the present disclosure.

FIG. 24 is a schematic view illustrating a still further exemplary embodiment of a semiconductor light emitting device according to the present disclosure, in which different examples of an auxiliary heat-emission pad 121, 122, 123, 124 are arranged between the electrode 92 and the electrode 80. Preferentially, the auxiliary heat-emission pads 121, 122, 123, 124 are arranged between the finger electrodes 92, or between the finger electrode 92 and the finger electrode 81. As the auxiliary heat-emission pads 121, 122, 123, 124 are not formed on the finger electrode 92, the front face of the device may well be bonded to the mount during bonding (e.g. eutectic bonding), thereby facilitating heat emission from the device. The auxiliary heat-emission pad 121 and the auxiliary heat-emission pad 122 are isolated from the electrode 92 and the electrode 80; the auxiliary heat-emission pad 123 is connected with the electrode 92, and the auxiliary heat-emission pad 124 is connected with the electrode 80.

Figure 25:
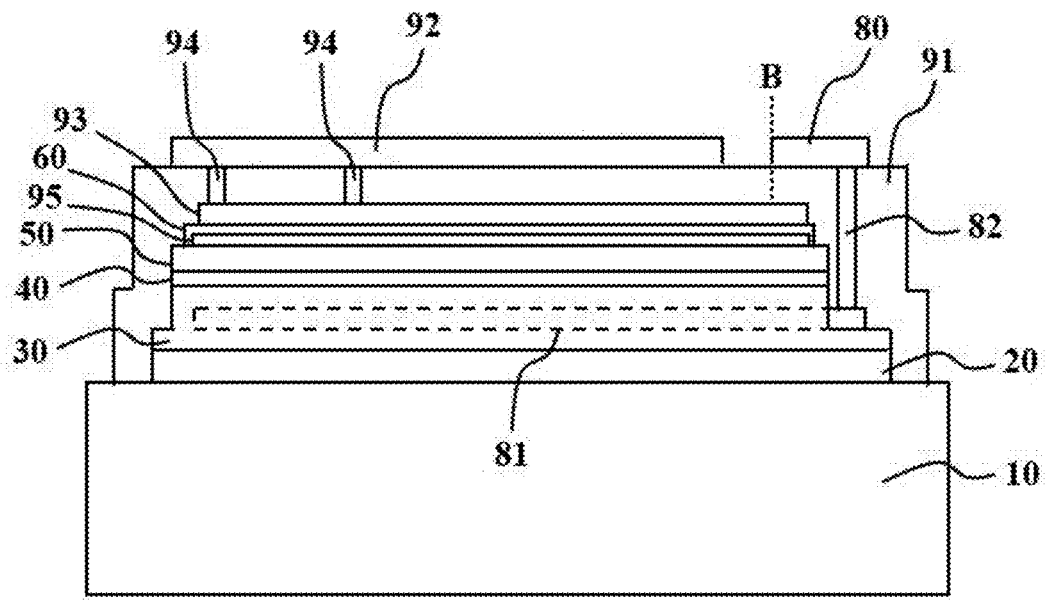
FIG. 25 is a schematic view illustrating a still further exemplary embodiment of a semiconductor light emitting device according to the present disclosure.

FIG. 25 is a schematic view illustrating a still further exemplary embodiment of a semiconductor light emitting device according to the present disclosure, in which the finger electrode 93 is stretched out until it reaches a level below the electrode 80 (passing the reference line B). In the production of a flip chip, introducing the finger electrode 93 onto a p-type semiconductor layer 50 makes it possible to supply current to a desired device region without restriction. Two electrical connecting parts 94, 94 are provided, and they can be put at any necessary place according to requirements for current spreading. The electrical connecting part on the left hand side may be omitted. The electrode 92 doubles as an auxiliary heat-emission pad 97 (see FIG. 22). Even when the finger electrode 93 is not available, it is still possible to supply current to a light transmitting conductive film 60 by directly connecting the electrical connecting part 94 directly to the light transmitting conductive film 60, but it is not possible to supply current directly to the p-type semiconductor layer 50 below the electrode 80. By introducing the finger electrode 93, however, it becomes possible to supply current to those below the electrode 80 which supplies current to the n-type semiconductor layer 30. The same applies to the case where the electrical connecting part 82 is not available.

Figure 26:
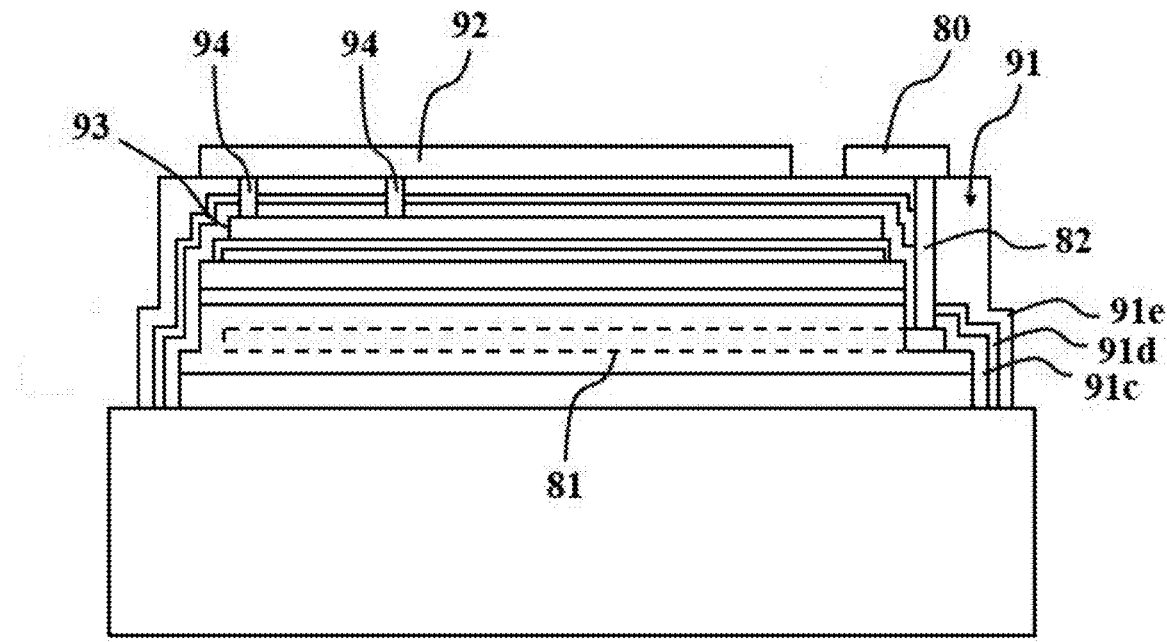
FIG. 26 is a schematic view illustrating a still further exemplary embodiment of a semiconductor light emitting device according to the present disclosure.

FIG. 26 is a schematic view illustrating a still further exemplary embodiment of a semiconductor light emitting device according to the present disclosure, in which a non-conductive reflective film 91 is composed of multilayered dielectric films 91c, 91d and 91e. For example, the non-conductive reflective film 91, which is composed of a $SiO_2$ dielectric film 91c, a $TiO_2$ dielectric film 91d and a $SiO_2$ dielectric film 91e, can serve as a reflective film. Preferentially, the non-conductive reflective film 91 is formed to have a DBR structure. When a semiconductor light emitting device is formed according to the present disclosure, a structure like the finger electrode 93 or the finger electrode 81 is needed, and a process for forming an electrical connecting part 94 or an electrical connecting part 82 should be carried out even after the non-conductive reflective film 91 had been formed. Now that the semiconductor light emitting device as a finished product can still experience current leakage and suffer from degraded reliability affected by the $SiO_2$ dielectric film 91c, one should be very careful in forming the $SiO_2$ dielectric film 91c. To this end, first of all, the dielectric film 91c should be made thicker than those subsequent dielectric films 91d and 91e. Secondly, it is necessary to form the dielectric film 91c by a method that is particularly suitable for ensuring the reliability of the device. For instance, CVD, in particular (preferentially) PECVD may be used for obtaining the $SiO_2$ dielectric film 91c, and PVD, in particular (preferentially) E-beam evaporation, sputtering or thermal evaporation may be used for obtaining the dielectric film 91d/dielectric film 91e made of a stack of alternating $TiO_2/SiO_2$ DBR, thereby ensuring the reliability of the resulting semiconductor light emitting device according to the present disclosure and ensuring the dielectric films' function as the non-conductive reflective film 91. This is because CVD is more advantageous than PVD (in particular, E-beam evaporation) for covering steps in a mesa etched region.

Figure 27:
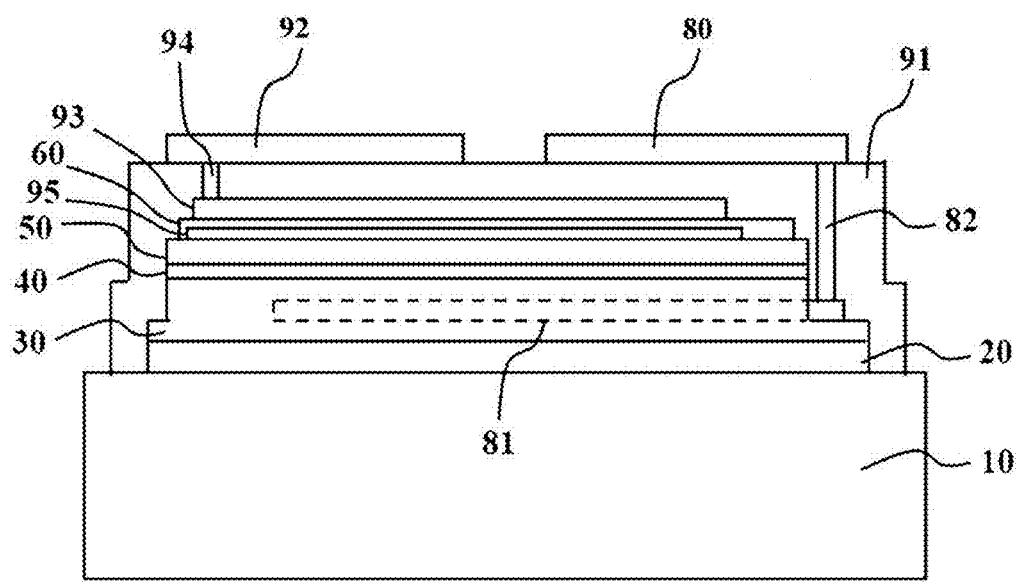
FIG. 27 is a schematic view illustrating a still further exemplary embodiment of a semiconductor light emitting device according to the present disclosure.

FIG. 27 is a schematic view illustrating a still further exemplary embodiment of a semiconductor light emitting device according to the present disclosure. In particular, it shows one example of an electrode part including a lower electrode, an upper electrode and an electrical connecting part for connecting the electrodes via an opening. At least one of an n-side electrode 80 (one example of the upper electrode in a first electrode part) and a p-side electrode 92 (one example of the upper electrode in a second electrode part), or preferentially both are soldering layers either made of Sn or containing Sn.

Figure 28:
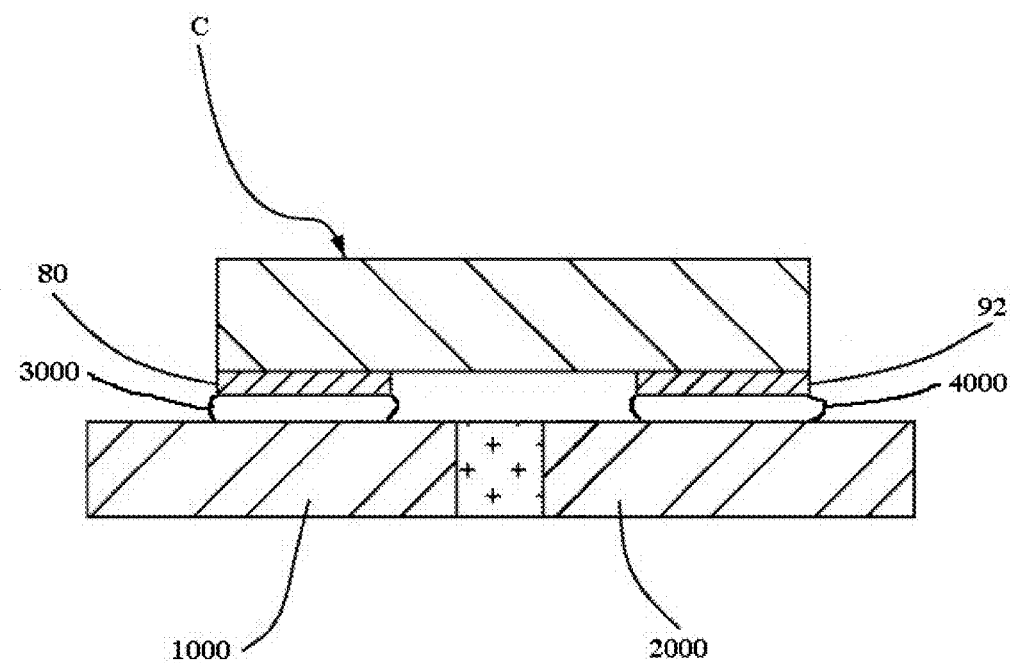
FIG. 28 is a schematic view illustrating an example of a state where the semiconductor light emitting device proposed in FIG. 27 is fixed to an external electrode.

FIG. 28 is a schematic view illustrating an example of a state where the semiconductor light emitting device proposed in FIG. 27 is fixed to an external electrode. Here, an n-side electrode 80 and a p-side electrode 92 of the semiconductor light emitting device or of a chip C of the semiconductor light emitting device shown in FIG. 27 are fixed to external electrodes 1000, 2000, respectively. The external electrode 1000, 2000 may be a conducting part arranged at the sub-mount, a lead frame of the package, or an electrical pattern formed on the PCB, and it can be of any form without particular limitations as long as it is a wire independent of the semiconductor light emitting device C. The external electrodes 1000, 2000 are provided with a solder material 3000, 4000, respectively, and thus the n-side electrode 80 and the p-side electrode 92 are fixed to the external electrodes 1000, 2000 by soldering. As such, in the embodiment proposed in FIG. 28, the n-side and p-side electrodes are fixed to the external electrodes 1000, 2000 by soldering.

Meanwhile, the semiconductor light emitting device can be broken during eutectic bonding. This embodiment is intended to provide a solution for bonding processes in general including eutectic bonding by using a solder (a Sn solder, a Pb solder or the like). However, considering that a semiconductor light emitting device is manufactured using Au for top layers of the n-side and p-side electrodes 80, 90, Au or Ag may optionally be used in consideration of conductivity, with Au being usually chosen over oxidation-sensitive Ag. The inventors surprisingly discovered that when Au is used for a soldering layer of the electrode 80 or 92 of the semiconductor light emitting device to be soldered with a solder material 3000, 4000 provided in the external electrode 1000, 2000, bonding strength during soldering is not uniform. However, this problem was solved by using a Sn-based soldering layer.

Figure 29:
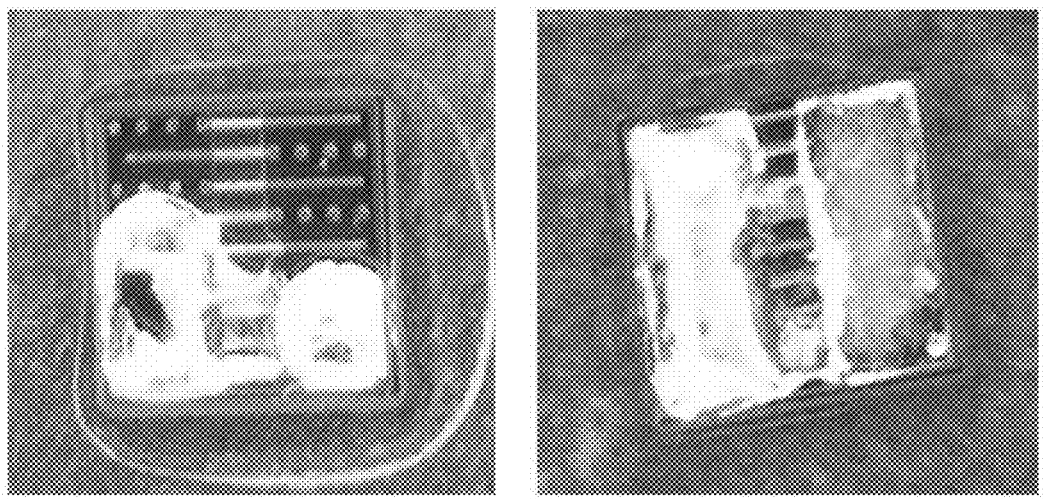
FIG. 29 shows photos of liquid tin spread on gold and tin at their own respective degrees.

FIG. 29 shows photos of liquid tin spread on gold and tin at their own respective degrees, in which the photo on the left hand side shows liquid tin spread on gold, and the photo on the right hand side shows liquid tin spread on tin. As can be seen in both photos, the degree of spread between Sn and Sn is greater than the degree of spread between Sn and Au. For an experiment, the reflow temperature (temperature for melting a solder) was set at 275° C., the reflow time was set at no more than 3 seconds, and an amount of a solder material was ⅓ of the area of a bump (electrode)).

While there is no particular limitation on the thickness of the soldering layers 80a and 92a, it is preferential to have a thickness of at least 5000 Å, more preferentially at least 1 μm, for secure joint with the solder material 3000, 4000. For example, the soldering layers 80a and 92a may have a thickness of 1.8 μm, 2.4 μm.

Figure 36:
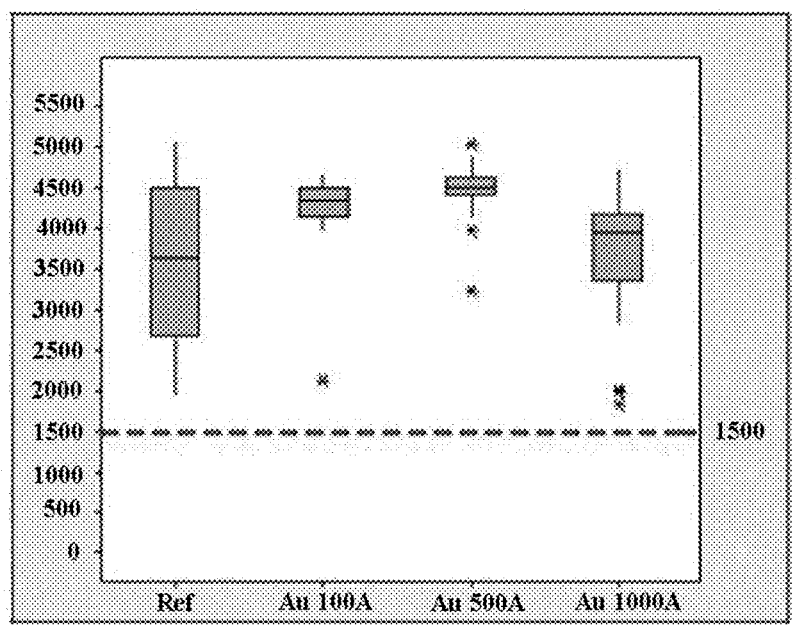
FIG. 36 is a graph showing the change in coupling force as a function of the thickness of an anti-oxidation layer.

FIG. 36 shows the change in bonding strength of soldering. A chip bonded by soldering and then pressed was subjected to a DTS (Die Shear Test) for measuring the bonding strength. In the test, the bonding strength value of an Au soldering layer free of Sn was used as a reference value Ref, and a change in the bonding strength (vertical axis) as a function of thickness of Au (horizontal axis) which is a thin anti-oxidation layer formed on the Sn soldering layer was tested. The bonding strength increased as Au thickness increased from 100 Å to approximately 500 Å, and then it got decreased when the Au thickness became greater than 1000 Å. Therefore, as compared to the case where the soldering layer is made of Au only, the bonding strength of the Sn soldering layer with the overlaid Au as an anti-oxidation layer which is suitably not too thick was greater. In particular, when the thickness of the Au as an anti-oxidation layer is 100 Å, the bonding strength may become slightly lower than the 500 Å thick Au. However, its change is very moderate, and most of the bonding strengths are equal to or greater than the Ref. Again, it is discovered from the data in FIG. 36, as compared to the Ref of the soldering layer made of Au only, the bonding strength of the soldering layer made of Sn only or containing Sn without any anti-oxidation layer is greater. Thus, it is understood that Au is not much favorable material to the bonding strength, even if Au is well compatible with Sn, the main component of the solder in this embodiment.

With the soldering layer made of the same material as the main component of the solder, a larger area can be formed for the solder, as illustrated in FIG. 29, and the resulting increased spreadability allows for an improved bonding strength even when an amount of the solder is reduced. When a reduced amount of the solder is used, the possibility of the fracture occurring in the semiconductor light emitting device due to thermal expansion can be lowered.

When at least one of the n-side electrode 80 and the p-side electrode 92 is provided with the (thick) soldering layer 80a, 92a, a smaller amount of the solder material 3000, 4000 may be used, and the solder material 3000, 4000 may not burst much from between the n-side electrode 80 and the p-side electrode 92, or from the sides of the semiconductor light emitting device during soldering. From these perspectives, it would be preferential to make the soldering layer 80a, 90a thicker, but not too thick up to the point where thermal resistance can be increased. Therefore, a suitable range that is acceptable in the semiconductor process is between 1 and 5 μm. While the soldering layer 80a, 92a may contain Sn as a single ingredient, it may as well contain other additional materials besides Sn as an active ingredient, which are considered to be necessary in consideration of the solder material 3000, 4000. Example of the solder material 3000, 4000 may include Sn, PbSn, PbSnAg, PbInAb, PbAg, SnPbAg, PbIn, CdZn and so on. In terms of a melting point, a solder material having a melting point between 250 and 300° C. may be used.

In FIG. 27, the n-side electrode 80 and the p-side electrode 92 are formed on the non-conductive reflective film 91 in a manner that they cover at least 50% of the area of the non-conductive reflective film 91 in order to increase the soldering efficiency. Needless to say, the n-side electrode 80 and the p-side electrode 92 of this structure may be used as the top layer structure of the electrode including conductive reflective films 901, 902 and 903. Further, the n-side electrode and the p-side electrode 92 having this electrode structure may be applied to the top layer structure for all of the semiconductor light emitting devices illustrated in FIG.1 through FIG. 26. Those parts indicated with the same reference numerals but not mentioned here will not be explained again to avoid redundancy.

Figure 30:
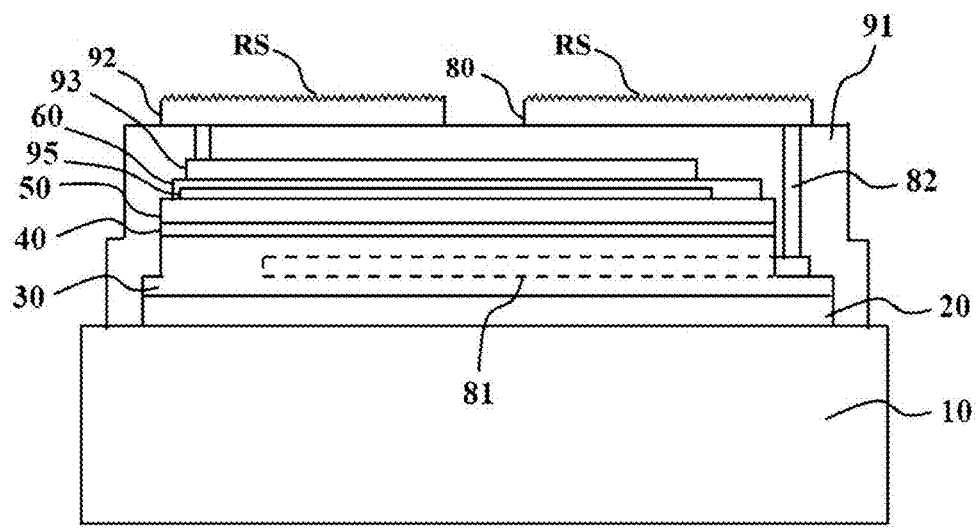
FIG. 30 is a schematic view illustrating a still further exemplary embodiment of a semiconductor light emitting device according to the present disclosure.

FIG. 30 is a schematic view illustrating a still further exemplary embodiment of a semiconductor light emitting device according to the present disclosure, in which soldering layers 80 and 92 have a rough surface RS instead of a flat surface. During soldering, the RS will have an increased contact area with the solder material 3000, 4000 and promote fast energy transfer to the soldering layers 80 and 92. The RS may be obtained during the formation of the soldering layers 80 and 92 without a separate process. In this embodiment, the soldering layers 80 and 92 are formed by E-beam evaporation.

Figure 31:
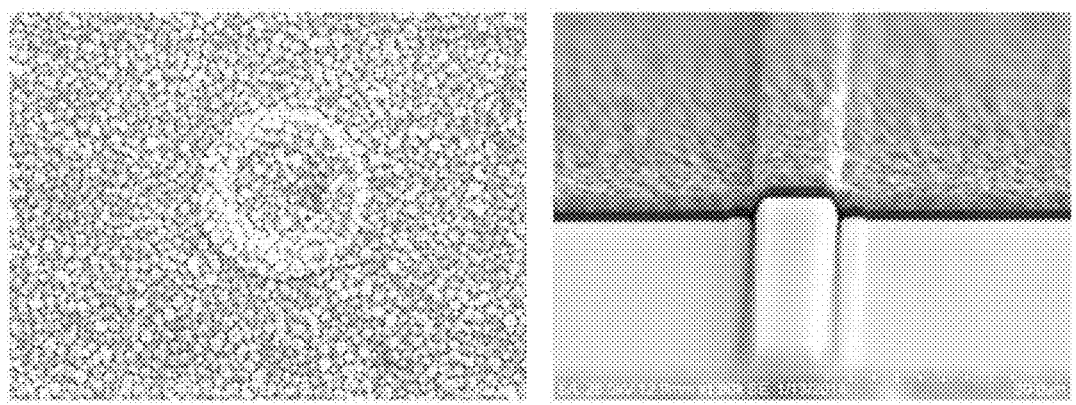
FIG. 31 shows photos of rough surfaces formed on the electrode according to the present disclosure.

FIG. 31 shows photos of rough surfaces formed on the electrode according to the present disclosure, in which the photo on the left hand side was taken from the top, and the photo on the right hand side was taken from the side. These photos show surfaces when the deposition thickness was about 4 μm, and each projection has a size of 15-25 μm. Roughness may be modified by adjusting deposition conditions such as deposition rate (e.g. 10 Å/sec).

Figure 32:
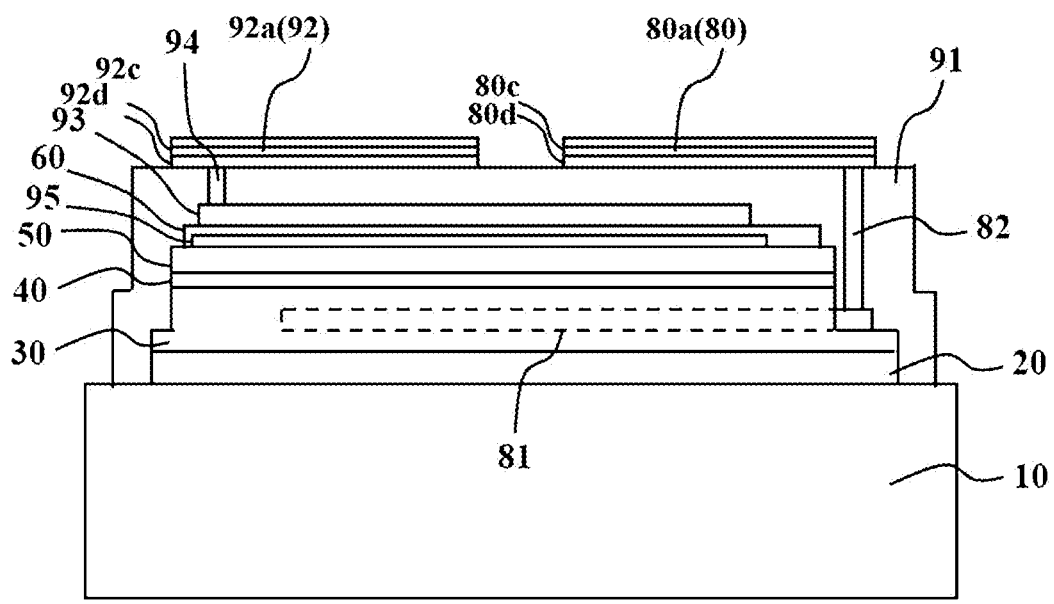
FIG. 32 is a schematic view illustrating a still further exemplary embodiment of a semiconductor light emitting device according to the present disclosure.

FIG. 32 is a schematic view illustrating a still further exemplary embodiment of a semiconductor light emitting device according to the present disclosure, in which at least one of the n-side electrode 80 and the p-side electrode 92 has a diffusion barrier 80c, 92c below a solder layer 80a, 92a in order to prevent a solder material 3000, 4000 from permeating into a plurality of semiconductor layers 30, 40, 50. This diffusion barrier 80c, 92c may be made of Ti, Ni, Cr, W, TiW or the like. If necessary, at least one of the n-side electrode 80 and the p-side electrode 92 may have an additional layer 80d, 92d. On the non-conductive reflective film 91, the n-side electrode 80 and the p-side electrode 92 may be formed simultaneously with electrical connecting parts 82 and 94, and the additional layers 80d and 92d may be formed as light reflection layers such that light generated in the active layer 40 is reflected from the top of the non-conductive reflective film 91 and the electrical connecting parts 82 and 94. Here, the additional layers 80d and 92d may be made of Al, Ag or the like. Moreover, the additional layers 80d and 92d, which are the lowermost layers of the n-side electrode 80 and the p-side electrodes 92, may have a contact layer such as Cr or Ti, so as to have an increased contact force. Alternatively, both the light reflection layer and the contact layer may be provided.

The soldering layers 80a and 92a, the diffusion barriers 80c and 92c and the additional layers 80d and 92d may have the same area in their stacked structure as in FIG. 32, they may also be stacked as shown in the semiconductor light emitting devices in FIG. 19 and FIG. 24. That is, after the diffusion barriers 80c and 92c and the additional layers 80d and 92d are formed all over the surface, the soldering layers 80a and 92a may be partially formed thereon. The diffusion barriers 80c and 92c and/or the additional layers 80d and 92d (in case the additional layers are light reflection layers) may be designed to have a certain minimum thickness such that the non-conductive reflective film 91 and/or the plurality of semiconductor layers 30, 40, 50 are prevented from breaking during soldering. However, some Al and Ag light reflection layers tend to spread out if they are too thick. To be able to protect the non-conductive reflective film 91 and/or the plurality of semiconductor layers 30, 40, 50 from breakage, the light reflection layers and the diffusion barriers 80c, 92c are therefore stacked alternately and repeatedly one on top of the other. For instance, they can be alternately and repeatedly stacked (Al (5000 Å)-Ni (3000 Å)-Al (5000 Å)-Ni (3000 Å)), each layer at a thickness of at least 1 μm. Breakage can be prevented better by increasing the thickness of each layer in the stack to 2 μm or more.

Figure 33:
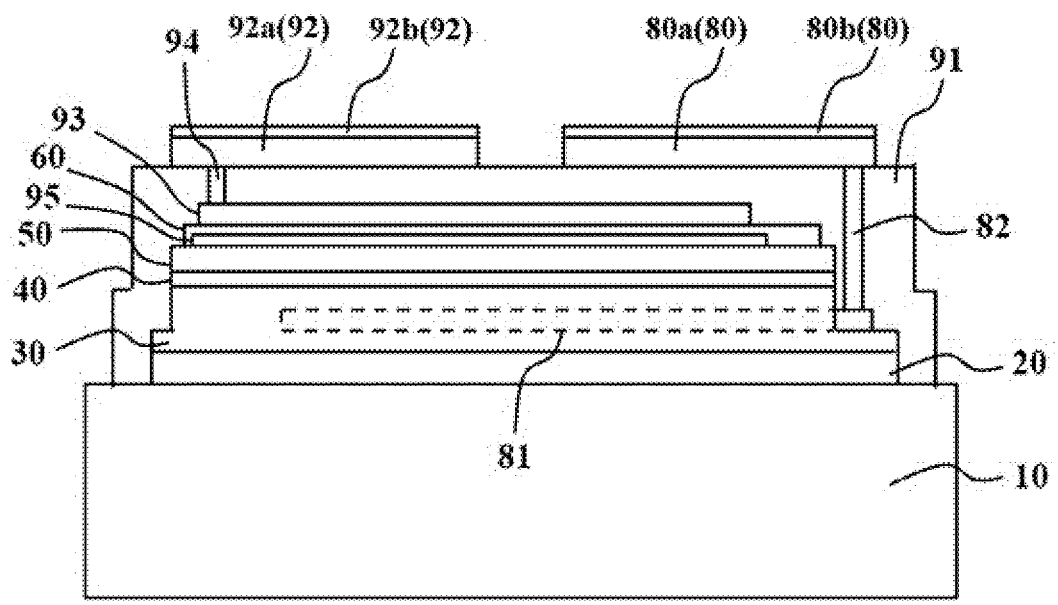
FIG. 33 is a schematic view illustrating a modified form of the semiconductor light emitting device proposed in FIG. 27.
Figure 34:
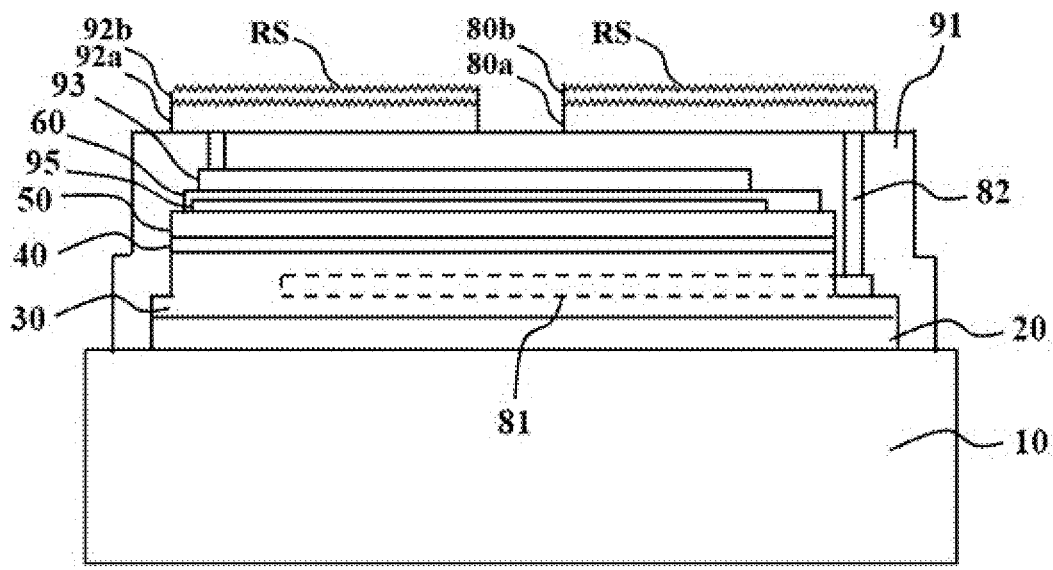
FIG. 34 is a schematic view illustrating a modified form of the semiconductor light emitting device proposed in FIG. 30.
Figure 35:
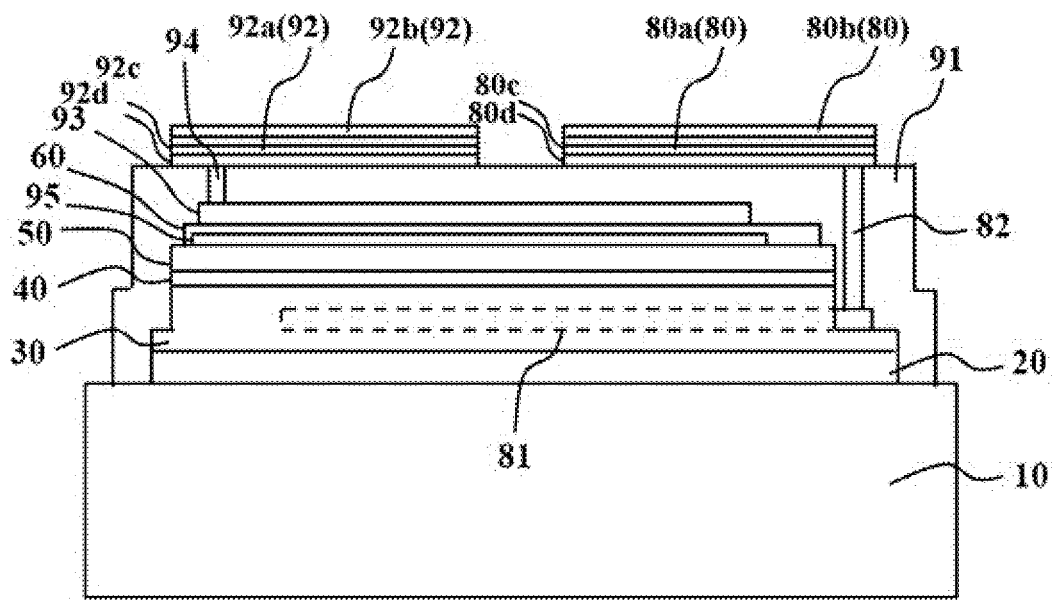
FIG. 35 is a schematic view illustrating a modified form of the semiconductor light emitting device proposed in FIG. 32.

FIG. 33 is a schematic view illustrating a modified form of the semiconductor light emitting device proposed in FIG. 27, FIG. 34 is a schematic view illustrating a modified form of the semiconductor light emitting device proposed in FIG. 30, and FIG. 35 is a schematic view illustrating a modified form of the semiconductor light emitting device proposed in FIG. 32. If one prepares the top layer of an electrode of a semiconductor light emitting device using Sn and then tries to solder it on site where it is attached the an external electrode 1000, 2000, impurities produced from oxidation for example may be present on Sn, causing problems in soldering and electrical conductivity. To resolve this, one may complete the manufacture of a semiconductor light emitting device first, coat a corresponding metal such as Sn or Au with a solder material while bringing the completely manufactured device into contact with the external electrode 1000, 2000, and solder them immediately on the spot. As an alternative way, as can be seen in FIGS. 33, 34, 35, a thin anti-oxidation layer 80b, 92b may be applied onto the Sn-based soldering layer 80a, 92a, and thereby preventing oxidation of Sn.

The anti-oxidation layer 80b, 92b may be made of a highly antioxidant and highly conductive metal such as Au or Pt. However, since soldering is carried out between the solder material 3000, 4000 and the soldering layer 80a, 92a, the anti-oxidation layer 80b, 92b should be sufficiently thick (but not too thick) enough to prevent oxidation of the soldering layer 80a, 92a. This may vary depending on a metal used. For example, when 1 μm-thick Au is used and serves as a soldering layer, the aforementioned problem may still occur. Therefore, the anti-oxidation layer 80b, 92b preferentially has a thickness of 5000 μ or less.

Referring back to FIG. 36, the change in bonding strength with the thickness of the anti-oxidation layer 80b, 92b is graphically shown. In the DTS (die shear test) used, the coupling force of an Au soldering layer free of Sn was obtained and used as a reference value Ref. Then a Sn soldering layer 80a, 92b made of Sn only, and Sn soldering layers with an overlaid thin anti-oxidation layer 80b, 92b made of Au of different thicknesses were tested to find out how the coupling force changes as a function of the thickness of Au. It turned out that the bonding strength keeps increasing until Au thickness reaches 500 Å, and then it gets decreased when Au thickness exceeds this level. Therefore, the bonding strength of the soldering layers which are made of Sn only or contain Sn falls between Ref and the bonding strength of 100 Å Au-overlaid Sn soldering layer. That is, a Sn soldering layer or a Sn-based soldering layer showed an increased bonding strength as compared with the Au soldering layer. The best bonding strength was found in 500 Å Au-overlaid Sn soldering layer, but then the bonding strength has decreased as the thickness of Au increases. Based on this experiment, and in consideration of the material (e.g. Au, Pt or the like) of the anti-oxidation layer and the solder material used, it is more preferential that the anti-oxidation layer 80b, 92b would have a thickness of 1000 Å or less.

Referring back to FIG. 28, FIG. 28 is a schematic view illustrating an example of a state where the semiconductor light emitting device is fixed to an external electrode. In particular, the n-side electrode 80 and the p-side electrode 92 of the semiconductor light emitting device C are fixed to external electrodes 1000, 2000, respectively. The external electrode 1000, 2000 may be a conducting part arranged at the sub-mount, a lead frame of the package, or an electrical pattern formed on the PCB, and it can be of any form without particular limitations as long as it is a wire independent of the semiconductor light emitting device C.

Figure 37:
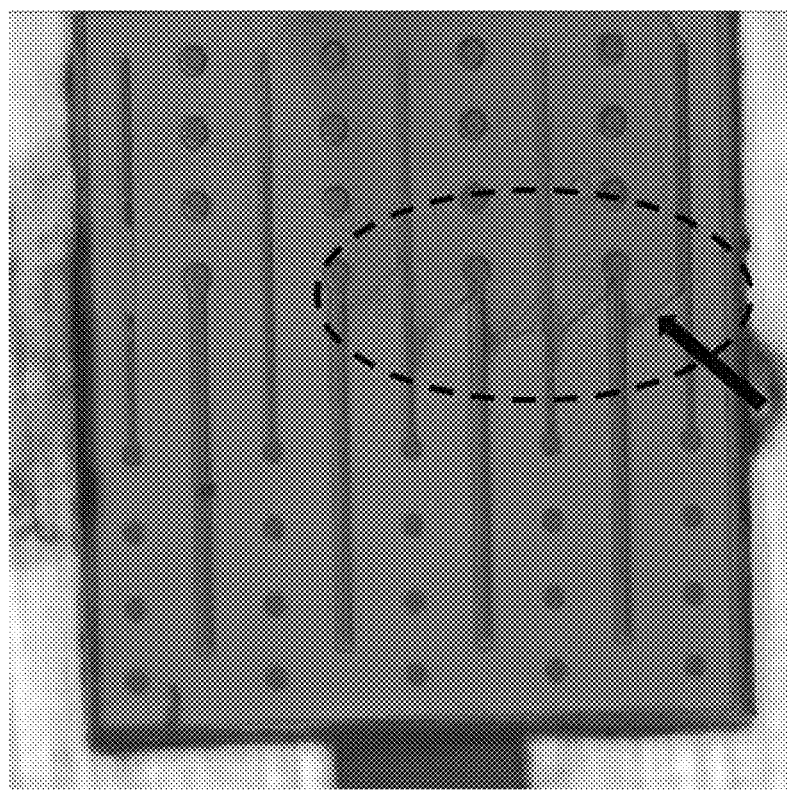
FIG. 37 is a photo showing cracks occurred in the semiconductor light emitting device bonded to an external electrode.

The electrode 80, 92 and the external electrode 1000, 2000 may be bonded together in various ways known in the art, including bonding using paste or ACF (anisotropic conductive film), eutectic bonding (e.g. AuSn, AnCu, CuSn), soldering, etc. Unfortunately however, as can be seen in FIG. 37, during this fixing or bonding process the semiconductor light emitting device may possibly be cracked (indicated with an arrow) due to a thermal shock. Meanwhile, Au is generally used for the top layer of the electrode 80, 92, but as shown in the left side of FIG. 29, Au does not show a favorable spreading condition with Sn which is usually used as a solder material during soldering. As such, when the top layer of the electrode 80, 92 is made of Au, high-yield soldering may not be accomplished (For an experiment, the reflow temperature (temperature for melting a solder) was set at 275° C., the reflow time was set at no more than 3 seconds, and an amount of a solder material was ⅓ of the area of a bump (electrode)).

Figure 38:
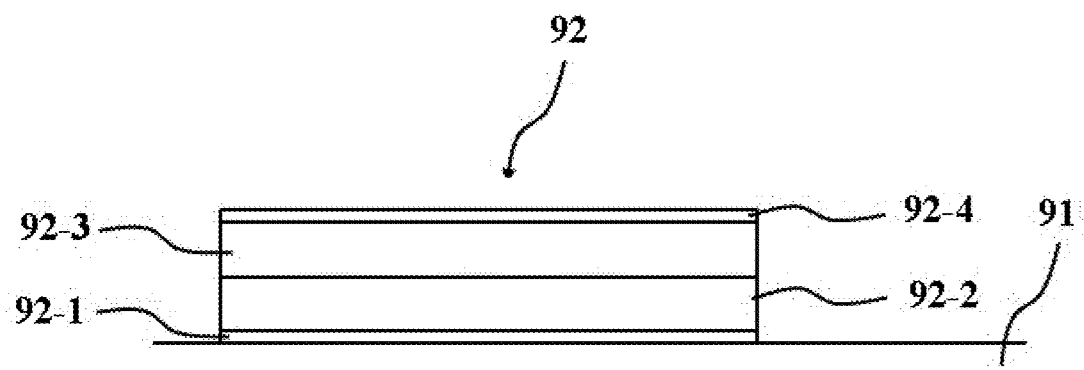
FIG. 38 is a schematic view illustrating an example of the structure of an n-side electrode and/or p-side electrode according to the present disclosure.

FIG. 38 is a schematic view illustrating an example of the structure of an n-side electrode and/or p-side electrode according to the present disclosure, in which a p-side electrode 92 (one example of the upper electrode in a second electrode part) is provided on a non-conductive reflective film 91. The p-side electrode 92 includes a lower electrode layer 92-2 and an upper electrode layer 92-3. The lower electrode layer 92-2 may be provided as a stress relief layer or a crack resistant layer for preventing cracks when a semiconductor light emitting device is fixed to an external electrode, and the upper electrode layer 92-3 may be provided as an anti-burst layer for preventing the bursting of the lower electrode 92-2. In addition, the lower electrode layer 92-2 may be provided as a reflective layer for reflecting light that has passed through the non-conductive reflective film 91. Also, the upper electrode layer 92-3 may be provided a diffusion barrier for preventing a solder material from permeating into the semiconductor light emitting device during a bonding operation such as soldering. The upper electrode layer 92-3 and the lower electrode layer 92-2 may be formed to have a combination of various functions described above.

For example, the lower electrode 92-2 may be formed of a highly reflective metal such as Al or Ag. In view of a crack resistant function, materials like Al and Ag are again useful as they have a high thermal expansion coefficient (linear thermal expansion coefficients: Al=22.2, Ag=19.5, Ni=13, Ti=8.6, unit: $10^{-6}$ m/mK). In many respects, Al is most desirable.

Likewise, the upper electrode 92-3 may be formed of a material such as Ti, Ni, Cr, W or TiW, in view of an anti-burst function and/or diffusion barrier function. Any metal having these functions may be employed without particular limitation.

Preferentially, the electrode 92 may further include a contact layer 92-1. With the contact layer 92-1, the electrode 92 may have an increased coupling force towards the non-conductive reflective film 92. The contact layer 92-1 may be formed of a metal (e.g. Cr, Ti, Ni or the like) or any suitable material as there is no specific limitation thereof, given that the contact layer thus formed has a greater coupling force than the lower electrode layer 92-2. The contact layer 92-1 is usually made thin (e.g. 20 Å-thick Cr) because light absorption by the contact layer 92-1 should be discouraged. The contact layer may be taken away if the lower electrode can have a coupling force. The contact layer 92-1 may be omitted, and the coupling force between the non-conductive reflective layer 91 and the lower electrode layer 92-3 may be increased by properly controlling deposition conditions (deposition method, deposition pressure, deposition temperature etc.) of the electrode 92. If the light reflection efficiency is taken into consideration, the contact layer should not be provided at all.

Preferentially and generally, the p-side electrode 92 includes a top layer 92-4. The top layer 92-4 is typically made of a metal having excellent adhesion, high electrical conductivity and high resistance to oxidation. Examples of the metal may include Au, Sn, AuSn, Ag, Pt, any alloy thereof or any combination thereof (e.g. Au/Sn, Au/AuSn), but are not particularly limited thereto as long as the aforementioned requirements are satisfied.

Figure 39:
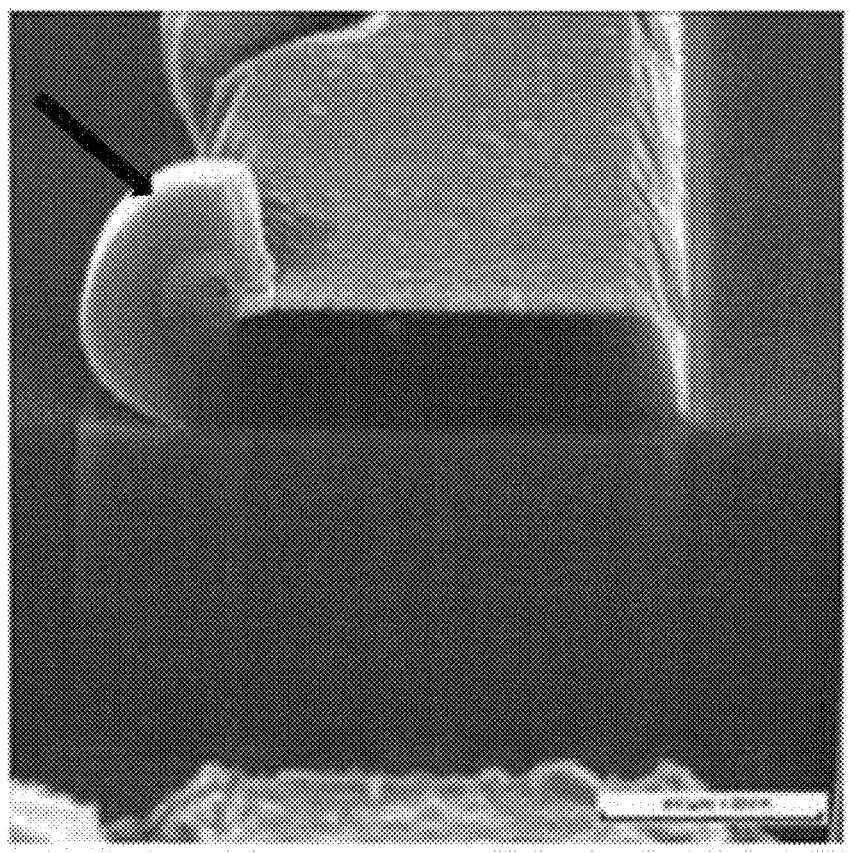
FIG. 39 is a photo showing that a lower electrode got burst after a current has been applied for an extended period of time.
Figure 43:
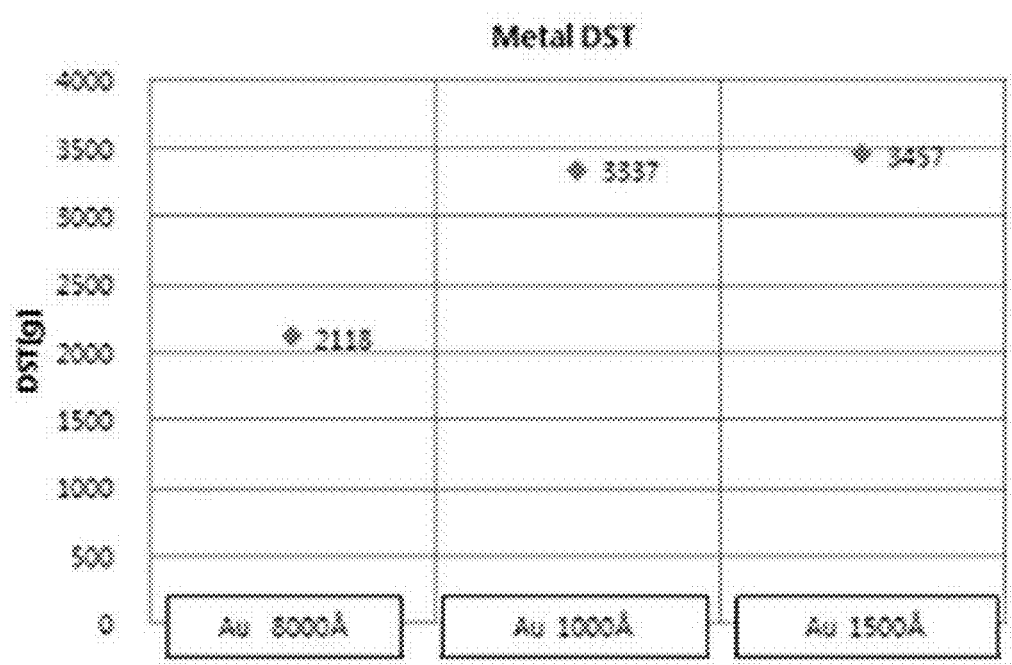
FIG. 43 is a graph showing DST results as a function of the thickness of top layer.

In a preferential embodiment, the p-side electrode 92 has the lower electrode 92-2 which has a thickness of at least 1000 Å or preferentially at least 5000 Å and serves as a crack resistant layer (a metal layer (e.g. Al) having a high thermal expansion coefficient), and the upper electrode layer 92-3 which prevents cracking of the semiconductor light emitting device when it is bonded to an external electrode by soldering for example and has a lower thermal expansion coefficient to prevent bursting and sticking out thereof caused by a higher thermal expansion coefficient (see FIG. 39 where the Al electrode at least 1000 thick burst out during the operation of the device (indicated with an arrow)). Here, the upper electrode layer 92-3 preferentially doubles as a diffusion barrier, and Ni or Ti is particularly suitable to meet such a need. For example, 1 μm Al and 2 μm Ni may be used. While there is no specific upper limit on the thickness of the lower electrode layer 92-2, it is preferential for the lower electrode layer 92-2 to be 1 μm thick or less because the upper electrode layer 92-3 will not be able to control the lower electrode layer 92-2 easily if the lower electrode layer 92-2 is too thick. On the other hand, if the thickness is reduced to 1000 Å or less, the lower electrode layer as a crack resistant layer may be degraded. As will be described later, when the p-side electrode 92 has a plurality of lower electrode layers 92-2, a smaller thickness is allowed. The thickness of the upper electrode layer 92-3 can be selected in consideration of the thickness of the lower electrode layer 92-2, and any value above 3 μm could be excessive and unnecessary, or electrical properties of the semiconductor light emitting device would possibly be degraded because of that. When a top layer 92-4 is provided and should be fixed to an external electrode by soldering, excessively voids can be formed if the top layer 92-4 is too thick, leading to a weaker coupling force at the joint. Because of this, the top layer 92-4 preferentially has a thickness less than 5000 Å. DST results as a function of the thickness of the top layer 92-4 is provided in FIG. 43. It turned out that excellent performance was demonstrated when the thickness is in a range from 1000 Å to 1500 Å, and relatively poor performance was demonstrate when the thickness is 8000 Å. Hence, to maintain a DST value between 2500 Å and 3000 Å, it is preferential that the top layer has a thickness less than 5000 Å. On the other hand, if the top layer is provided and expected to demonstrate excellent performance, it should be at least 100 Å thick.

Figure 40:
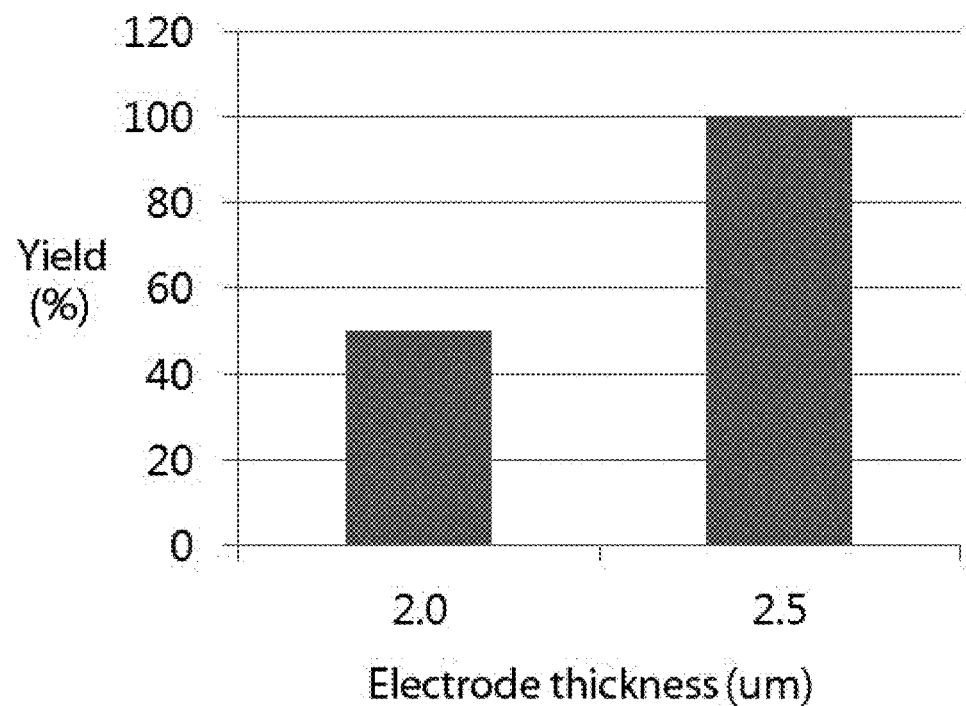
FIG. 40 graphically shows the change in the production yield with the thickness of an electrode or bump according to the present disclosure.

FIG. 40 graphically shows the change in the production yield with the thickness of an electrode or bump according to the present disclosure, for which an experiment was carried out by varying the thickness of sub-layers from the basic Cr (10 Å)-n-pair(s) Al (5000 Å)/Ni (3000 Å)-Au (8000 Å) structure, and solders (lead-free) were tested. When the electrode 80, 92 has a thickness of 2 μm, the production yield was 50%. When the electrode 80, 92 has a thickness of 2.5 μm, the production yield was approximately 100%. The pattern of electrodes used for this test was the same as the patterns of electrodes 80, 92 illustrated in FIG. 13 and FIG. 29, but other types of patterns equally hold a significant meaning as well. In terms of an area occupied by the electrode 80, 92, at least 50% of the area of the non-conductive reflective film 91 should be occupied by the electrode 80, 92 to be able to provide effective countermeasures against a thermal shock that occurs during bonding.

Figure 41:
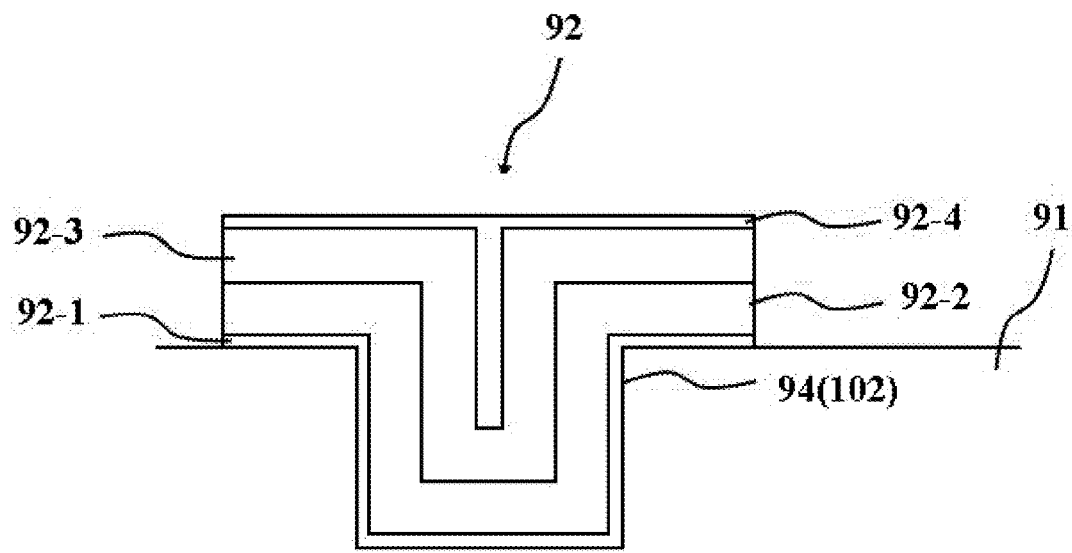
FIG. 41 is a schematic view illustrating a further example of the structure of an n-side electrode and/or p-side electrode according to the present disclosure.

FIG. 41 is a schematic view illustrating a further example of the structure of an n-side electrode and/or p-side electrode according to the present disclosure, in which an opening 102 is filled with a p-side electrode 92 to form an electrical connecting part 94 by the p-side electrode 92.

With this configuration, a lower electrode layer 92-2 may reflect light that has passed a non-conductive reflective film 91, and thus, light absorption by an electrical connecting part 94 can be reduced. For information, if a contact layer 92-1 is provided, the thickness thereof is so small that the lower electrode layer 92-2 may serve as a reflective film. Meanwhile, the electrical connecting part 94 may be formed separately from the p-side electrode 92 by deposition, plating and/or using a conductive paste.

Figure 42:
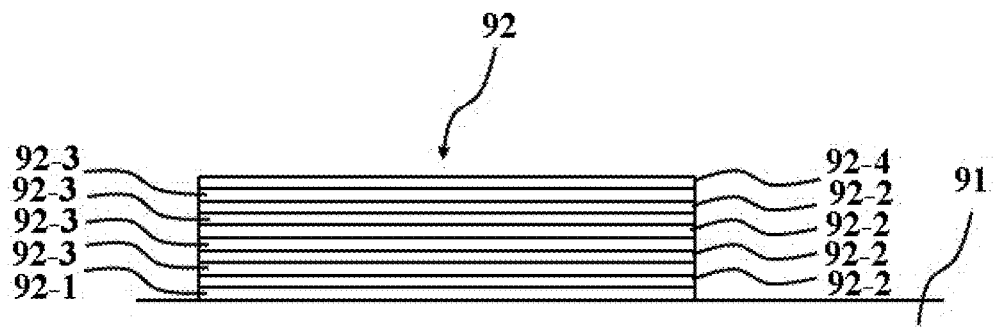
FIG. 42 is a schematic view illustrating a still further example of the structure of an n-side electrode and/or p-side electrode according to the present disclosure.

FIG. 42 is a schematic view illustrating a still further example of the structure of an n-side electrode and/or p-side electrode according to the present disclosure, in which a stack of several periods (repetitions) of alternating layers of a lower electrode layer 92-2 and an upper electrode layers 92-3 is provided. For instance, a p-side electrode 92 may include a contact layer 92-1 (20 Å-thick Cr), 4 pairs of the lower contact layers 92-2 (5000 Å-thick Al)/ upper contact layers 92-3 (3000 Å-thick Ni) and a top layer 92-4 (1 μm -thick Au). Alternatively, only one of the lower electrode layer 92-2 and the upper electrode layer 92-3 may be provided in several periods (repetitions). Further, all of the lower and upper electrode layers 92-2, 92-3 do not necessarily have to be made of the same material. For instance, the lower electrode layer 92-2 may be made of a combination of Al and Ag. Also, one lower electrode 92-2 may be made of plural kinds of metals. Needless to say, there may be an additional layer besides the contact layer 92-1, the lower electrode layer 92-2, the upper electrode layer 92-3 and the top layer 92-4. Moreover, the structure shown in FIG. 41 is also applicable. Through the stack of alternating layers, one can assure that the lower electrode layer 92-2 will not stick out or burst.

Figure 44:
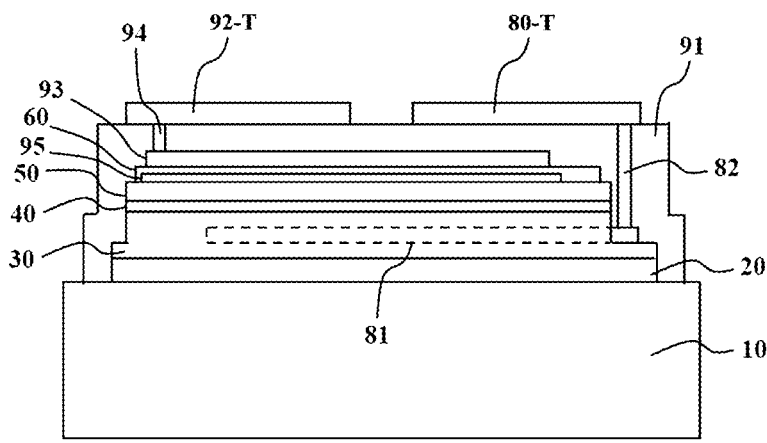
FIGS. 44, 45 and 46 are schematic views illustrating still further exemplary embodiments of a semiconductor light emitting device according to the present disclosure.
Figure 45:
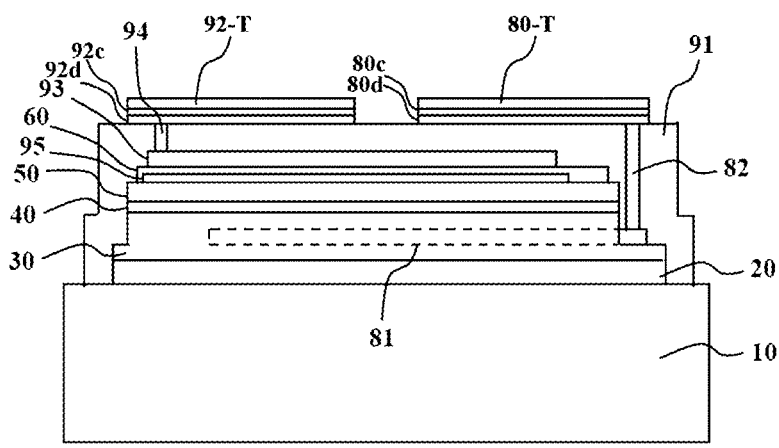
Figure 46:
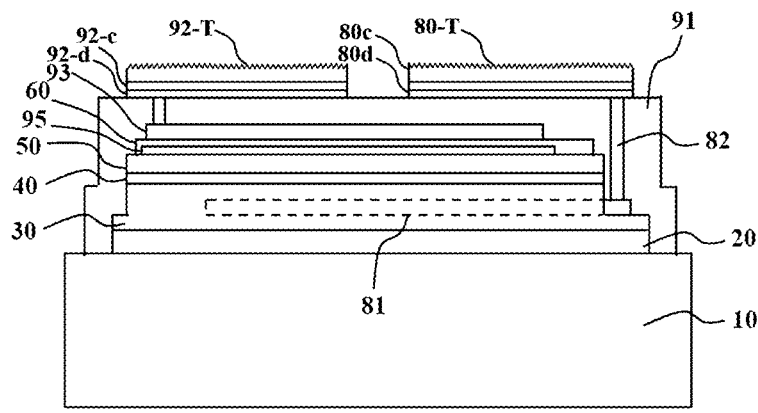

FIGS. 44, 45 and 46 are schematic views illustrating still further exemplary embodiments of a semiconductor light emitting device according to the present disclosure, in which at least one of the first layer 80 and second layer 92 of the semiconductor light emitting device includes a heat-treated soldering layer that is substantially free of Au but contains Sn as the top layer. FIG. 44 illustrates an embodiment where a soldering layer 80-T, 92-T is the only top layer; FIG. 45 illustrates an embodiment where a soldering layer 80-T, 92-T, an diffusion barrier 80c, 92c, and a light reflective layer 80d, 92d are all provided as the top layer; and FIG. 46 illustrates an embodiment where the surface of a soldering layer 80T, 92-T is roughened. In the context of the present disclosure, the expression ' . . . contain(s) Sn' is intended to include ' . . . consist(s) only of Sn'.

In addition, the soldering layer indicates that it is bonded to an external electrode (e.g. 1000, 2000; see FIG. 28) by soldering. For example, the solder used for soldering is a lead-free solder paste which contains a flux and grains including In, Sn, Ag, Co and impurities. For example, it may contain approximately 97% of Sn and approximately 3% of Ag. In other words, Sn is the main component or ingredient.

Figure 47:
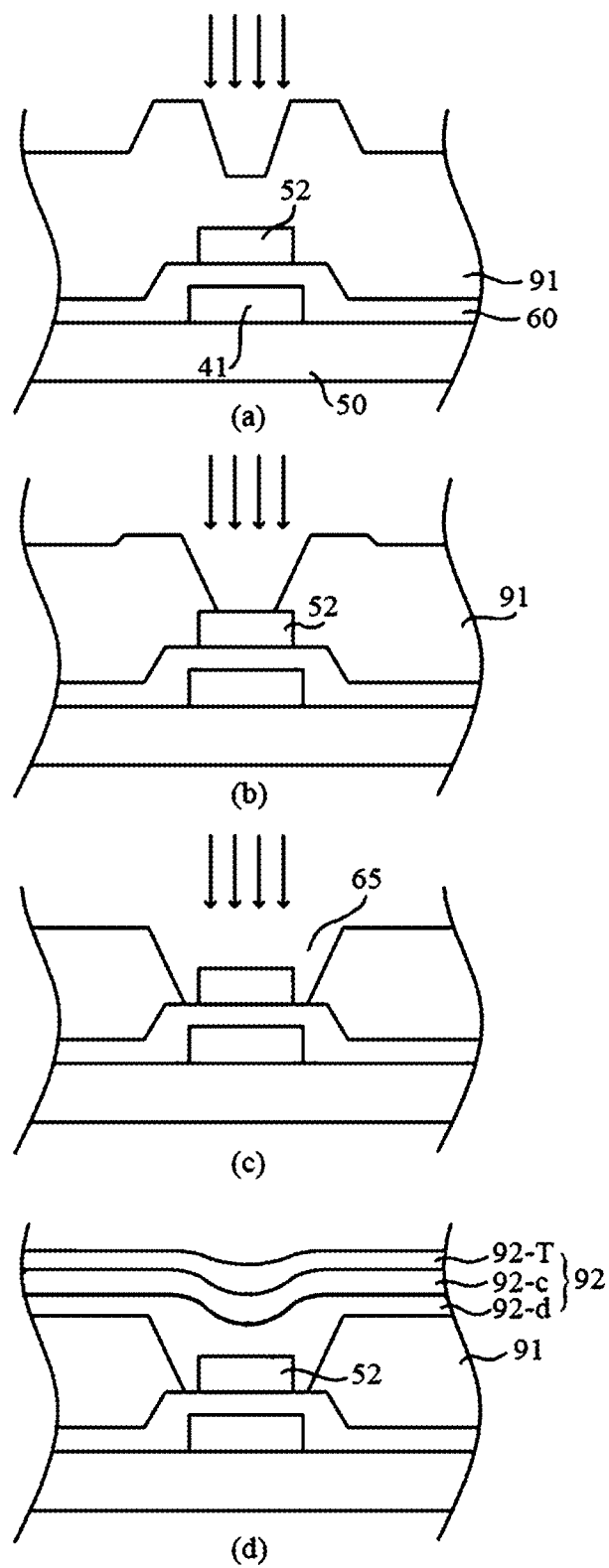
FIG. 47 shows schematic views illustrating another exemplary embodiment of a manufacturing method of a semiconductor light emitting device according to the present disclosure.

FIG. 47 shows schematic views illustrating another exemplary embodiment of a manufacturing method of a semiconductor light emitting device according to the present disclosure. A light absorbing barrier 41 is formed on a second semiconductor layer 50, and a transparent current-spreading electrode 60 (e.g. ITO) is formed on the light absorbing barrier. An ohmic contact electrode 52 serving as an electric contact improving layer is formed on the current-spreading electrode 60 opposite to the light absorbing barrier 41. Then, a non-conductive reflective film 92 is formed, covering the ohmic contact electrode 52. An opening 65 exposing the ohmic contact electrode 52 is formed by a dry and/or wet etching process, and a first electrode and a second electrode 92 are formed thereover by a deposition process. With the second electrode 92 extending to the opening 65, an electrical connecting part is established. In order to obtain a more stable connection structure between the electrical connecting part and the ohmic contact electrode 52, it is preferred to form the opening 65 in a way to expose the surrounding of the ohmic contact electrode 52 such that the electrical connecting part encompasses the ohmic contact electrode 52, as shown in FIG. 47.

The expression 'heat-treated soldering layer 80-T, 92-T mentioned above is intended to include intentional as well as non-intentional heat treatments, and it is distinguished from a process of simply exposing the soldering layer to a temperature for a deposition process. For example, in the process of forming an electrodes 80, 92, a heat treatment process may be carried out to improve interconnection between the electrical connecting part (e.g. 94 in FIG. 47 and FIG. 7) and the ohmic contact electrode (e.g. 52 in FIG. 47, 93 in FIG. 7). As the first electrode 80 and/or the second electrode 92 is extended to the opening 65 formed in the non-conductive reflective film 91 to form an electrical connecting part, the soldering layer 80-T, 92-T of the first electrode 80 and/or the second electrode 92 is also thermally treated during the heat treatment process. For example, the soldering layer 80-T, 92-T is made of Sn having a melting point of 220° C. In one example, the soldering process may be carried out at a temperature between 230° C. and 267° C., more specifically at 240° C. The heat treatment temperature may be equal to or higher/lower than the melting point of Sn. For example, the heat treatment temperature may be between 100° C. and 400° C.

As will be described below, when the soldering 80-T, 92-T is made of Sn and the anti-oxidation layer overlying the soldering layer is made of Au, the reason for carrying out the heat treatment having effect on the DST strength of soldering is based on the judgement that there would be a certain level of interaction between Sn and Au caused by the heat treatment prior to soldering. Therefore, the primary concern is that the heat treatment is carried out at a temperature equal to or above the melting point of Sn. Meanwhile, any heat treatment being carried out at a temperature close to or lower than the melting point of Sn can also have a sufficient influence on the bonding strength. Hence, those treatments are not excluded from the heat treatment in the present disclosure.

The inventors have found out that when the heat treatment has been carried out and if the top layers of the first electrode 80 and the second electrode 92 for soldering are made of Au, the DST strength of soldering is greatly reduced. This will be further explained later. In this embodiment, the first electrode 80 and the second electrode 92 are substantially free of Au, and contain Sn as their top layer, and have heat-treated soldering layers 80-T, 92-T, respectively. The inventors also found out that this soldering layer 80-T, 92-T has a significantly increased DST strength of soldering as compared with those having an Au top layer with heat treatment. Moreover, this soldering layer 80-T, 92-T has a superior DST strength to those having a Sn-containing top layer without heat treatment. Again, this will be further explained later.

Figure 48:
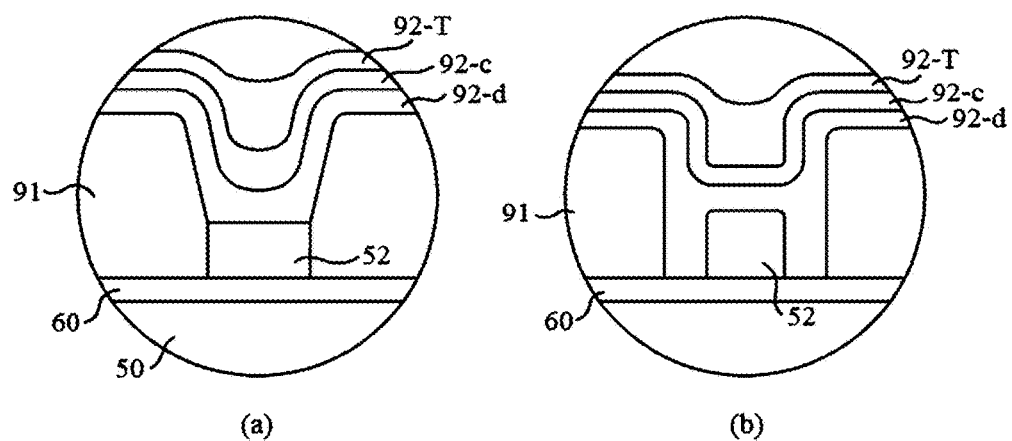
FIGS. 48, 49 and 50 are schematic views illustrating still further exemplary embodiments of a semiconductor light emitting device according to the present disclosure.
Figure 49:
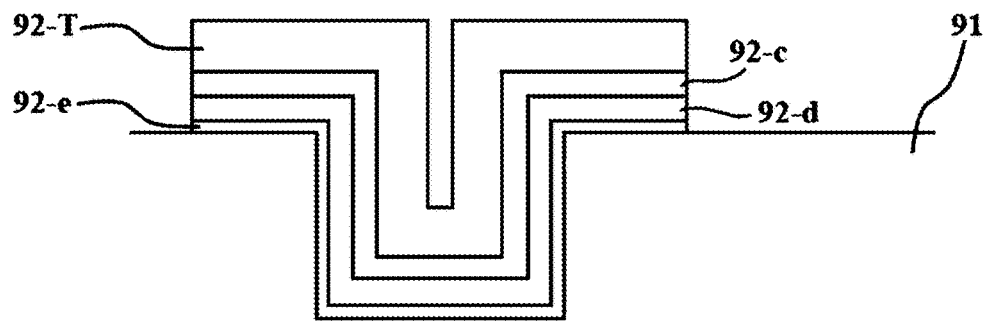
Figure 50:
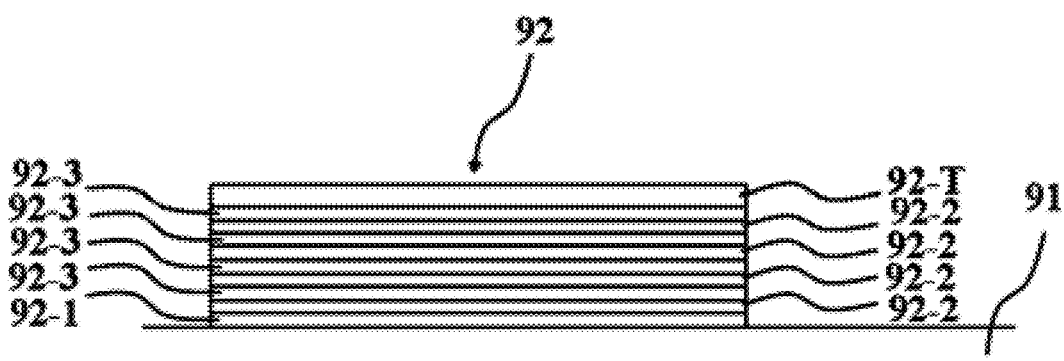

FIGS. 48, 49 and 50 are schematic views illustrating still further exemplary embodiments of a semiconductor light emitting device according to the present disclosure. Here, the second electrode 92 is extended to the opening and forms an electrical connecting part that is connected with the ohmic contact electrode 52, and the electrical connecting part is formed such that it reaches only to the edges of the ohmic contact electrode 72 (see FIG. 48a), unlike the electrical connecting part suggested in FIG. 47. Likewise, in the case of the first semiconductor layer, an additional ohmic contact electrode is provided on an exposed portion of the first semiconductor layer through the opening that is formed in the non-conductive reflective film 91, and the first electrode 80 being extended to the opening comes into contact with the additional ohmic contact electrode. In addition, the opening may be a slanted or perpendicular opening (see FIG.

48b). Further, the light reflective layer made of Al, Ag or the like may be arranged to be in contact with the non-conductive reflective film, it is also possible for the electrode and the electrical connecting part to additionally have a contact layer 92c as the bottom layer for improving the bonding strength (see FIG. 49). Moreover, when the light reflective layer is made thick, the light reflective layer 92-2 and the diffusion barrier 92-3 may be stacked alternately and repeatedly, so as to prevent the fracture (see FIG. 50). For example, Al/Ni may be made thick by this alternate stacking arrangement. At this time, a high-quality oxidation film such as an aluminum oxide layer or a nickel oxide layer may be formed on the side of the alternately and repeatedly stacked Al/Ni. As a solder does not easily stick or adhere to this oxidation film, the solder will be discouraged from climbing up and penetrating into the plurality of semiconductor layers.

Figure 51:
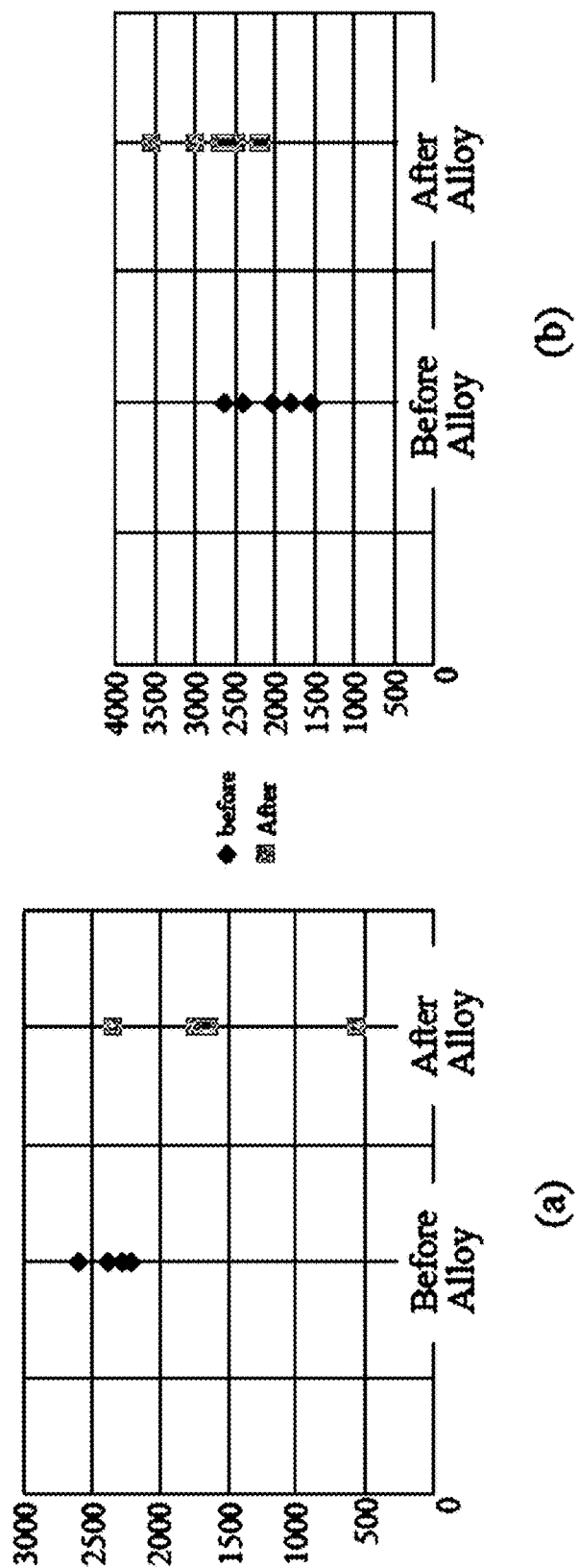
FIG. 51 shows test results on the DST strength of soldering before and after the heat treatment.

FIG. 51 shows test results on the DST strength of soldering before and after the heat treatment. In the test, Sample 1, an electrode having the soldering layer (Sn)/anti-oxidation layer (Au) structure, i.e. Sn 20000 Å/Au 500 Å, has or has not been subjected to the heat treatment at 300° C. for 5 minutes, and the DST strength of soldering was tested in both cases (see FIG. 51a). Moreover, Sample 2, an electrode having a substantially free of Au and containing Sn as the top layer, i.e. Sn 20000 Å, has or has not been subjected to the heat treatment at 300° C. for 5 minutes, and the DST strength of soldering was tested in both cases (see FIG. 51b).

First of all, in the case of Sample 1 Sn 20000 Å/Au 500 Å, the soldering strength after the heat treatment was significantly decreased. It is believed that even though a certain level of bonding strength may be obtained when the thin Au layer that was not subjected to the heat treatment serves as the anti-oxidation layer and the Sn layer serves as the soldering layer, Au, for some reasons, can have a negative effect on the soldering strength after the heat treatment was carried out. Meanwhile, in the case of Sample 2 Sn 20000 Å, the soldering strength was significantly improved even after the heat treatment was carried out. It is assumed that the absence of Au between the Sn-containing soldering layer 80-T, 92-T and the solder contributes somewhat to the improved soldering strength, and that the bonding strength between the soldering layer 80-T, 92-T and the diffusion barrier 80c, 92c made of Ni arranged under the soldering layer 80-T, 92-T must have been improved through the heat treatment.

As described hereinabove, the present disclosure provides a solution for soldering different from eutectic bonding, and discloses an electrode structure for preventing the occurrence of a defect, e.g. a crack, in the plurality of semiconductor layers of a semiconductor light emitting device. In particular, the heat treatment may be carried out depending on the process of forming the electrodes 80, 92, or simply the deposition process may be carried out to form the electrodes. In other words, the heat treatment is not absolutely necessary, yet the electrode targeted for the heat treatment needs to be designed in consideration of the influence of the heat treatment process upon the soldering strength. In either case, one can find suitable conditions for meeting the required soldering bonding condition, and it is not right to say one case is absolutely more preferred than the other case.

For example, the test result of an electrode composed of the light reflective layer (Al)/the diffusion barrier (Ni)/the soldering layer (Au) indicates that the soldering strength varies by the thickness of Au. That is, if Au is too thick, the bonding strength is decreased; if Au is too thin, Ni is more likely to oxidize. Therefore, it is necessary to find a suitable thickness for Au (see Ref in FIG. 36).

However, as shown in FIG. 36, the test result of an electrode composed of the light reflective layer (Al)/the diffusion barrier (Ni)/the soldering layer (Sn)/the anti-oxidation layer (Au) indicates that the bonding strength may be greater or less than the Ref, depending on the thickness of the anti-oxidation layer (Au). During soldering, the thin Au layer is generally mixed with the soldering layer and the solder, and Au products obtained from the interaction between Au and Sn tend to be brittle, indicating that the bonding strength is affected by the thickness of Au. Hence, when an electrode is composed of the light reflective layer (Al)/the diffusion barrier (Ni)/the soldering layer (Sn)/the anti-oxidation layer (Au), the anti-oxidation layer should not be too thick, but have an optimal or suitable thickness, for example, equal to or less than 500 Å as suggested in the embodiment of FIG. 36, such that the bonding strength may be improved as compared with the Ref. Further, it is believed that the bonding strength can still be improved as compared with the Ref when the anti-oxidation layer is not present and the top layer is made of Sn only (refer to the description of FIG. 36). Accordingly, as it will be described later, designing the anti-oxidation layer, i.e. Au, to have an optimal or suitable thickness would be more appropriate for use in the electrode structure which does not undergo the heat treatment.

Meanwhile, when the heat treatment is carried out intentionally and non-intentionally during the formation of the electrode 80, 92, Sample 1 Al/Ni/Sn 20000 Å/Au 500 Å illustrated in FIG. 51a experiences a substantial decrease in the bonding strength due to the heat treatment. This seems to occur because the heat treatment causes Sn in the soldering layer interacts with Au prior to the soldering process, which in turn causes a subsequent interaction among the solder-Au-the soldering layer during the soldering process, thereby affecting the distribution of brittleness of the Au products. Consequently, the bonding strength has been decreased more, as compared with the case where no heat treatment is carried out. One possible assumption regarding this phenomenon is that if the soldering process is carried out without preceding heat treatment, Au is mixed with the solder as well as with the soldering layer during the interaction of the solder-Au-the soldering layer, and a relatively high concentration section of brittle materials is not distinctive; if the heat treatment is carried out in advance, the products from the interaction between Sn and Au are formed in a region within a certain thickness from the upper face of the soldering layer, which leads to poor distribution or poor spreading of brittle materials during the soldering process, or causes the brittle materials to be deposited more towards the solder and creates a higher-concentration section, resulting in a significant decrease in the boding strength.

However, considering that the heat treatment increases the coupling force between the diffusion barrier (Ni) and the soldering layer (Sn, 80-T, 92-T), while the heat-treated Sample 1 shows a significantly decreased bonding strength, one can see that the heat-treated, Au top layer indeed has very negative effects on the soldering strength.

Therefore, if the heat treatment is supposed to be carried out, Sample 2, the Al/Ni/Sn 20000 Å electrode, illustrated in FIG. 51b may still have an increased bonding strength by including Sn, not Au, as the top layer, and the heat-treated soldering layer 80-T, 92-T. That is, in the case of Sample 2, it is believed that the heat treatment inhibits Au from negatively affecting the soldering, and the coupling force between the diffusion barrier and the soldering layer 80-T, 92-T is improved, thereby increasing the bonding strength.

On the other hand, when the Sn top layer becomes a soldering layer, it is necessary to inspect whether an oxide layer is formed on the surface of Sn and deteriorates the soldering strength. This oxide layer may be formed whether the heat treatment is carried out or not, and there may be more factors during the heat treatment, which oxidizes the surface of Sn. Nevertheless, the heat-treated Sn layer as shown in FIG. 51b, i.e. the soldering layer 80-T, 92-T, has a significantly improved soldering strength. This seems to occur because the layer quality of tin oxide is poorer than the layer qualities of other oxide layers such as an aluminum oxide layer or an nickel oxide layer, such that the tin oxide layer becomes susceptible to fracture and can be removed during soldering. That is, the tin oxide layer does not have a great impact on the soldering strength. For example, the solder material is a lead-free solder paste which contains a flux and grains including In, Sn, Ag, Co and impurities. For example, it may contain approximately 97% of Sn and approximately 3% of Ag. In other words, Sn is the main component. While soldering, the flux is evaporated and only the grains remain. The soldering process temperature can range from 230 to 267° C., and the flux serves to prevent the oxidation of metals contained in the solder paste, e.g. Ag, Sn, Co and so on, and to remove any oxide layer or impurities remaining on the surface of the soldering target (e.g. 80-T, 92-T). On one hand, one can assume that even if the tin oxide layer has small impact on the soldering strength, its influence may be insignificant as compared with the overwhelming improvement of the soldering strength due to an increased coupling force between the diffusion barrier and the soldering layer 80-T, 92-T as a result of the heat treatment. On the other hand, although this is only an assumption, one can also suppose that the heat-treated, Sn-containing soldering layer 80-T, 92-T modifies the properties of Sn (e.g. morphology) to be more suitable for coupling with the solder.

The soldering layer preferentially has a thickness of at least 1000 Å to function as a solder layer. The thickness of the soldering layer is not particularly limited, and it may be greater than 5 μm.

The differences between the presence of the anti-oxidation layer and the absence of the anti-oxidation layer, and the differences between the heat treatment and no heat treatment can be determined through the comparison of FIG. 51a and FIG. 51b that are tested under the same conditions. Referring to the data in FIG. 51, it turned out that, with the heat treatment being carried out, it is desirable to form the soldering layer 80-T, 92-T with the Au-free, Sn top layer. With no heat treatment being carried out, however, it turned out that there is not much difference in the bonding strengths between the presence of the anti-oxidation layer (Au) (the left side in FIG. 51a; the values along the vertical axis range roughly from 2200 to 2700) and the absence of the anti-oxidation layer (Au) (the left side of FIG. 51b; the values along the vertical axis range roughly from 1500 to 2700). Nevertheless, it is also true that more results showed that the presence of the anti-oxidation layer yielded greater bonding strengths. Of course, it should be noted that this is based on the assumption that the anti-oxidation layer has an optimal or suitable thickness. Moreover, it turned out that, as for the top layer, the Au-free soldering layer 80-T, 92-T containing Sn has a greater DST strength than those having a thermally untreated anti-oxidation layer with a suitably selected thickness.

When the soldering layer 80-T, 92-T is formed of Sn and the main component of the solder is Sn, as described in FIG. 29, even a small amount of the solder easily spreads across the electrode, which helps to obtain a substantially larger bonding area, thereby improving the bonding strength. In addition, this type of the solder makes it easier to design dispensing points when the solder is to be dispensed on the electrode. Since a smaller amount of the solder can be used, the plurality of semiconductor layers can be protected from possible negative influences (e.g. fracture, cracks, etc.) of thermal expansion that usually occurs when a large amount of the solder is used. Moreover, it is less likely that the solder will stick out sideways so that the spacing between the first electrode 80 and the second electrode 92 can be narrower, and the heat radiation area can be broaden accordingly.

The soldering layer 80-T, 92-T may be formed of other materials besides Sn. In particular, when the soldering layer 80-T, 92-T is formed of components of the solder, preferably the main component of the solder, the soldering strength may be improved, as compared with the case where the soldering layer made of Au free of foreign substances, or includes Au as the anti-oxidation layer. Examples of the solder may include Sn, PbSn, PbSnAg, PbInAb, PbAg, SnPbAg, PbIn, CdZn and the like. Therefore, the soldering layer 80-T, 92-T may optionally be formed of Pb, Ag, In, Ab, Cd, Zn or the like, in addition to Sn.

If this is the case, the soldering layer may undergo heat treatment prior to soldering. The definition of the heat treatment is as described above. In particular, when the heat treatment is carried out at a temperature suitable for the main component of the solder, it is desirable to form a substantially Au-free soldering layer as the top layer, using the main component of the solder, such that the bonding strength may be improved, as compared with the case where Au is used as the top layer, with or without the heat treatment being carried out.

The following describes various exemplary embodiments of the present disclosure.

(1) A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a reflective film arranged on the opposite side of the growth substrate for reflecting the light generated in the active layer; and first and second electrodes arranged to provide electrons and holes to the plurality of semiconductor layers, in which at least one of the first and second electrodes includes a heat-treated, substantially Au-free soldering layer containing Sn as the top layer.

Here, the substantially Au-free soldering layer is not intended to mean that the present disclosure excludes any soldering layer containing a very small amount of Au.

(2) The semiconductor light emitting device, characterized in that the soldering layer is bonded with a lead-free solder material.

(3) The semiconductor light emitting device, characterized in that the soldering layer is bonded with a solder material containing Sn as the main component.

(4) The semiconductor light emitting device, characterized in that temperature for the heat treatment ranges from 100 to 400° C.

(5) The semiconductor light emitting device, characterized in that the soldering layer has a thickness of at least 1000 Å.

(6) The semiconductor light emitting device, characterized in that the soldering layer has a rough surface.

(7) The semiconductor light emitting device, characterized in that the reflective film is a non-conductive reflective film.

(8) The semiconductor light emitting device, characterized in that at least one of the first and second electrodes, which has the soldering layer, includes: a diffusion barrier arranged under the soldering layer, for preventing the solder material from penetrating into the plurality of semiconductor layers; a light reflective layer arranged under the soldering layer, for reflecting the light generated in the active layer.

(9) The semiconductor light emitting device, characterized in that the at least one of the first and second electrodes, which has the soldering layer, includes an electrical connecting part arranged on the non-conductive reflective film, for electrically connecting the plurality of semiconductor layers to at least one of the first and second electrodes.

(10) The semiconductor light emitting device, characterized in that the non-conductive reflective film has an opening, and the electrical connecting part has an electric contact improving layer exposed through the opening and electrically connected with the plurality of semiconductor layers, the electric contact improving layer coming into contact with the at least one of the electrodes extended through the opening.

(11) The semiconductor light emitting device, characterized in that the temperature for heat treatment is determined so that bonding between the electric contact improving layer and the electrode extended through the opening to come into contact with the electric contact improving layer is enhanced.

(12) The semiconductor light emitting device, characterized in that the at least one of the first and second electrodes, which has the soldering layer, includes: a diffusion barrier arranged between the soldering layer and the non-conductive reflective film, for preventing the solder material from penetrating into the plurality of semiconductor layers; a light reflective layer arranged between the diffusion barrier and the non-conductive reflective film, for reflecting the light generated in the active layer.

(13) The semiconductor light emitting device, characterized in that the light reflective layer and the diffusion barrier are alternately and repeatedly stacked.

(14) A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a reflective film arranged on the opposite side of the growth substrate for reflecting the light generated in the active layer; and first and second electrodes arranged to provide electrons and holes to the plurality of semiconductor layers, in which at least one of the first and second electrodes includes: a substantially Au-free soldering layer containing Sn as the top layer arranged on the reflective film, for soldering; a light reflective layer arranged between the reflective film and the soldering layer, for reflecting the light generated in the active layer; and a diffusion barrier arranged between the light reflective layer and the soldering layer for preventing a solder material from penetrating into the plurality of semiconductor layers.

(15) The semiconductor light emitting device, characterized in that the soldering layer undergoes the heat treatment at a temperature for increasing the bonding force of at least one of the first and second electrodes, which has the soldering layer.

(16) The semiconductor light emitting device, characterized in that the light reflective layer includes at least one selected from Al and Ag.

(17) The semiconductor light emitting device, characterized in that the diffusion barrier includes at least one selected from Ni, Ti, Cr, W and TiW.

(18) A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a reflective film arranged on the opposite side of the growth substrate for reflecting the light generated in the active layer; and first and second electrodes arranged to provide electrons and holes to the plurality of semiconductor layers, in which at least one of the first and second electrodes includes a heat-treated, substantially Au-free soldering layer containing the main component of a solder material as the top layer for soldering.

(19) The semiconductor light emitting device, characterized in that the soldering layer contains at least one of Sn, Pb, Ag, In, Ab, Cd and Zn.

(20) The semiconductor light emitting device, characterized in that at least one of the first and second electrodes, which has the soldering layer, is arranged on the non-conductive reflective film and includes an electrical connecting part for electrically connecting the plurality of semiconductor layers to at least one of the first and second electrodes; the non-conductive reflective film has an opening; the electrical connecting part has an electric contact improving layer at least partially exposed through the opening and electrically connected with the plurality of semiconductor layers, the electric contact improving layer coming into contact with at least one of the electrodes extended through the opening; and temperature for the heat treatment is determined so that bonding between the electric contact improving layer and the electrode extended through the opening to come into contact with the electric contact improving layer is enhanced.

(21) A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a reflective film arranged on the opposite side of the growth substrate for reflecting the light generated in the active layer; and first and second electrodes arranged to provide electrons and holes to the plurality of semiconductor layers, in which at least one of the first and second electrodes includes a Sn-containing soldering layer, and an anti-oxidation layer arranged on the soldering layer for preventing oxidation of the soldering layer.

(22) The semiconductor light emitting device, characterized in that the reflective film is a non-conductive reflective film.

(23) The semiconductor light emitting device, characterized in that at least one of the first and second electrodes is formed on the non-conductive reflective film, and at least 50% of an area of the non-conductive reflective film is covered by the first and second electrode.

(24) The semiconductor light emitting device, characterized in that the at least one of the first and second electrodes passes through the non-conductive reflective film and is electrically connected to the plurality of semiconductor layers.

(25) The semiconductor light emitting device, characterized in that the at least one of the first and second electrodes, which has the soldering layer and the anti-oxidation layer, includes a diffusion barrier arranged under the soldering layer, for preventing a solder material from penetrating into the plurality of semiconductor layers.

(26) The semiconductor light emitting device, characterized in that the at least one of the first and second electrodes, which has the soldering layer and the anti-oxidation layer, includes a light reflective layer arranged under the soldering layer, for reflecting the light generated in the active layer.

(27) The semiconductor light emitting device, characterized in that the reflective film is a non-conductive reflective film, and the at least one of the first and second electrodes, which has the soldering layer and the anti-oxidation layer, includes a light reflective layer arranged under the diffusion barrier, for reflecting the light generated in the active layer.

(28) The semiconductor light emitting device, characterized in that the at least one of the first and second electrodes, which has the soldering layer and the anti-oxidation layer, includes a contact layer as the bottom layer, for contacting with the plurality of semiconductor layers.

(29) The semiconductor light emitting device, characterized in that the at least one of the first and second electrodes, which has the soldering layer and the anti-oxidation layer, has a rough surface.

(30) The semiconductor light emitting device, characterized in that the anti-oxidation layer has a thickness of 5000 Å or less.

(31) The semiconductor light emitting device, characterized in that the anti-oxidation layer has a thickness of 1000 Å or less.

(32) The semiconductor light emitting device, characterized in that the soldering layer has a thickness of 5000 Å or less.

(33) The semiconductor light emitting device, characterized in that the soldering layer has a thickness of at least 1 μm.

(34) The semiconductor light emitting device, characterized in that the reflective film is a non-conductive reflective film; and the at least one of the first and second electrodes, which has the soldering layer and the anti-oxidation layer, is formed on the non-conductive reflective film, passes through the non-conductive reflective film to be electrically connected to the plurality of semiconductor layers, and includes a diffusion barrier arranged under the soldering layer, for preventing a solder material from penetrating into the plurality of semiconductor layers.

(35) The semiconductor light emitting device, characterized in that the reflective film is a non-conductive reflective film; the semiconductor light emitting device further includes an anti-etch layer arranged between the non-conductive reflective film and the plurality of semiconductor layers; and the at least one of the first and second electrodes, which has the soldering layer and the anti-oxidation layer, is formed on the non-conductive reflective film, passing through the non-conductive reflective film as well as the anti-etch layer to be electrically connected to the plurality of semiconductor layers.

(36) A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a non-conductive reflective film arranged on the opposite side of the growth substrate and coupled to the plurality of the semiconductor layers; one or more electrodes formed on the non-conductive reflective film and electrically connected to the plurality of semiconductor layers, in which the one or more electrodes respectively include a lower electrode layer having a first thermal expansion coefficient for preventing cracks in the semiconductor light emitting device during bonding, and an upper electrode layer having a second thermal expansion coefficient larger than the first thermal expansion coefficient for preventing fracture of the lower electrode layer; and an electrical connecting part for electrically connecting the plurality of semiconductor layers to at least one electrode. Here, the electrical connecting part refers to an assembly of at least electrical connection.

(37) The semiconductor light emitting device, characterized in that the one or more electrodes respectively have a structure of alternating layers of a lower electrode layer and an upper electrode layer.

(38) The semiconductor light emitting device, characterized in that the electrical connecting part is formed, passing through the non-conductive reflective film; the one or more electrodes are formed on the non-conductive reflective film and within the electrical connecting part; and at least a portion of the lower electrode layer is formed within the electrical connecting part.

(39) The semiconductor light emitting device, characterized in that the one or more electrodes includes a first electrode for providing electrons or holes to the first semiconductor layer, and a second electrode for providing holes—if the first electrode provides electrodes—, or electrodes—if the first electrode provides holes—, and the one or more electrodes cover at least 50% of an area of the non-conductive reflective film.

(40) The semiconductor light emitting device, characterized in that the one or more electrodes have a thickness of at least 2 μm.

(41) The semiconductor light emitting device, characterized in that the lower electrode layer has a thickness of at least 1000 Å. The electrode may have plural lower electrode layers. The lower electrode layer may be a single layer of an at least 1000 Å in thickness, or plural lower electrode layers may be combined to make up a total thickness of at least 1000 Å.

(42) The semiconductor light emitting device, characterized in that the lower electrode layer has a thickness of at least 5000 Å. The electrode may have plural lower electrode layers. The lower electrode layer may be a single layer of an at least 5000 Å in thickness, or plural lower electrode layers may be combined to make up a total thickness of at least 5000 Å.

(43) The semiconductor light emitting device, characterized in that the one or more electrodes respectively have at least one lower electrode layer and at least one upper electrode, in which a combined thickness of the at least one lower electrode layer and the at least one upper electrode layer is 1 µm or greater. The at least one lower electrode layer may be a single layer or plural layers, preferentially having a thickness of at least 1000 Å, more preferentially at least 5000 Å. Considering that the at least one upper electrode layer should be fracture-free and/or serve as a diffusion barrier, one of the upper electrode layers preferentially has a thickness of at least 1 Åm, more preferentially at least 2 µm.

(44) The semiconductor light emitting device, characterized in that the one or more electrodes respectively have at least one lower electrode layer and at least one upper electrode, in which a combined thickness of the at least one lower electrode layer and the at least one upper electrode layer is 2 µm or greater. As the at least one lower electrode layer together with the at least one upper electrode layer are 2 µm or greater in thickness, the semiconductor light emitting device can be protected from thermal shock during bonding, independent of the thicknesses of the contact layer, the top layer and other layers.

(45) The semiconductor light emitting device, characterized in that the one or more electrodes respectively have a top layer of 5000 Å or less in thickness.

(46) The semiconductor light emitting device, characterized in that the lower electrode layer includes at least one selected from Al and Ag.

(47) The semiconductor light emitting device, characterized in that the upper electrode layer includes at least one selected from Ti and Ni.

(48) The semiconductor light emitting device, characterized in that the top layer includes at least one selected from Au and Pt.

(49) The semiconductor light emitting device, characterized in that the non-conductive reflective film includes a Distributed Bragg Reflector.

(50) The semiconductor light emitting device, characterized in that the one or more electrodes includes a first electrode for providing electrons or holes to the first semiconductor layer, and a second electrode for providing holes—if the first electrode provides electrodes—, or electrodes—if the first electrode provides holes—; the electrical connecting part is formed, passing through the non-conductive reflective film; the one or more electrodes are formed on the non-conductive film and within the electrical connecting part; and the lower electrode layer arranged within the electrical connecting part reflects the light generated in the active layer and then passed the non-conductive reflective film.

(51) The semiconductor light emitting device, characterized in that the one or more electrodes have a thickness of at least 2 µm, and the one or more electrodes have a top layer of 5000 Å or less in thickness.

(52) The semiconductor light emitting device, characterized in that the plurality of semiconductor layers is composed of a Group III nitride semiconductor, and the non-conductive reflective film includes a Distributed Bragg Reflector.

(53) The semiconductor light emitting device, characterized in that the lower electrode layer is the bottom layer of the electrode.

(54) A semiconductor light emitting device, including: a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination; a non-conductive reflective film arranged on the opposite side of the growth substrate and coupled to the plurality of the semiconductor layers; one or more electrodes formed on the non-conductive reflective film and electrically connected to the plurality of semiconductor layers, in which the one or more electrodes respectively include a lower electrode layer for reflecting light generated in the active layer and then passed the non-conductive reflective film, and an upper electrode layer arranged on the lower electrode layer for preventing a foreign material from penetrating into the lower electrode layer; and an electrical connecting part for electrically connecting the plurality of semiconductor layers to at least one electrode. Here, the electrical connecting part refers to an assembly of at least electrical connection.

(55) A variety of assemblies of the electrode structure described hereinabove with the semiconductor light emitting device described hereinabove.

A semiconductor light emitting device according to the present disclosure includes an electrode having a heat-treated, substantially Au-free soldering layer containing Sn as the top layer, thereby obtaining an improved soldering strength.

Another semiconductor light emitting device according to the present disclosure includes a thermally untreated electrode having Sn as the soldering layer and an anti-oxidation layer of an optimal or suitable thickness, thereby obtaining an improved soldering strength.

Still another semiconductor light emitting device according to the present disclosure includes a thermally untreated electrode having a Sn-containing soldering layer as the top layer, thereby obtaining an improved soldering strength as compared with the case where the soldering layer is formed of Au.

Still another semiconductor light emitting device according to the present disclosure includes an electrode having a soldering layer formed of the main component of the solder, thereby obtaining an improved soldering strength.

Still another semiconductor light emitting device according to the present disclosure includes an electrode that has a soldering layer containing the main component of the solder as the top layer of the electrode, such that the resulting increased spreadability of the solder allows for an improved bonding strength, a reduced amount of the solder used, and further, reduced occurrence of defects such as damages and sticking out sideways due to thermal expansion.

Still another semiconductor light emitting device according to the present disclosure includes an improved electrode structure featuring an improved soldering strength, and less light absorption by a metallic reflective film, which is accomplished by using a non-conductive reflective film.

Still another semiconductor light emitting device according to the present disclosure presents a semiconductor light emitting chip which is easily soldered.

Still another semiconductor light emitting device according to the present disclosure presents a semiconductor light emitting flip chip which is easily soldered.

Still another semiconductor light emitting device according to the present disclosure features a facilitated flip chip bonding process.

Still another semiconductor light emitting device according to the present disclosure can be easily fixed onto a sub-mount, a lead frame, a package, or an external electrode such as COB by soldering, rather than by wire-bonding and eutectic bonding.

Still another semiconductor light emitting device according to the present disclosure features an improved light extraction efficiency through light reflection.

Still another semiconductor light emitting device according to the present disclosure is fracture-free or crack-free during bonding.

What is claimed is:

1. A semiconductor light emitting device, including:
a plurality of semiconductor layers grown on a growth substrate, the plurality of semiconductor layers including a first semiconductor layer having a first conductivity type, a second semiconductor layer having a second conductivity type different from the first conductivity type, and an active layer interpositioned between the first and second semiconductor layers, for generating light by electron-hole recombination;
a non-conductive reflective film arranged on an opposite side of the growth substrate and coupled to the plurality of the semiconductor layers;
one or more electrodes formed on the non-conductive reflective film and electrically connected to the plurality of semiconductor layers, each of the one or more electrodes respectively including a lower electrode layer as part of the one or more electrodes for reflecting light generated in the active layer and then passing through the non-conductive reflective film and for defining a crack resistant layer, and an upper electrode layer arranged on the lower electrode layer for preventing a foreign material from penetrating into the lower electrode layer and having a thickness and a thermal expansion coefficient to define an anti-burst layer to prevent bursting of the lower electrode layer, the lower electrode layer having a higher reflectance and a higher thermal expansion coefficient than the upper electrode layer, and the one or more electrodes covering a portion of an area of the non-conductive reflective film;
an electrical connecting part for electrically connecting the plurality of semiconductor layers to one of the one or more electrodes, the electrical connecting part passing through the non-conductive reflective film and filled with the one of the one or more electrodes; and
an additional electrode disposed under the electrical connecting part and between the plurality of the semiconductor layers and the non-conductive reflective film;
wherein the one of the one or more electrodes is formed on the non-conductive film and within the electrical connecting part in such a manner that at least a portion of the lower electrode layer of the one of the one or more electrodes is formed on the non-conductive reflective film and within the electrical connecting part to reflect the light generated in the active layer; and
wherein the lower electrode layer has a thickness of at least 1000 Å.

2. The semiconductor light emitting device according to claim 1, wherein the one or more electrodes respectively have a structure of alternating layers of a lower electrode layer and an upper electrode layer.

3. The semiconductor light emitting device according to claim 1, wherein the one or more electrodes cover at least 50% of the area of the non-conductive reflective film.

4. The semiconductor light emitting device according to claim 1, wherein the one or more electrodes have a thickness of at least 2 μm.

5. The semiconductor light emitting device according to claim 1, wherein the lower electrode layer has a thickness of at least 5000 Å.

6. The semiconductor light emitting device according to claim 1, wherein the one or more electrodes respectively have at least one lower electrode layer and at least one upper electrode layer, in which a combined thickness of the at least one lower electrode layer and the at least one upper electrode layer is 1 μm or greater.

7. The semiconductor light emitting device according to claim 1, wherein the one or more electrodes respectively have at least one lower electrode layer and at least one upper electrode layer, in which a combined thickness of the at least one lower electrode layer and the at least one upper electrode layer is 2 μm or greater.

8. The semiconductor light emitting device according to claim 1, wherein the one or more electrodes respectively have a top layer lower than 5000 Å in thickness.

9. The semiconductor light emitting device according to claim 8, wherein the top layer includes at least one selected from Au and Pt.

10. The semiconductor light emitting device according to claim 1, wherein the lower electrode layer includes at least one selected from Al and Ag.

11. The semiconductor light emitting device according to claim 1, wherein the upper electrode layer includes at least one selected from Ti and Ni.

12. The semiconductor light emitting device according to claim 1, wherein the non-conductive reflective film includes a Distributed Bragg Reflector.

13. The semiconductor light emitting device according to claim 1, wherein the one or more electrodes have a thickness of at least 2 μm, and the one or more electrodes have a top layer of 5000 Å or less in thickness.

14. The semiconductor light emitting device according to claim 1, wherein the lower electrode layer includes Al,
wherein the plurality of semiconductor layers is composed of a Group III nitride semiconductor, and
wherein the non-conductive reflective film includes a Distributed Bragg Reflector.

15. The semiconductor light emitting device according to claim 1, wherein the lower electrode layer is the bottom layer of the electrode.

* * * * *